US008168250B2

(12) United States Patent
Kojima

(10) Patent No.: US 8,168,250 B2
(45) Date of Patent: May 1, 2012

(54) EJECTION RATE MEASUREMENT METHOD, EJECTION RATE ADJUSTMENT METHOD, LIQUID EJECTION METHOD, METHOD OF MANUFACTURING COLOR FILTER, METHOD OF MANUFACTURING LIQUID CRYSTAL DISPLAY DEVICE, AND METHOD OF MANUFACTURING ELECTRO-OPTIC DEVICE

(75) Inventor: Kenji Kojima, Suwa (JP)

(73) Assignee: Seiko Epson Corporation (JP)

( * ) Notice: Subject to any disclaimer, the term of this patent is extended or adjusted under 35 U.S.C. 154(b) by 1090 days.

(21) Appl. No.: 12/035,172

(22) Filed: Feb. 21, 2008

(65) Prior Publication Data

US 2008/0204490 A1 Aug. 28, 2008

(30) Foreign Application Priority Data

Feb. 22, 2007 (JP) ................................ 2007-041859
Jun. 14, 2007 (JP) ................................ 2007-157117

(51) Int. Cl.
*C23C 16/52* (2006.01)
*B05D 5/12* (2006.01)
*B05D 5/00* (2006.01)
*B05D 1/02* (2006.01)

(52) U.S. Cl. ................ 427/8; 427/58; 427/66; 427/256; 427/421.1

(58) Field of Classification Search .............. 427/8, 256, 427/421.1, 58, 66
See application file for complete search history.

(56) References Cited

U.S. PATENT DOCUMENTS

2001/0028916 A1* 10/2001 Akahira ............................ 427/8
2002/0105688 A1* 8/2002 Katagami et al. ............. 358/505
2002/0109741 A1* 8/2002 Okabe et al. ..................... 347/14
2002/0159919 A1* 10/2002 Churchill et al. ............. 422/100

FOREIGN PATENT DOCUMENTS

JP 2004-209429 7/2004
JP 2006-061849 3/2006
JP 2006-167544 6/2006
JP 2006-240261 9/2006

* cited by examiner

*Primary Examiner* — James Lin
(74) *Attorney, Agent, or Firm* — Harness, Dickey & Pierce, P.L.C.

(57) ABSTRACT

An ejection rate measurement method for a device having a plurality of droplet ejection head columns mounted on a plurality of carriages includes the steps of (a) measuring an ejection rate of a liquid ejected from a droplet ejection head included in one of the plurality of droplet ejection head columns sandwiched between other two of the plurality of droplet ejection head columns, (b) sandwiching, after step (a), one of the plurality of droplet ejection head columns, which has not been sandwiched between other two of the plurality of droplet ejection head columns in step (a), between other two of the plurality of droplet ejection head columns, and (c) measuring an ejection rate of a liquid ejected from a droplet ejection head included in one of the plurality of droplet ejection head columns sandwiched between other two of the plurality of droplet ejection head columns in step (b).

30 Claims, 18 Drawing Sheets

EJECTION RATE MEASUREMENT METHOD, EJECTION RATE ADJUSTMENT METHOD, LIQUID EJECTION METHOD, METHOD OF MANUFACTURING COLOR FILTER, METHOD OF MANUFACTURING LIQUID CRYSTAL DISPLAY DEVICE, AND METHOD OF MANUFACTURING ELECTRO-OPTIC DEVICE

BACKGROUND

1. Technical Field

The present invention relates to an ejection rate measurement method, an ejection rate adjustment method, a liquid ejection method, a method of manufacturing a color filter, a method of manufacturing a liquid crystal device, and a method of manufacturing an electro-optic device, and in particular to a method of measuring an ejection rate of a droplet ejected from a liquid ejection head with high accuracy.

2. Related Art

In the past, as a method of ejecting a droplet to a work there is known a method of ejecting it using an inkjet type droplet ejection device. The droplet ejection device is provided with a table for mounting a work such as a substrate and moving the work in one direction and a carriage moving above the table along a guide rail disposed in a direction perpendicular to the moving direction of the table. The carriage has an inkjet (herein after referred to as droplet ejection head) mounted thereon to eject droplets to the work, thus performing coating.

As a functional liquid, which is formed as droplets and then ejected to the work to be applied thereon, there are used various materials. Most of the functional liquids vary in viscosity with temperature, and the fluid resistance varies in conjunction with the variation in viscosity. The variation in fluid resistance causes a variation in the flow rate of the functional liquid flowing through a channel inside the droplet ejection head. The variation in flow rate of the functional liquid causes a variation in amount of ejection per dot, which makes it difficult to measure the ejection rate with high accuracy.

In order for solving the problem described above, a method of measuring the amount of ejection per dot with high accuracy is disclosed in JP-A-2004-209429. According to this method, the droplet ejection device is mounted inside a chamber, and then the temperature and the moisture inside the chamber are controlled, thus the ejection rate is measured while controlling the environmental conditions of the droplet ejection device.

When pressurizing a cavity of the droplet ejection head using a piezoelectric element, apart of the energy applied for operating the piezoelectric element is converted into heat, which causes the temperature of the droplet ejection head to rise. Further, when the piezoelectric element is not driven, the piezoelectric element does not generate heat while the droplet ejection head radiates heat, which causes a variation in the temperature of the droplet ejection head.

Since the ejection rate is influenced by the temperature, a problem of deterioration of measurement accuracy of the ejection rate arises unless the ejection rate is measured in substantially the same head temperature condition at every measurement.

SUMMARY

The invention has an advantage of solving at least a part of the problem described above, and can be realized as following aspects or application examples.

According to a first aspect of the invention, there is provided an ejection rate measurement method for a device having a plurality of droplet ejection head columns mounted on a plurality of carriages, including the steps of (a) measuring an ejection rate of a liquid ejected from a droplet ejection head included in one of the plurality of droplet ejection head columns sandwiched between other two of the plurality of droplet ejection head columns, (b) sandwiching, after step (a), one of the plurality of droplet ejection head columns, which has not been sandwiched between other two of the plurality of droplet ejection head columns in step (a), between other two of the plurality of droplet ejection head columns, and (c) measuring an ejection rate of a liquid ejected from a droplet ejection head included in one of the plurality of droplet ejection head columns sandwiched between other two of the plurality of droplet ejection head columns in step (b).

According to the ejection rate measurement method of this aspect of the invention, the measurement of the ejection rate is separated into steps (a) and (c) (a first measurement step and a second measurement step).

When ejecting a liquid from a nozzle as a droplet, the liquid is pressurized. By pressurizing the liquid, the pressure of the liquid rises. On this occasion, in the nozzle, there is formed a condition in which the liquid and a gas have contact with each other. Further, since the pressure of the liquid becomes higher than the pressure of the gas, a part of the liquid is ejected to the gas as a droplet.

When pressurizing the liquid, a part of energy for pressurizing the liquid is converted into heat. Thus, the temperature of the droplet ejection head rises. Since kinetic energy of molecules forming the liquid increases as the temperature rises, most liquids decreases in viscosity. When the viscosity of the liquid changes, fluid resistance thereof in passing through a channel such as a nozzle varies. Thus, the ejection rate of the liquid ejected from the nozzle varies.

In the first measurement step (step (a)), a plurality of droplet ejection heads ejects the liquid while being arranged side-by-side. On this occasion, some of the droplet ejection heads are included in the droplet ejection head column sandwiched by other droplet ejection head columns, and some of the droplet ejection heads are included in the droplet ejection head column not sandwiched by other droplet ejection head columns. Further, since each of the droplet ejection head rises in temperature when performing the ejection, all of the droplet ejection heads performing the ejection rise in temperature.

The droplet ejection head not sandwiched by other droplet ejection head columns has contact with air on one side, and radiates heat therefrom easily, which makes it difficult to raise the temperature. On the contrary, the droplet ejection head sandwiched by other droplet ejection head columns hardly radiates heat because the temperature of the droplet ejection head columns holding the droplet ejection head is also raised, and therefore the temperature of the droplet ejection head easily rises. In other words, the droplet ejection head belonging to the droplet ejection head column sandwiched by other droplet ejection head columns more easily rises in temperature in comparison with the droplet ejection head belonging to the droplet ejection head column not sandwiched by other droplet ejection head columns.

In the present measurement method, in the first measurement step (step (a)), the ejection rate in the case in which the ejection is performed by the droplet ejection head belonging to the droplet ejection head column in the condition of being sandwiched by other droplet ejection head columns is measured. Further, in the second measurement step (steps (b) and (c)), the ejection rate is measured after the liquid is ejected while the droplet ejection head column, which is not sandwiched by other droplet ejection head columns in the first measurement step (step (a)), is sandwiched by other droplet ejection head columns. In other words, in the first and second measurement steps, the ejection rate in the case in which the ejection is performed by the droplet ejection head belonging to the droplet ejection head column in the condition of being sandwiched by other droplet ejection head columns is measured. Therefore, the droplet ejection heads can be measured in the ejection rate at substantially the same temperature. As a result, the ejection rate can be measured with high accuracy.

According to a second aspect of the invention, in the ejection rate measurement method described above, steps (a) and (c) include (d) making the droplet ejection head, the ejection rate of which is to be measured, stand ready for measurement, (e) ejecting the liquid for measurement, and (f) measuring the ejection rate of the liquid ejected in step (e) and in step (d), the droplet ejection head performs warm-up driving.

According to the ejection rate measurement method of this aspect of the invention, by performing the warm-up driving, the temperature of the droplet ejection heads is raised. Then, the ejection rate in the condition in which the droplet ejection heads are in the high temperature state is measured. When ejecting the liquid to the work, since the droplet ejection head ejects the liquid, the temperature of the droplet ejection head has been raised. In other words, by performing the warm-up driving, the ejection rate at substantially the same temperature as in the case in which the droplet ejection head ejects the liquid to the work can be measured. Therefore, the ejection rate in the case in which the liquid is ejected to the work can be measured with high accuracy.

According to a third aspect of the invention, in the ejection rate measurement method described above, in the warm-up driving, the droplet ejection head is driven to the extent that the liquid is not ejected from the droplet ejection head.

According to the ejection rate measurement method of this aspect of the invention, the warm-up driving is performed to the extent that the droplet is not ejected from the nozzles. Therefore, it is eliminated that the droplets are wastefully ejected, thus a resource-saving ejection rate measurement method can be obtained.

According to a fourth aspect of the invention, in the ejection rate measurement method described above, the warm-up driving is performed at substantially the same position as a position where step (e) is executed.

According to the ejection rate measurement method of this aspect of the invention, since the position of the droplet ejection head for ejecting the liquid for measurement and the position thereof for warm-up driving are substantially the same, there is no need for the droplet ejection head to move to the position for ejecting the liquid for measurement after performing the warm-up driving. Therefore, since the ejection can be performed without cooling the droplet ejection head while moving the droplet ejection head, the ejection rate can be measured with small variance in the temperature of the droplet ejection heads. As a result, the ejection rate can be measured with high accuracy.

According to a fifth aspect of the invention, in the ejection rate measurement method described above, step (a) includes (a1) measuring the ejection rate in all of the droplet ejection heads planned to be measured and mounted on the same carriage, and (a2) measuring, after step (a1), the ejection rate in the droplet ejection head planned to be measured and mounted on a different carriage from the carriage in step (a1) steps (a1) and (a2) are repeated until measurement is finished in all of the droplet ejection heads planned to be measured, and step (c) includes (c1) measuring the ejection rate in all of the droplet ejection heads planned to be measured and mounted on the same carriage, and (c2) measuring, after step (c1), the ejection rate in the droplet ejection head planned to be measured and mounted on a different carriage from the carriage in step (c1), steps (c1) and (c2) are repeated until measurement is finished in all of the droplet ejection heads planned to be measured.

According to the ejection rate measurement method of this aspect of the invention, after measurement of the ejection rate is finished in all of the droplet ejection head mounted on one carriage, the ejection rate in the droplet ejection heads mounted on each of the carriages is sequentially measured while changing the carriages. Therefore, the measurement is performed using the method with small amount of carriage movement. As a result, since the energy for moving the carriages can be saved, a resource-saving measurement method can be obtained.

According to a sixth aspect of the invention, in the ejection rate measurement method described above, step (a) includes (a3) measuring the ejection rate in all of the droplet ejection heads planned to be measured, mounted on the same carriage, and included in the same droplet ejection head row, which is one of a plurality of droplet ejection head row defined by a plurality of droplet ejection head columns mounted on a plurality of carriages, and (a4) measuring, after step (a3), the ejection rate in the droplet ejection head planned to be measured, included in the same droplet ejection head row, mounted on a different carriage from the carriage in step (a3), and close to the droplet ejection head measured last in step (a3), steps (a3) and (a4) are repeated until measurement is finished in all of the droplet ejection heads planned to be measured and included in the same droplet ejection head row, step (c) includes (c3) measuring the ejection rate in all of the droplet ejection heads planned to be measured, mounted on the same carriage, and included in the same droplet ejection head row, and (c4) measuring, after step (c3), the ejection rate in the droplet ejection head planned to be measured, included in the same droplet ejection head row, mounted on a different carriage from the carriage in step (c3), and close to the droplet ejection head measured last in step (c3), steps (c3) and (c4) are repeated until measurement is finished in all of the droplet ejection heads planned to be measured and included in the same droplet ejection head row, and steps (a), (b), and (c) are repeated until measurement is finished in all of the droplet ejection heads planned to be measured while changing droplet ejection head row.

According to the ejection rate measurement method of this aspect of the invention, in the droplet ejection heads belonging to the same row, the ejection rate in the droplet ejection head positioned close to each other is measured, and then the measurement is performed while sequentially changing the row. When measuring the ejection rate of the droplet ejection head, the droplet ejection head is measured in the environment with controlled temperature. On this occasion, in most cases, the temperature varies with a long period. In this case, the measurement of the ejection rate of the droplet ejection head located in the same row as a certain droplet ejection head and close to the certain droplet ejection head is subsequently performed. Therefore, the droplet ejection heads in the same row and close to each other can be measured in the ejection rate with errors caused by the influence of substantially the same temperature.

According to a seventh aspect of the invention, in the ejection rate measurement method described above, step (a) includes (a5) measuring the ejection rate in at least a part of the droplet ejection heads planned to be measured, mounted on the same carriage, and included in the same droplet ejection head row, which is one of a plurality of droplet ejection head row defined by a plurality of droplet ejection head columns mounted on a plurality of carriages, and step (c) includes (c5) measuring the ejection rate in the droplet ejection head planned to be measured, included in the same droplet ejection head row, and positioned adjacently to the droplet ejection head measured last in step (a), steps (a), (b), and (c) are repeated until measurement is finished in all of the droplet ejection heads planned to be measured, and included in the same droplet ejection head row, and steps (a), (b), and (c) are repeated until measurement is finished in all of the droplet ejection heads planned to be measured, while changing the droplet ejection head row.

According to the ejection rate measurement method of this aspect of the invention, after measurement of the ejection rate is performed in one droplet ejection head, the ejection rate is measured in the droplet ejection head, which has been positioned adjacently to the measured droplet ejection head. Therefore, even in the case in which there is a variation in the ambient temperature, the droplet ejection heads in the same row and close to each other can be measured in the ejection rate with errors caused by the influence of substantially the same temperature.

According to an eighth aspect of the invention, there is provided an ejection rate adjustment method for a device having a plurality of droplet ejection head columns mounted on a plurality of carriages, including the steps of (p) measuring an ejection rate of a liquid ejected from a droplet ejection head included in one of the plurality of droplet ejection head columns sandwiched between other two of the plurality of droplet ejection head columns, (q) adjusting the ejection rate of the droplet ejection head measured in step (p), (r) sandwiching, after step (q), one of the plurality of droplet ejection head columns, which has not been sandwiched between other two of the plurality of droplet ejection head columns in step (p), between other two of the plurality, of droplet ejection head columns, (s) measuring an ejection rate of a liquid ejected from a droplet ejection head included in one of the plurality of droplet ejection head columns sandwiched between other two of the plurality of droplet ejection head columns in step (r), and (t) adjusting the ejection rate of the droplet ejection head measured in step (s).

According to the ejection rate adjustment method of this aspect of the invention, after adjusting the droplet ejection heads measured in the first measurement step (step (p)) in the first adjustment step (step (q)), the droplet ejection heads measured in the second measurement step (step (s)) is adjusted in the second adjustment step (step (t)). Further, based on the results of measurement of the ejection rate performed with high accuracy in the first and second measurement steps, the ejection rate is adjusted in the first and second adjustment steps, respectively. Therefore, in the first and second adjustment steps (steps (q) and (t)), the ejection rate can be adjusted with high accuracy.

According to a ninth aspect of the invention, in the ejection rate adjustment method described above, wherein (u) steps (p) and (q) are repeated so as to approximate the ejection rate to a target ejection rate, and (v) steps (s) and (t) are repeated so as to approximate the ejection rate to a target ejection rate.

According to the ejection rate adjustment method of this aspect of the invention, a first ejection rate adjustment step (step (u)) and a second ejection rate adjustment step (step (v)) are provided. Further, in the first ejection rate adjustment step, base on the result of measurement of the ejection rate performed in the first measurement step (step (p)), the ejection rate is adjusted in the first adjustment step (step (q)). Then, by repeating the first measurement step (step (p)) and the first adjustment step (step (q)), the ejection rate is made closer to the target ejection rate. Therefore, in comparison with a method of performing the adjustment step only once, the ejection rate can be adjusted with high accuracy.

Further, since the same process is performed in the second ejection rate adjustment step, the ejection rate can be adjusted with high accuracy compared to a method of performing the adjustment step only once. As a result, a method capable of adjusting the ejection rate with high accuracy can be obtained.

According to a tenth aspect of the invention, in the ejection rate adjustment method described above, steps (p) and (s) include (w) making the droplet ejection head, the ejection rate of which is to be measured, stand ready for measurement, (x) ejecting the liquid for measurement, (y) measuring the ejection rate of the liquid ejected in step (x), and in step (w), the droplet ejection head performs warm-up driving.

According to the ejection rate adjustment method of this aspect of the invention, in standby step (step (w)), by performing the warm-up driving, the temperature of the droplet ejection heads is raised. Then, the ejection rate in the condition in which the droplet ejection heads are in the high temperature state is measured. When ejecting the liquid to the work, since the droplet ejection head ejects the liquid, the temperature of the droplet ejection head has been raised. In other words, by performing the warm-up driving, the ejection rate at substantially the same temperature as in the case in which the droplet ejection head ejects the liquid to the work can be measured. Further, the ejection rate is then adjusted. Therefore, the ejection rate in the case in which the liquid is ejected to the work can be adjusted with high accuracy.

According to an eleventh aspect of the invention, in the ejection rate adjustment method described above, in the warm-up driving, the droplet ejection head is driven to the extent that the liquid is not ejected from the droplet ejection head.

According to the ejection rate adjustment method of this aspect of the invention, the warm-up driving is performed to the extent that the droplet is not ejected from the nozzles. Therefore, it is eliminated that the droplets are wastefully ejected, thus a resource-saving ejection rate adjustment method can be obtained.

According to a twelfth aspect of the invention, in the ejection rate adjustment method described above, the warm-up driving is performed at substantially the same position as a position where step (x) is executed.

According to the ejection rate adjustment method of this aspect of the invention, since the position of the droplet ejection head for ejecting the liquid for measurement and the position thereof for warm-up driving are substantially the same, there is no need for the droplet ejection head to move to the position for ejecting the liquid for measurement after performing the warm-up driving. Therefore, since the ejection can be performed without cooling the droplet ejection head while moving the droplet ejection head, the ejection rate can be measured with small variance in the temperature of the droplet ejection heads. As a result, the ejection rate can be measured with high accuracy.

According to a thirteenth aspect of the invention, in the ejection rate adjustment method described above, in step (u), an ejection rate of a liquid ejected from the droplet ejection head included in one of the plurality of droplet ejection head columns not sandwiched between other two of the plurality of droplet ejection head columns is also measured.

According to the ejection rate adjustment method of this aspect of the invention, the droplet ejection head belonging to the droplet ejection head column not sandwiched by other droplet ejection head columns in the first measurement step is adjusted in the ejection rate in both of the first ejection rate adjustment step and the second ejection rate adjustment step.

The droplet ejection head belonging to the droplet ejection head column not sandwiched by other droplet ejection head columns is adjusted in the ejection rate in the first ejection rate adjustment step. Then, the ejection rate of the droplet ejection head is adjusted so as to be closer to the target ejection rate, and then adjusted in the ejection rate again in the second ejection rate adjustment step. In the second ejection rate adjustment step, the temperature of the droplet ejection head becomes higher than in the first ejection rate adjustment step. Further, the droplet ejection head can be adjusted with smaller number of times of repetition compared to the case in which the adjustment is not performed in the first ejection rate adjustment step. As a result, an adjustment method with high productivity can be obtained.

According to a fourteenth aspect of the invention, in the ejection rate adjustment method described above, in at least one of a step including steps (p) and (q), and a step including steps (s) and (t), step of measuring an ejection rate of a liquid ejected from a droplet ejection head included in one of the plurality of droplet ejection head columns sandwiched between other two of the plurality of droplet ejection head columns and step of adjusting the ejection rate of the droplet ejection head are executed at least two times, and step (q0) includes (qr) roughly adjusting the ejection rate of the droplet ejection head, and (qf) finely adjusting the ejection rate of the droplet ejection head.

Here, the difference between the rough adjustment step (step (qr)) and the fine adjustment step (step (qf)) is roughness of the ejection rate in performing the adjustment. Further, in the rough adjustment step, the adjustment is performed while changing the ejection rate in larger steps, compared to the case with the fine adjustment step. According to this ejection rate adjustment method, the rough adjustment and the fine adjustment are performed. On this occasion, in most cases, the ejection rate can be adjusted to the target ejection rate with a fewer times of adjustment operation by performing the adjustment with the rough adjustment step of making a large change in the ejection rate in combination with the fine adjustment step of adjusting the ejection rate by a small amount, compared to the case in which the adjustment is performed with repetition of the fine adjustment step. Therefore, the adjustment can be performed with high productivity.

According to a fifteenth aspect of the invention, in the ejection rate adjustment method described above, an amount of the liquid ejected in step (p0) executed prior to step (qr) is smaller than an amount of the liquid ejected in step (p0) executed prior to step (qf).

According to the ejection rate adjustment method of this aspect of the invention, in the rough adjustment step (step (qr)), adjustment of the ejection rate is performed with smaller amount of ejection compared to the case with the fine adjustment step (step (qf)). Therefore, the consumption of the liquid by ejection can be reduced. As a result, a resource-saving adjustment method can be obtained.

According to a sixteenth aspect of the invention, in the ejection rate adjustment method described above, the number of times of ejection of the liquid from the droplet ejection head per unit time in step (p0) executed prior to step (qr) is larger than the number of times of ejection of the liquid from the droplet ejection head per unit time in step (p0) executed prior to step (qf).

According to the ejection rate adjustment method of this aspect of the invention, in the rough adjustment step (step (qr)), the number of times of ejection per unit time is larger than in the case with the fine adjustment step. In the case in which substantially the same number of times of ejection is performed for measurement of the ejection rate in both the rough adjustment steps and the fine adjustment steps, ejection can be performed in a shorter period of time in the rough adjustment steps. Therefore, the adjustment can be performed with high productivity.

According to a seventeenth aspect of the invention, in the ejection rate adjustment method described above, step (q) includes (q1) adjusting the ejection rate in all of the droplet ejection heads planned to be adjusted and mounted on the same carriage, and (q2) adjusting, after step (q1), the ejection rate in the droplet ejection head planned to be adjusted and mounted on a different carriage from the carriage in step (q1), steps (q1) and (q2) are repeated until adjustment is finished in all of the droplet ejection heads planned to be adjusted, and step (t) includes (t1) adjusting the ejection rate in all of the droplet ejection heads planned to be adjusted and mounted on the same carriage, and (t2) adjusting, after step (t1), the ejection rate in the droplet ejection head planned to be adjusted and mounted on a different carriage from the carriage in step (t1), steps (t1) and (t2) are repeated until adjustment is finished in all of the droplet ejection heads planned to be adjusted.

According to the ejection rate adjustment method of this aspect of the invention, after measurement of the ejection rate is finished in all of the droplet ejection head mounted on one carriage, the ejection rate in the droplet ejection heads mounted on each of the carriages is sequentially adjusted while changing the carriages. Therefore, the adjustment is performed using the method with small amount of carriage movement. As a result, since the energy for moving the carriages can be saved, a resource-saving adjustment method can be obtained.

According to an eighteenth aspect of the invention, in the ejection rate adjustment method described above, step (q) includes (q3) adjusting the ejection rate in all of the droplet ejection heads planned to be adjusted, mounted on the same carriage, and included in the same droplet ejection head row, which is one of a plurality of droplet ejection head row defined by a plurality of droplet ejection head columns mounted on a plurality of carriages, and (q4) adjusting, after step (q3), the ejection rate in the droplet ejection head planned to be adjusted, included in the same droplet ejection head row, and mounted on a different carriage from the carriage in step (q3), and steps (q3) and (q4) are repeated until adjustment is finished in all of the droplet ejection heads planned to be adjusted and included in the same droplet ejection head row, and step (t) includes (t3) adjusting the ejection rate in all of the droplet ejection heads planned to be adjusted, mounted on the same carriage, and included in the same droplet ejection head row, and (t4) adjusting, after step (t3), the ejection rate in the droplet ejection head planned to be adjusted, included in the same droplet ejection head row, and mounted on a different carriage from the carriage in step (t3), steps (t3) and (t4) are repeated until adjustment is finished in all of the droplet ejection heads planned to be adjusted and included in the same droplet ejection head row, and steps (p), (q), (r), (s) and (t) are repeated until adjustment is finished in all of the droplet ejection heads planned to be adjusted while changing droplet ejection head row.

According to the ejection rate adjustment method of this aspect of the invention, in the droplet ejection heads belonging to the same row, the ejection rate in the droplet ejection head positioned close to each other is measured, and then the measurement is performed while sequentially changing the row. When measuring the ejection rate of the droplet ejection head, the droplet ejection head is measured in the environment with controlled temperature. On this occasion, in most cases, the temperature varies with a long period. In this case, the adjustment of the ejection rate of the droplet ejection head located in the same row as a certain droplet ejection head and close to the certain droplet ejection head is subsequently performed. Therefore, the droplet ejection heads in the same row and close to each other can be adjusted in the ejection rate with errors caused by the influence of substantially the same temperature.

According to a nineteenth aspect of the invention, in the ejection rate adjustment method described above, step (q) includes (q5) adjusting the ejection rate in at least a part of the droplet ejection heads planned to be adjusted, mounted on the same carriage, and included in the same droplet ejection head row, which is one of a plurality of droplet ejection head row defined by a plurality of droplet ejection head columns mounted on a plurality of carriages, and step (t) includes (t5) adjusting the ejection rate in the droplet ejection head planned to be adjusted, included in the same droplet ejection head row, and positioned adjacently to the droplet ejection head adjusted last in step (q), steps (p), (q), (r), (s) and (t) are repeated until adjustment is finished in all of the droplet ejection heads planned to be adjusted, and included in the same droplet ejection head row, and steps (p), (q), (r), (s) and (t) are repeated until adjustment is finished in all of the droplet ejection heads planned to be adjusted, while changing the droplet ejection head row.

According to the ejection rate adjustment method of this aspect of the invention, after adjustment of the ejection rate is performed in one droplet ejection head, the ejection rate is adjusted in the droplet ejection head, which has been positioned adjacently to the adjusted droplet ejection head. Therefore, even in the case in which there is a variation in the ambient temperature, the droplet ejection heads in the same row and close to each other can be adjusted in the ejection rate with errors caused by the influence of substantially the same temperature.

According to a twentieth aspect of the invention, there is provided an ejection rate adjustment method for a device having a plurality of droplet ejection head columns mounted on a plurality of carriages, including the steps of (p) measuring an ejection rate of a liquid ejected from a droplet ejection head included in one of the plurality of droplet ejection head columns sandwiched between other two of the plurality of droplet ejection head columns, (q) adjusting the ejection rate of the droplet ejection head measured in step (p), (r) sandwiching, after step (q), one of the plurality of droplet ejection head columns, which has not been sandwiched between other two of the plurality of droplet ejection head columns in step (p), between other two of the plurality of droplet ejection head columns, (s) measuring an ejection rate of a liquid ejected from a droplet ejection head included in one of the plurality of droplet ejection head columns sandwiched between other two of the plurality of droplet ejection head columns in step (r), and (t) adjusting the ejection rate of the droplet ejection head measured in step (s), wherein (u) steps (p) and (q) are repeated so as to approximate the ejection rate to a target ejection rate, and (v) steps (s) and (t) are repeated so as to approximate the ejection rate to a target ejection rate, and in step (u), an ejection rate of a liquid ejected from the droplet ejection head included in one of the plurality of droplet ejection head columns not sandwiched between other two of the plurality of droplet ejection head columns is also measured and roughly adjusted.

According to the ejection rate adjustment method of this aspect of the invention, the droplet ejection head can be adjusted with smaller number of times of repetition compared to the case in which the adjustment is not performed in the first ejection rate adjustment step. As a result, an adjustment method with high productivity can be obtained.

According to a twenty-first aspect of the invention, in the ejection rate adjustment method described above, in step (u), the ejection rate of the liquid ejected from the droplet ejection head included in one of the plurality of droplet ejection head columns not sandwiched between other two of the plurality of droplet ejection head columns is adjusted to be lower than the ejection rate of the liquid ejected from the droplet ejection head included in one of the plurality of droplet ejection head columns sandwiched between other two of the plurality of droplet ejection head columns.

According to the ejection rate adjustment method of this aspect of the invention, the ejection rate of the liquid ejected from the droplet ejection head not sandwiched by the droplet ejection head columns is adjusted to be lower. The droplet ejection head not sandwiched by the droplet ejection head column is influenced by wind, and therefore, reduced in temperature. Further, when the temperature goes down, the ejection rate is lowered. When measuring the ejection rate by sandwiching with other droplet ejection heads after once adjusting the ejection rate so that the target ejection rate of the liquid is ejected, the ejection rate should exceed the target ejection rate because the temperature of the head rises.

Here, the ejection rate of the liquid ejected from the droplet ejection head not sandwiched by the droplet ejection head columns is adjusted to be lower than the target ejection rate. Therefore, when measuring the ejection rate while sandwiched by other droplet ejection heads, the adjustment of the ejection rate can be started form an ejection rate close to the target of the ejection rate. As a result, since the adjustment can be competed with a fewer number of times of adjusting operation, the adjustment can be performed with high productivity.

According to a twenty-second aspect of the invention, in the ejection rate adjustment method described above, in step (s), the ejection rate of the liquid ejected from the droplet ejection head included in one of the plurality of droplet ejection head columns sandwiched between other two of the plurality of droplet ejection head columns is modified so that the ejection is performed at a lower ejection rate than the ejection rate set in step (u), and then the liquid is ejected and the ejection rate is adjusted in step (t).

According to the ejection rate adjustment method of this aspect of the invention, the ejection rate of the liquid ejected from the droplet ejection head not sandwiched by the droplet ejection head columns is adjusted to be lower than the target ejection rate. Therefore, when measuring the ejection rate while sandwiched by other droplet ejection heads, the adjustment of the ejection rate can be started form an ejection rate close to the target of the ejection rate. As a result, since the adjustment can be competed with a fewer number of times of adjusting operation, the adjustment can be performed with high productivity.

According to a twenty-third aspect of the invention, there is provided a liquid ejection method including the steps of adjusting an ejection rate, and coating a work by ejecting a droplet, and in the adjusting step, the ejection rate is adjusted using the ejection rate adjustment method described above.

According to the liquid ejection method of this aspect of the invention, ejection to the work is performed setting the ejection rate to a desired ejection rate by measuring the ejection rate and then adjusting the ejection rate. Further, since the ejection rate is adjusted based on the measurement value of the ejection rate measured with high accuracy, ejection to the work can be performed with the ejection rate adjusted with high accuracy. As a result, ejection to the work can be performed with the ejection rate with high accuracy.

According to a twenty-fourth aspect of the invention, there is provided a method of manufacturing a color filter, including the step of applying color ink to a substrate by ejecting the color ink on the substrate using the liquid ejection method described above.

According to the method of manufacturing a color filter of this aspect of the invention, since the color ink is applied by ejecting the color ink with accurate ejection rate, a manufacturing method of a color filter capable of applying the color ink with accurate ejection rate can be obtained.

According to a twenty-fifth aspect of the invention, there is provided a method of manufacturing a liquid crystal display device, including the steps of forming oriented films on first and second substrates, and putting a liquid crystal between the first and second substrates, wherein the forming step includes, coating at least one of the first and second substrates with a material of the oriented films by ejecting the material of the oriented films on the at least one of the first and second substrates using the liquid ejection method described above, and solidifying the material of the oriented films ejected on the at least one of the first and second substrates.

According to the method of manufacturing a liquid crystal display device of this aspect of the invention, since the material of the oriented film is applied by ejecting the material of the oriented film with accurate ejection rate, a manufacturing method of a liquid crystal display device capable of applying the material of the oriented film with accurate ejection rate can be obtained.

According to a twenty-sixth aspect of the invention, there is provided a method of manufacturing a liquid crystal display device, including the steps of applying a liquid crystal on a first substrate, and putting the liquid crystal between the first and second substrates, wherein in the applying step, the liquid crystal is ejected on the first substrate using the liquid ejection method described above.

According to the method of manufacturing a liquid crystal display device of this aspect of the invention, since the liquid crystal is applied by ejecting the liquid crystal with accurate ejection rate, a manufacturing method of a liquid crystal display device capable of applying the liquid crystal with accurate ejection rate can be obtained.

According to a twenty-seventh aspect of the invention, there is provided a method of manufacturing an electro-optic device, including the step of forming a light emitting element including the steps of applying a light emitting element forming material on a substrate, and solidifying the light emitting element forming material applied on the substrate, wherein in the applying step, the light emitting element forming material is ejected on the substrate using the liquid ejection method described above.

According to the method of manufacturing an electro-optic device of this aspect of the invention, since the light emitting element forming material is applied by ejecting the light emitting element forming material with accurate ejection rate, a manufacturing method of an electro-optic device capable of applying the light emitting element forming material with accurate ejection rate can be obtained.

According to a twenty-eighth aspect of the invention, there is provided a method of manufacturing an electro-optic device, including the step of forming an electrode including the steps of applying an electrode material on a substrate, and solidifying the electrode material applied on the substrate, wherein in the applying step, the electrode material is ejected on the substrate using the liquid ejection method described above.

According to the method of manufacturing an electro-optic device of this aspect of the invention, since the electrode material is applied by ejecting the electrode material with accurate ejection rate, a manufacturing method of an electro-optic device capable of applying the electrode material with accurate ejection rate to form an electrode can be obtained.

According to a twenty-ninth aspect of the invention, there is provided a method of manufacturing an electro-optic device, including the step of forming a wiring including the steps of applying a wiring material on a substrate, and solidifying the wiring material applied on the substrate, wherein in the applying step, the wiring material is ejected on the substrate using the liquid ejection method described above.

According to the method of manufacturing an electro-optic device of this aspect of the invention, since the wiring material is applied by ejecting the wiring material with accurate ejection rate, a manufacturing method of an electro-optic device capable of applying the wiring material with accurate ejection rate to form a wiring can be obtained.

According to a thirtieth aspect of the invention, there is provided a method of manufacturing an electro-optic device, including the step of forming a semiconductor element including the steps of applying a semiconductor material on a substrate, solidifying the semiconductor material applied on the substrate, and heating the semiconductor material applied and then solidified on the substrate, wherein in the applying step, the semiconductor material is ejected on the substrate using the liquid ejection method described above.

According to the method of manufacturing an electro-optic device of this aspect of the invention, since the semiconductor material is applied by ejecting the semiconductor material with accurate ejection rate, a manufacturing method of an electro-optic device capable of applying the semiconductor material with accurate ejection rate to form a semiconductor element can be obtained.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Figure 1:
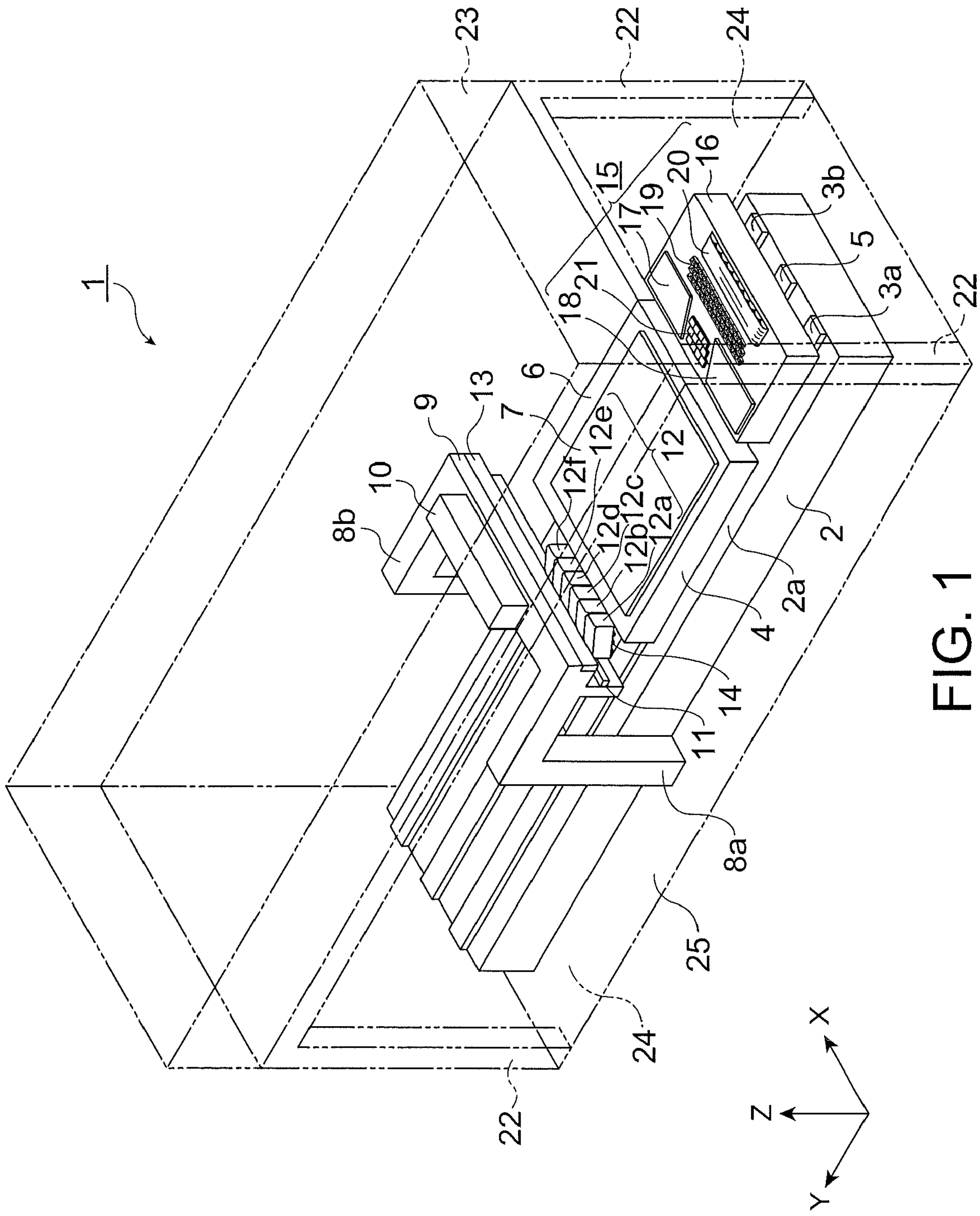
FIG. 1 is a schematic perspective view showing a configuration of a droplet ejection device according to a first embodiment of the invention.

Hereinafter, the embodiments will be explained with reference to the accompanying drawings.

It should be noted that each of members in each of the drawings is illustrated with a different scale from each other in order for providing a size large enough to be recognized in the drawing.

First Embodiment

In the present embodiment, the droplet ejection device and a distinctive example of the case in which a liquid is ejected as droplets using the droplet ejection device will be explained with reference to FIGS. 1 through 9C.

Droplet Ejection Device

Firstly, the droplet ejection device 1 for coating a work by ejecting droplets will be explained with reference to FIGS. 1 through 3. Although there are used various kinds of devices as the droplet ejection device, a device using an inkjet method is preferable. The inkjet method allows ejection of microscopic droplets, and is consequently suitable for microfabrication.

FIG. 1 is a schematic perspective view showing a configuration of the droplet ejection device. A functional liquid is ejected and applied by the droplet ejection device 1.

As shown in FIG. 1, the droplet ejection device 1 is provided with a platform 2 formed to have a cuboid shape. In the present embodiment, it is assumed that the longitudinal direction of the platform 2 is a Y direction, and a direction perpendicular to the Y direction is an X direction.

On the upper surface 2_a_ of the platform 2, there is disposed a pair of guide rails 3_a_, 3_b_ extending in the Y direction across the full width thereof so as to protrude from the surface. Above the platform 2, there is attached a stage 4 as a table forming a scanning section provided with a translation mechanism, not shown, corresponding to the guide rails 3_a_, 3_b_. The translation mechanism of the stage 4 is, for example, a screw translation mechanism provided with a screw shaft (a drive shaft) extending along the guide rails 3_a_, 3_b_ in the Y direction and a ball nut screwing the screw shaft, and the drive shaft is coupled to a Y-axis motor (not shown) which rotates in both directions stepwise in response to a predetermined pulse signal. Further, it is arranged that when a drive signal corresponding to a predetermined number of steps is input to the Y-axis motor, the Y-axis motor rotates normally or in the reverse direction to move (scan in the Y direction) the stage 4 forward or backward for a distance corresponding to the predetermined number of steps along the Y direction at a predetermined speed.

Further, on the upper surface 2_a_ of the platform 2, there is disposed a main scanning position detecting device 5 in parallel to the guide rails 3_a_, 3_b_, thus the position of the stage 4 can be measured.

On the upper surface of the stage 4, there is formed a mounting surface 6 provided with a suction substrate chuck mechanism, not shown. Further, it is arranged that when a substrate 7 as a work is mounted on the mounting surface 6, the substrate 7 is aligned and fixed to a predetermined position on the mounting surface 6 by the substrate chuck mechanism.

On both sides in the X direction of the platform 2, there is erected a pair of supports 8_a_, 8_b_, and the pair of supports 8_a_, 8_b_ is bridged with a guide member 9 extending in the X direction.

On an upper part of the guide member 9, there is disposed a reservoir tank 10 for reserving the liquid to be ejected so that the liquid can be supplied therefrom. On the other hand, on a lower part of the guide member 9, there is disposed a guide rail 11 extending in the X direction across the full width there of in the X direction so as to protrude from the surface thereof.

A carriage 12 disposed movably along the guide rail 11 is composed of six carriages, first through sixth carriages 12_a_ through 12_f_, each formed to have a shape of a quadratic prism with a substantially parallelogram-shaped bottom. Each of the carriages 12_a_ through 12_f_ is provided with a translation mechanism, thus each of the carriages 12_a_ through 12_f_ can move individually. The translation mechanism is, for example, a screw translation mechanism provided with a screw shaft (a drive shaft) extending along the guide rail 11 in the X direction and a ball nut screwing the screw shaft, and the drive shaft is coupled to an X-axis motor (not shown) which rotates in both directions stepwise in response to a predetermined pulse signal. Further, it is arranged that when a drive signal corresponding to a predetermined number of steps is input to the X-axis motor, the X-axis motor rotates normally or in the reverse direction to move (scan in the X direction) the carriage 12 forward or backward for a distance corresponding to the predetermined number of steps along the X direction. A sub-scanning position detection device 13 is disposed between the guide member 9 and the carriage 12, thus the position of each of the carriages 12_a_ through 12_f_ can be measured. Further, on the lower surface (on the side of the stage 4) of the carriage 12, there is disposed a droplet ejection head 14 so as to protrude from the surface.

Above the platform 2 and on one side (in a direction reversed from the Y direction in the drawing) of the stage 4, there is disposed a cleaning unit 15. The cleaning unit 15 is mainly composed of a maintenance stage 16, a first flashing unit 17, a second flashing unit 18, a capping unit 19, a wiping unit 20, and a weighing device 21, and the first flashing unit 17, the second flashing unit 18, the capping unit 19, the wiping unit 20, and the weighing device 21 are disposed on the maintenance state 16.

The maintenance stage 16 is located on the guide rails 3_a_, 3_b_, and is provided with substantially the same translation mechanism as that of the stage 4. Further, it is arranged that the maintenance stage can move to a desired position and stop there by detecting the position thereof using a maintenance stage position detection device, not shown, and moving by the translation mechanism. Further, it is also arranged that the maintenance stage 16 moves along the guide rails 3*a*, 3*b* to position either one of the first flashing unit 17, the second flashing unit 18, the capping unit 19, the wiping unit 20, and the weighing device 21 at a position opposed to the droplet ejection head 14.

The first flashing unit 17 and the second flashing unit 18 are devices for receiving droplets ejected from the droplet ejection head 14 when cleaning the channels inside the droplet ejection head 14. If the functional liquid inside the droplet ejection head 14 vaporizes, the viscosity of the functional liquid increases, and consequently, ejection thereof becomes difficult. On this occasion, in order for removing the functional liquid thus increased in viscosity from the droplet ejection head 14, the droplet ejection head 14 is cleaned by ejecting the droplets therefrom. The function of receiving the droplets is achieved by the first flashing unit 17 and the second flashing unit 18.

The capping unit 19 is a device having a function of capping the droplet ejection head 14 and a function of suctioning the functional liquid in the droplet ejection head 14. In some cases, the droplets ejected from the droplet ejection head 14 are volatile, and if a solvent of the functional liquid existing in the droplet ejection head 14 vaporizes through a nozzle, the viscosity of the functional liquid varies, clogging might be caused in the nozzle. The capping unit 19 is arranged to prevent the nozzle from getting clogged by capping the droplet ejection head 14.

Further, if a solid matter enters the inside of the droplet ejection head 14 to block the ejection of the droplets, it suctions and removes the functional liquid and the solid matter inside the droplet ejection head 14. Thus, it is arranged to eliminate the clogging in the nozzle.

The wiping unit 20 is a device for wiping a nozzle plate where the nozzles of the droplet ejection head 14 are arranged. The nozzle plate is a member disposed on a surface of the droplet ejection head 14 on the side opposed to the substrate 7. If a droplet is attached to the nozzle plate, the droplet attached to the nozzle plate might come in contact with the substrate 7 and might be attached to the substrate 7 at an unplanned position.

Further, if a droplet has previously been attached in the vicinity of the nozzle, the ejected droplet might have contact with the droplet attached to the nozzle plate, thus the course of the ejected droplet might be bent. Therefore, the position coated with the ejected droplet might be different from the position planned to be coated. The wiping unit 20 prevents the droplet from being attached to an unplanned position in the substrate 7 by wiping the nozzle plate.

The weighing device 21 is provided with twelve electronic balances each provided with a tray. Three of the electronic balances are arranged in a line in substantially the Y direction, and four such lines are arranged. Further, it is arranged that the droplets are ejected from the droplet ejection head 14 to the trays, and the electronic balances measure the weight of the droplets. The tray is provided with a sponge-like absorber so as to prevent the ejected droplet from jumping out of the tray. The electronic balances each measure the weight of the dray before and after the droplet ejection head 14 ejects the droplets. Then, by calculating a difference in the weight of the tray between before and after the ejection, the weight of the ejected droplets can be measured.

On both sides of the weighing device 21, there are disposed the first flashing unit 17 and the second flashing unit 18. Thus, it becomes possible that while measuring the ejection rate of the droplet ejected from a part of the droplet ejection head 14, another part of the droplet ejection head 14 positions a location opposed to the first flashing unit 17 or the second flashing unit 18 to eject droplets.

The droplet ejection device 1 is provided with pole braces 22 at four corners thereof, and is further provided with an air control device 23 on an upper part (the upper side in the drawing). The air control device 23 is provided with a fan, a filter, an air conditioner, a moisture control device, and soon. The fan (air blower) takes in the air in the factory, removing dust from the air by making the air pass through the filter, and supplies the cleaned air.

The air conditioner is a device for controlling the temperature of the air to be supplied so as to keep the ambient temperature of the droplet ejection device 1 in a predetermined temperature range. The moisture control device is a device for dehumidifying or humidifying the air to control the moisture of the air to be supplied so as to keep the ambient moisture of the droplet ejection device 1 in a predetermined moisture range.

Between two adjacent ones out of the four pole braces 22, there is disposed a sheet 24 so as to block the air flow. The air supplied from the air control device 23 flows from the air control device 23 towards the floor 25 (in a direction reversed from the Z direction in the drawing), and the dust in the space surrounded by the sheets 24 flows towards the floor 25. Thus, it is arranged that the dust is hardly attached to the substrate 7.

Further, the sheets 24 limit the flow of the air, thus the temperature and the moisture of the space surrounded by the sheets 24 become hardly influenced by the outside of the sheets 24. Further, it becomes easy for the air control device 23 to control the temperature and the moisture in the space surrounded by the sheet 24.

Figure 2A:
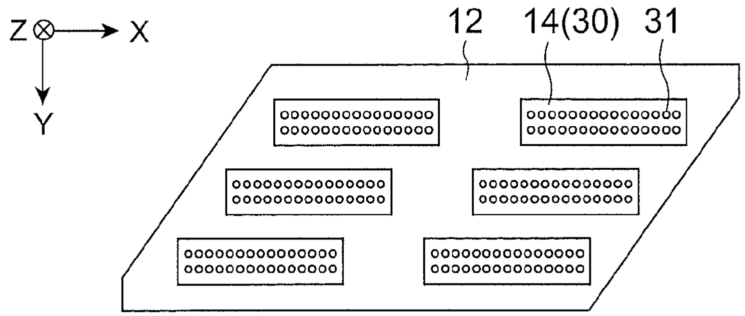
FIG. 2A is a schematic plan view of a carriage.

FIG. 2A is a schematic plan view showing the carriage. As shown in FIG. 2A, each of the carriages 12 has two lines of heads arranged thereon, each of the lines having three droplet ejection heads 14 and being formed along substantially the Y direction. Further, the nozzle plate 30 is disposed on the surface of each of the droplet ejection heads 14, and the nozzle plate 30 is provided with a plurality of nozzles 31. The number of the nozzles 31 can be set in accordance with a pattern of ejection and the size of the substrate 7, and in the present embodiment, for example, each nozzle plate 30 has two lines of nozzles 31, each of the lines having fifteen nozzles 31 arranged therein.

Figure 2B:
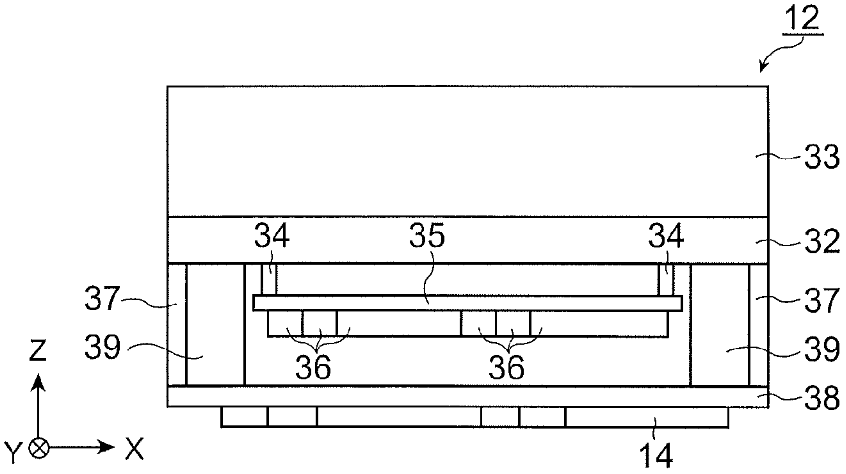
FIG. 2B is a schematic side view of the carriage for explaining a structure of the carriage.

FIG. 2B is a schematic side view showing the carriage, which shows the carriage shown in FIG. 2A viewed from the Y direction. As shown in FIG. 2B, the carriage 12 is provided with a base plate 32. On the upper side of the base plate 32, there is disposed a moving mechanism 33 which houses a mechanism for the carriage 12 to move along the guide rail 11.

On the lower side of the base plate 32, there is disposed a drive circuit board 35 via support sections 34. Further, on the lower side of the drive circuit board 35, there are disposed head drive circuits 36. Further, the base plate 32 is provided with a head attachment plate 38 attached via support sections 37, and on the lower surface of the head attachment plate 38, there are disposed the droplet ejection heads 14. The head drive circuits 36 and the droplet ejection heads 14 are connected to each other via cables, not shown, so that drive signals output by the head drive circuits 36 are input to the droplet ejection heads 14.

On the lower side of the base plate 32, there are disposed supply devices 39, and between the reservoir tank 10 and the supply devices 39, and between the supply devices 39 and the droplet ejection heads 14, there are tubes, not shown, for connecting the components. Thus, it is arranged that the functional liquid supplied from the reservoir tank 10 is supplied to the droplet ejection heads 14 by the supply devices 39.

Figure 2C:
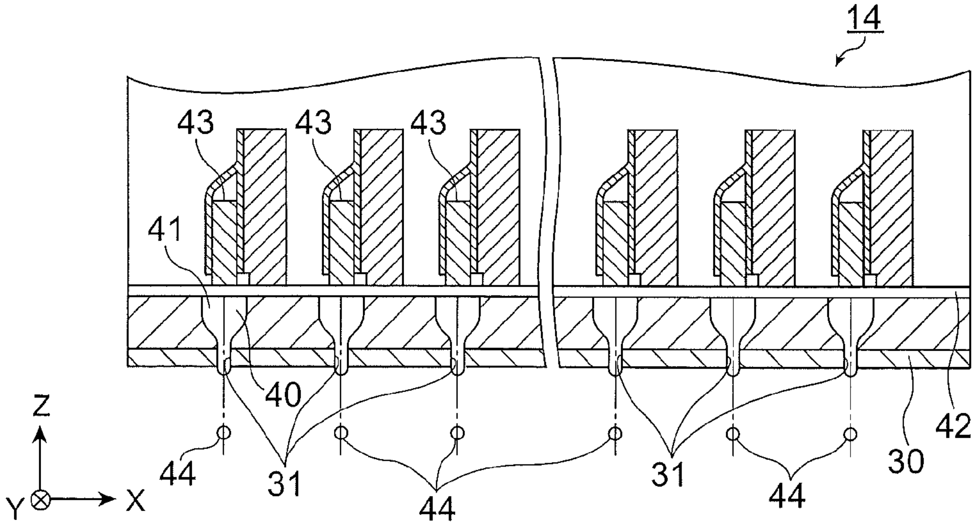
FIG. 2C is a schematic cross-sectional view of a substantial part of a droplet ejection head for explaining the structure of the droplet ejection head.

FIG. 2C is a schematic cross-sectional view of a substantial part of the droplet ejection head for explaining the structure of the droplet ejection head. As shown in FIG. 2C, the droplet ejection head 14 is provided with the nozzle plate 30, and the nozzle plate 30 is provided with the nozzles 31. On the upper side of the nozzle plate 30 and at positions corresponding to the nozzles 31, there are formed cavities 40 communicating with the respective nozzles 31. Further, the cavities 40 of the droplet ejection head 14 are supplied with the functional liquid 41 as a liquid reserved in the reservoir tank 10.

On the upper side of each of the cavities 40, there are disposed a diaphragm 42 vibrating in the vertical direction (the Z direction) to increase and decrease the volume of the cavity 40, and a piezoelectric element 43 expanding and contracting in the vertical direction to vibrate the diaphragm 42. The piezoelectric element 43 expands and contracts in the vertical direction to vibrate while pressurizing the diaphragm 42, and the diaphragm 42 increases and decreases the volume of the cavity 40 to pressurize the cavity 40. Thus, it is arranged that the pressure inside the cavity 40 varies, and the functional liquid 41 supplied in the cavity 40 is ejected through the nozzle 31.

Further, when the droplet ejection head 14 receives a nozzle drive signal for controlling the drive of the piezoelectric element 43, the piezoelectric element 43 expands to cause the diaphragm 42 to decrease the volume of the cavity 40. As a result, a corresponding amount of the functional liquid 41 to the amount of decrease in the volume is ejected as a droplet 44 from the nozzle 31 of the droplet ejection head 14. When ejecting the droplet 44 from the nozzle 31, a part of the energy applied to the droplet ejection head 14 for ejecting the droplet 44 is converted into heat. Thus, the droplet ejection head 14 is heated, and the temperature thereof rises.

Figure 3:
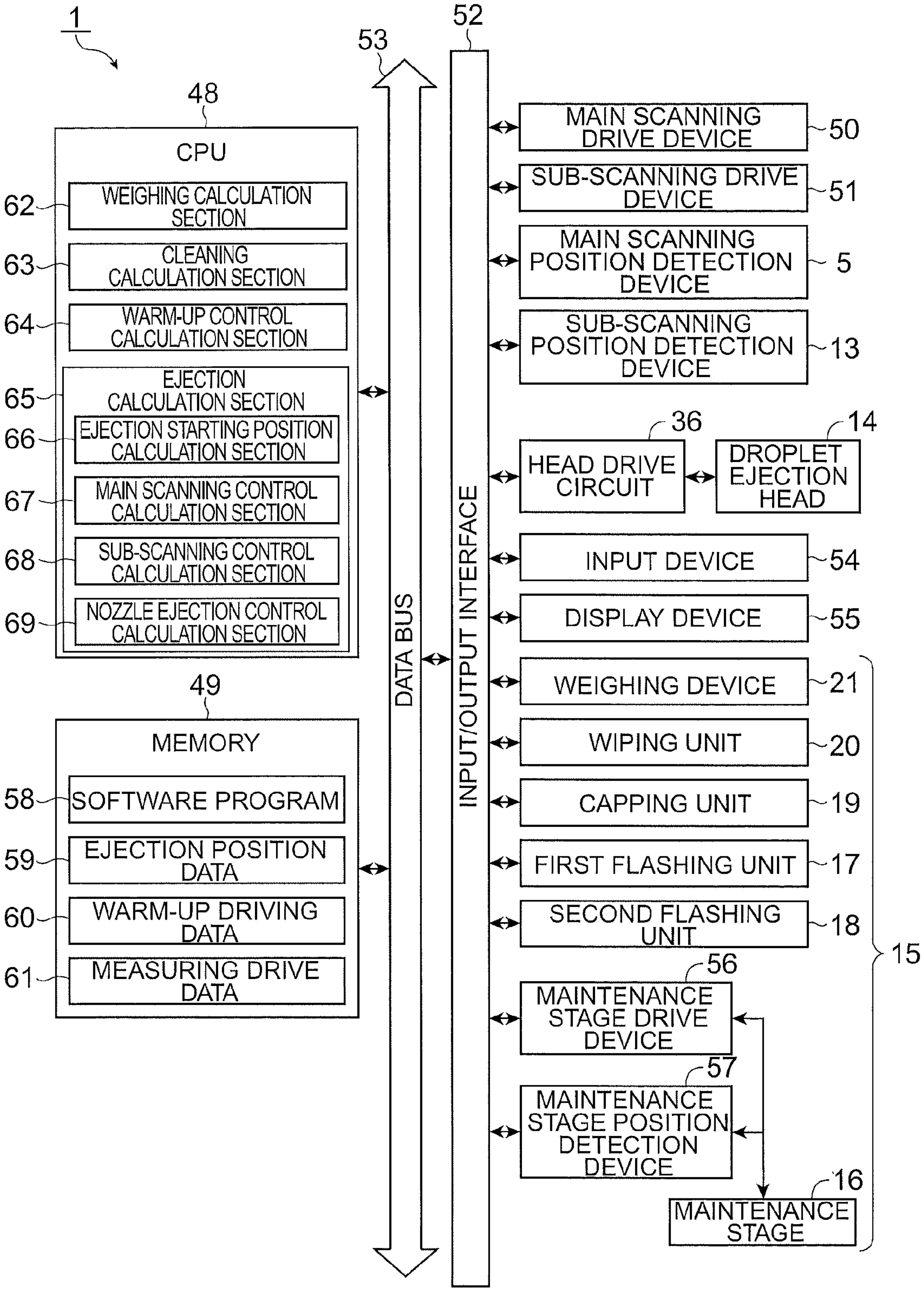
FIG. 3 is a block diagram of electric control of the droplet ejection device.

FIG. 3 is a block diagram of electric control of the droplet ejection device. In FIG. 3, the droplet ejection device 1 is provided with a central processing unit (CPU) 48 for performing various arithmetic processing as a processor, and a memory 49 for storing various information.

A main scanning drive device 50, a sub-scanning drive device 51, the main scanning position detection device 5, the sub-scanning position detection device 13, and the head drive circuits 36 each for driving the droplet ejection head 14 are connected to the CPU 48 via a input/output interface 52 and a data bus 53. Further, an input device 54, a display device 55, the weighing device 21, the first flashing unit 17, the second flashing unit 18, the capping unit 19, and the wiping unit 20 are also connected to the CPU 48 via the input/output interface 52 and the data bus 53. Similarly, in the cleaning unit 15, a maintenance stage drive device 56 for driving the maintenance stage 16 and a maintenance stage position detection device 57 for detecting the position of the maintenance stage 16 are also connected to the CPU 48 via the input/output interface 52 and the data bus 53.

The main scanning drive device 50 is a device for controlling the movement of the stage 4, and the sub-scanning drive device 51 is a device for controlling the movement of the carriages 12. The main scanning position detection device 5 recognizes the position of the stage 4, and the main scanning drive device 50 controls the movement of the stage 4, thus it becomes possible to move the stage 4 to a desired position and to stop the stage 4 at that position. Similarly, the sub-scanning position detection device 13 recognizes the position of the carriage 12, and the sub-scanning drive device 51 controls the movement of the carriage 12, thus it becomes possible to move the carriage 12 to a desired position and to stop the carriage 12 at that position.

The input device 54 is a device for inputting various processing conditions for ejecting the droplet 44, specifically a device for receiving the coordinate of the substrate 7 to which the droplet 44 is ejected from an external device, not shown, and inputs accordingly. The display device 55 is a device for displaying the processing conditions and an operation state, and the operator performs the operation based on the information displayed on the display device 55 while using the input device 54.

The weighing device 21 is provided with the electronic balances and the trays, and is a device for measuring the weight of the droplet 44 ejected by the droplet ejection head 14 and the trays for receiving the droplet 44. The weighing device 21 measures the weight of the tray before and after the droplet 44 is ejected, and transmits the measured values to the CPU 48.

The maintenance stage drive device 56 is a device for selecting one device from the first flashing unit 17, the second flashing unit 18, the capping unit 19, the wiping unit 20, and the weighing device 21, and moving the maintenance stage 16 so that the selected device is positioned at a location opposed to the droplet ejection head 14. Further, the maintenance stage drive device 56 moves the maintenance stage 16 after the maintenance stage position detection device 57 detects the position of the maintenance stage 16, thus it becomes possible to move the maintenance stage 16 reliably to the position where the desirable device or unit opposed to the droplet ejection head 14.

The memory 49 is a conceptual representation including a semiconductor memory such as a RAM or a ROM, and a peripheral storage device such as a hard drive or a CD-ROM. From a functional point of view, a storage area for storing a software program 58 describing the control procedure of the operation in the droplet ejection device 1 is provided. Further, a storage area for storing ejection position data 59 as coordinate data of the ejection positions in the substrate 7 is also provided.

Besides the above, warm-up driving data 60 such as data of the number of times of driving in a warm-up driving of the droplet ejection head 14 is also set. Further, there is also provided a storage area for storing measuring drive data 61 for driving the piezoelectric elements 43 when measuring the weight of the droplet 44 ejected from the nozzle 31.

Further, there are also provided a storage area for storing an amount of main scanning movement with which the substrate 7 is moved in the main scanning direction (the Y direction) and an amount of sub-scanning movement with which the carriage 12 is moved in the sub-scanning direction (the X direction), a storage area functioning as a work area, a temporary file area, and so on for the CPU 48, and other various storage areas.

The CPU 48 is for performing the control for ejecting the functional liquid as a form of the droplet 44 to predetermined positions on the surface of the substrate 7 in accordance with the software program 58 stored in the memory 49. As a specific function-realizing section, there is provided a weighing calculation section 62 for performing the calculation for realizing the weighing. Further, there are also provided a cleaning calculation section 63 for calculating the timing for cleaning the droplet ejection head 14, and a warm-up control calculation section 64 for performing selection of the droplet ejection head 14 on which warm-up driving is executed and control of a period of time of the warm-up driving when executing the warm-up driving on the droplet ejection heads 14.

In addition, there are provided other sections such as an ejection calculation section 65 for performing the calculation for ejecting the droplet 44 by the droplet ejection head 14. Dividing the ejection calculation section 65 in detail, there is further provided an ejection starting position calculation section 66 for setting the droplet ejection head 14 to an initial position for ejection of the droplet. Further, the ejection calculating section 65 has a main scanning control calculation section 67 for calculating control for moving the substrate 7 in the main scanning direction (the Y direction) to perform scanning at, a predetermined speed. In addition, the ejection calculation section 65 has a sub-scanning control calculation section 68 for calculating control for moving the droplet ejection head 14 in the sub-scanning direction (the X direction) at a predetermined sub-scanning rate. Further, the ejection calculation section 65 also has various functional calculation sections such as a nozzle ejection control calculation section 69 for performing a calculation for controlling which one of the plurality of nozzles provided in the droplet ejection head 14 is to be operated for ejecting the functional liquid.

Ejection Method

Figure 4:
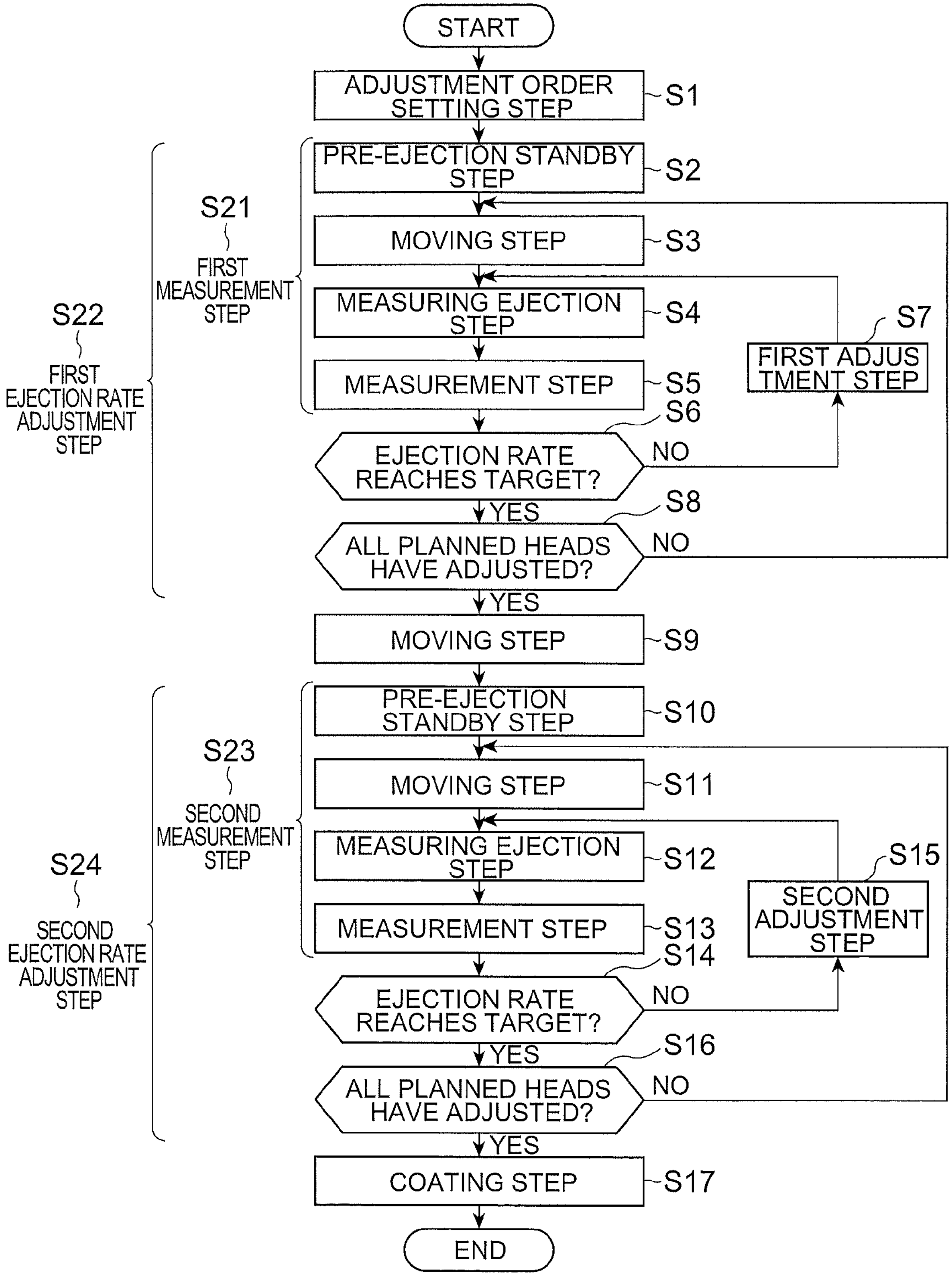
FIG. 4 is a flowchart showing a manufacturing process for coating a substrate by ejecting droplets.

Hereinafter, an ejection method for applying the functional liquid onto the substrate 7 by ejection using the droplet ejection device 1 described above will be explained with reference to FIGS. 4 through 9C. FIG. 4 is a flowchart showing a manufacturing process for coating the substrate by ejecting the droplets. FIGS. 5A through 9C are diagrams for explaining an ejection method using the droplet ejection device.

Step S1 corresponds to an adjustment order setting step, which is the step of setting the order of the droplet ejection head for adjusting the ejection rate. Then, the process proceeds to step S2. The step S2 corresponds to a pre-ejection standby step, which is a step of executing warm-up driving on the droplet ejection head. Then, the process proceeds to step S3. The step S3 corresponds to a moving step, which is a step of moving the droplet ejection head to the position opposed to the weighing device. Then, the process proceeds to step S4. The step S4 corresponds to a measuring ejection step, which is a step of performing ejection a predetermined number of times from the nozzles to the trays of the weighing device. Then, the process proceeds to step S5. The step S5 corresponds to the measurement step, which is a step of measuring the weight of the trays of the weighing device. Then, the amount of ejection per ejection is calculated in this step. The steps S2 through S5 form a first measurement step of step S21. Then, the process proceeds to step S6.

Step S6 corresponds to a step of judging whether or not the ejection rate reaches a target ejection rate, in which the ejection rate measured in the step S5 and the target ejection rate as a target of adjustment are compared to each other, and whether or not the difference between the ejection rate and the target ejection rate is smaller than a stipulated value is judged. If the difference between the ejection rate and the target ejection rate is greater than the stipulated value (NO), the process proceeds to step S7. If the difference between the ejection rate and the target ejection rate is smaller than the stipulated value (YES) in the step S6, the process proceeds to step S8. The step S7 corresponds to a first adjustment step, which is a step of adjusting the ejection rate of the droplet ejection head. Then, the process proceeds to step S4.

The step S8 corresponds to a step of judging whether or not all of the heads planned to be adjusted have been adjusted, in which whether or not all of the droplet ejection heads set to be adjusted in the step S1 have been adjusted is judged. If the droplet ejection head not yet adjusted in the ejection rate is included in the droplet ejection heads planned to be adjusted (NO), the process proceeds to the step S3. If all of the droplet ejection heads planned to be adjusted have been adjusted in the ejection rate (YES) in the step S8, the process proceeds to step S9. The steps S2 through S8 form a first ejection rate adjustment step of step S22.

The step S9 corresponds to a movement step, which is a step of moving the droplet ejection head from the position opposed to the second flashing unit and the weighing device to the position opposed to the first flashing unit. Then, the process proceeds to step S10. The step S10 corresponds to a pre-ejection standby step, which is a step of executing warm-up driving on the droplet ejection head. Then, the process proceeds to step S11. The step S11 corresponds to a moving step, which is a step of moving the droplet ejection head to the position opposed to the weighing device. Then, the process proceeds to step S12. The step S12 corresponds to a measuring ejection step, which is a step of performing ejection a predetermined number of times from the nozzles to the trays of the weighing device. Then, the process proceeds to step S13. The step S13 corresponds to the measurement step, which is a step of measuring the weight of the trays of the weighing device. Then, the amount of ejection per ejection is calculated in this step. The steps S10 through S13 form a second measurement step of step S23. Then, the process proceeds to step S14.

Step S14 corresponds to a step of judging whether or not the ejection rate reaches a target ejection rate, in which the ejection rate measured in the step S13 and the target ejection rate as a target of adjustment are compared to each other, and whether or not the difference between the ejection rate and the target ejection rate is smaller than a stipulated value is judged. If the difference between the ejection rate and the target ejection rate is greater than the stipulated value (NO), the process proceeds to step S15. If the difference between the ejection rate and the target ejection rate is smaller than the stipulated value (YES) in the step S14, the process proceeds to step S16. The step S15 corresponds to a second adjustment step, which is a step of adjusting the ejection rate of the droplet ejection head. Then, the process proceeds to step S12.

The step S16 corresponds to a step of judging whether or not all of the heads planned to be adjusted have been adjusted, in which whether or not all of the droplet ejection heads set to be adjusted in the step S1 have been adjusted is judged. If the droplet ejection head not yet adjusted in the ejection rate is included in the droplet ejection heads planned to be adjusted (NO), the process proceeds to the step S11. If all of the droplet ejection heads planned to be adjusted have been adjusted in the ejection rate (YES) in the step S16, the process proceeds to step S17. The steps S10 through S16 form a second ejection rate adjustment step of step S24.

The step S17 corresponds to a coating step, which is a step of coating the substrate by ejecting the droplet. As described herein above, the manufacturing process for coating the substrate by ejecting the functional liquid is terminated.

Hereinafter, a manufacturing method of coating a work with a droplet ejected by the droplet ejection head adjusted in the ejection rate with high accuracy will be explained in detail with reference to FIGS. 5A through 9C in conjunction with the steps shown in FIG. 4.

Figure 5A:
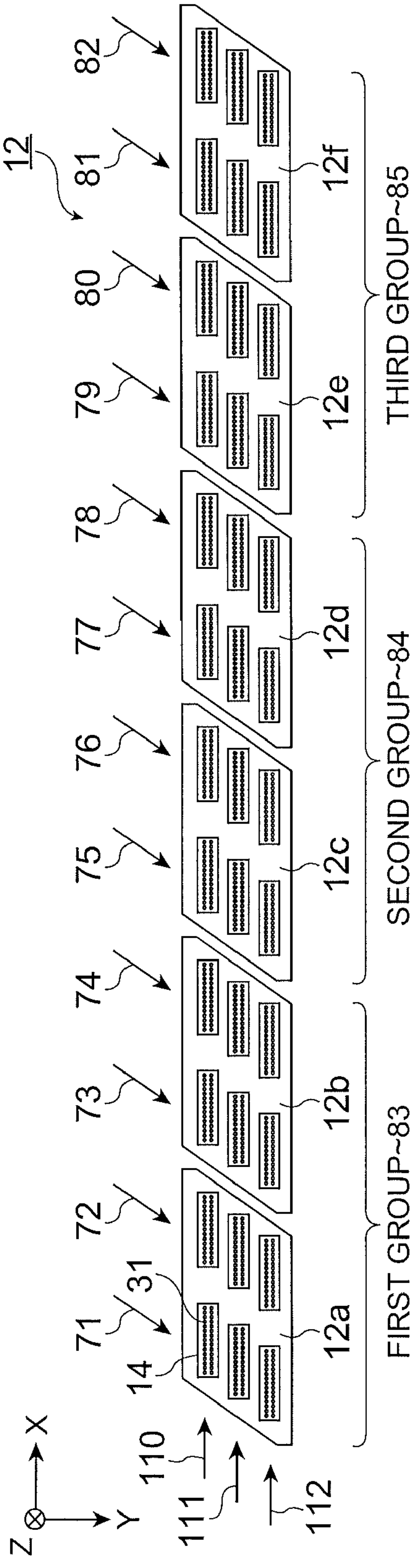
FIGS. 5A and 5B are diagrams for explaining an order of adjusting an ejection rate of a droplet ejection head.
Figure 5B:
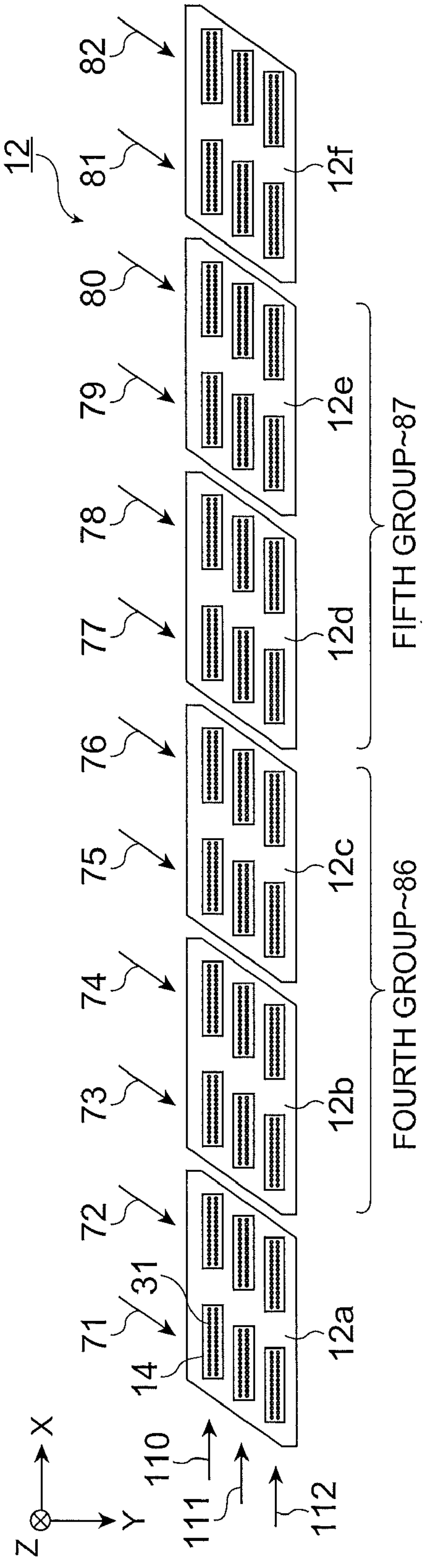

FIGS. 5A and 5B are diagrams corresponding to the step S1, and for explaining the order of the droplet ejection heads for adjusting the ejection rate. Further, FIG. 5A is a diagram for explaining the order of the droplet ejection heads for adjusting the ejection rate in the first ejection rate adjustment step. As shown in FIG. 5A, the carriage 12 is composed of six carriages, namely first through sixth carriages 12$a$ through 12$f$. Further, the first carriage 12$a$ is provided with a first head column 71 and a second head column 72. Further, the first head column 71 and the second head column 72 each have three droplet ejection heads 14 arranged in a line at an angle with the Y direction.

Similarly, the second carriage 12$b$ is provided with a third head column 73 and a fourth head column 74, and the third carriage 12$c$ is provided with a fifth head column 75 and a sixth head column 76. Further, the fourth carriage 12$d$ is provided with a seventh head column 77 and an eighth head column 78, and the fifth carriage 12$e$ is provided with a ninth head column 79 and a tenth head column 80. Similarly, the sixth carriage 12$f$ is provided with an eleventh head column 81 and a twelfth head column 82. Further, the third head column 73 through the twelfth head column 82 each have three droplet ejection heads 14 arranged in a line at an angle with the Y direction like the first head column 71. The first through twelfth head columns 71 through 82 each form a droplet ejection head column.

In the first ejection rate adjustment step in the step S22, the adjustment is performed dividing the carriages 12 into three groups. First one is set as a first group 83 including the first carriage 12$a$ and the second carriage 12$b$ combined with each other, and second one is set as a second group 84 including the third carriage 12$c$ and the fourth carriage 12$d$ combined with each other. Further, third one is set as a third group 85 including the fifth carriage 12$e$ and the sixth carriage 12$f$ combined with each other.

It is assumed that in the first group 83, the droplet ejection heads 14 in the first through third head columns 71 through 73 are adjusted in the ejection rate. Further, it is assumed that in the second group 84, the droplet ejection heads 14 in the sixth and seventh head columns 76, 77 are adjusted in the ejection rate. It is also assumed that in the third group 85, the droplet ejection heads 14 in the tenth through twelfth head columns 80 through 82 are adjusted in the ejection rate.

FIG. 5B is a diagram for explaining the order of the droplet ejection heads for adjusting the ejection rate in the second ejection rate adjustment step of the step S24. As shown in FIG. 5B, in the second ejection rate adjustment step of the step S24, the adjustment is performed dividing the carriages 12 into two groups. First one is set as a fourth group 86 including the second carriage 12$b$ and the third carriage 12$c$ combined with each other, and second one is set as a fifth group 87 including the fourth carriage 12$d$ and the fifth carriage 12$e$ combined with each other.

It is assumed that in the fourth group 86, the droplet ejection heads 14 in the fourth and fifth head columns 74 through 75 are adjusted in the ejection rate. Further, it is assumed that in the fifth group 87, the droplet ejection heads 14 in the eighth and ninth head columns 78, 79 are adjusted in the ejection rate.

In the above setting, by executing the step S22 and the step S24, the ejection rate of the droplet ejection head 14 is measured in all of the head columns, namely the first head column 71 through the twelfth head column 82.

Figure 6A:
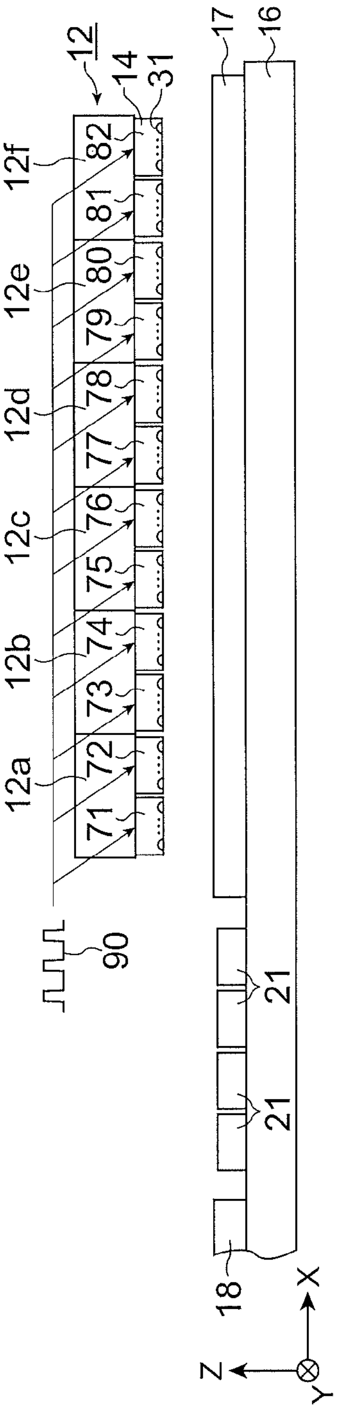
FIGS. 6A through 6C are diagrams for explaining an ejection method using the droplet ejection device.

FIG. 6A is a diagram corresponding to the step S2. As shown in FIG. 6A, the first carriage 12$a$ through the sixth carriage 12$f$ are moved to the position opposed to the first flashing unit 17. Further, by inputting a non-ejection drive waveform 90 to the droplet ejection heads 14 in the first through twelfth head columns 71 through 82, the piezoelectric elements 43 are driven to the extent that no droplet is ejected from the droplet ejection heads 14 in the first through twelfth head columns 71 through 82. Thus, the warm-up driving for warming up the droplet ejection heads 14 is performed by driving the piezoelectric elements 43. Further, since the droplet ejection heads 14 in the first through twelfth head columns 71 through 82 are heated, the temperature of the droplet ejection heads 14 rises. Further, the droplet ejection heads 14 in the standby state perform flashing for ejecting droplets 44 to the first flashing unit 17 in a predetermined interval, thereby preventing the nozzles 31 from being dried.

Figure 6B:
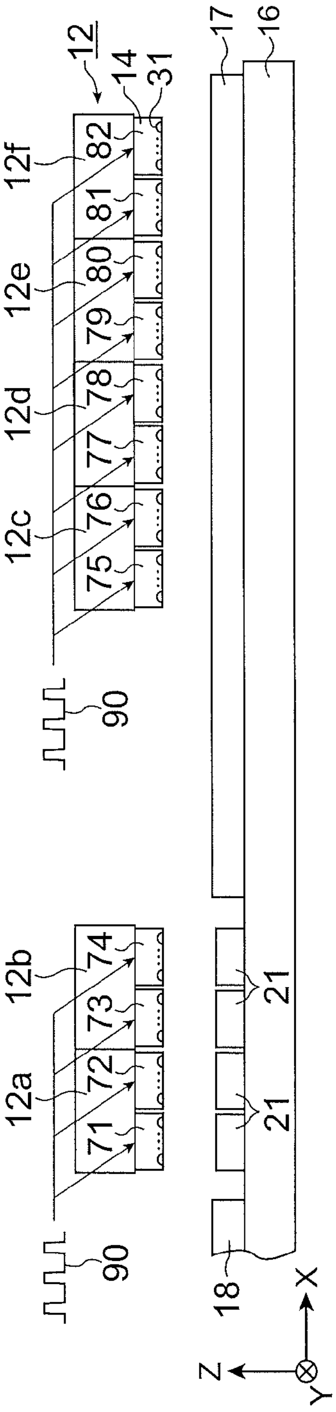

FIG. 6B is a diagram corresponding to the step S3. As shown in FIG. 6B, the first carriage 12$a$ and the second carriage 12$b$ are moved to the position opposed to the weighing device 21. Further, the droplet ejection heads 14 in the first head column 71 through the fourth head column 74 are positioned at the location opposed to the weighing device 21. In this case, the droplet ejection heads 14 in the fifth head column 75 through the twelfth head column 82 mounted on the third carriage 12$c$ through the sixth carriage 12$f$ perform the warm-up driving and the flashing while standing ready at the location opposed to the first flashing unit 17.

Figure 6C:
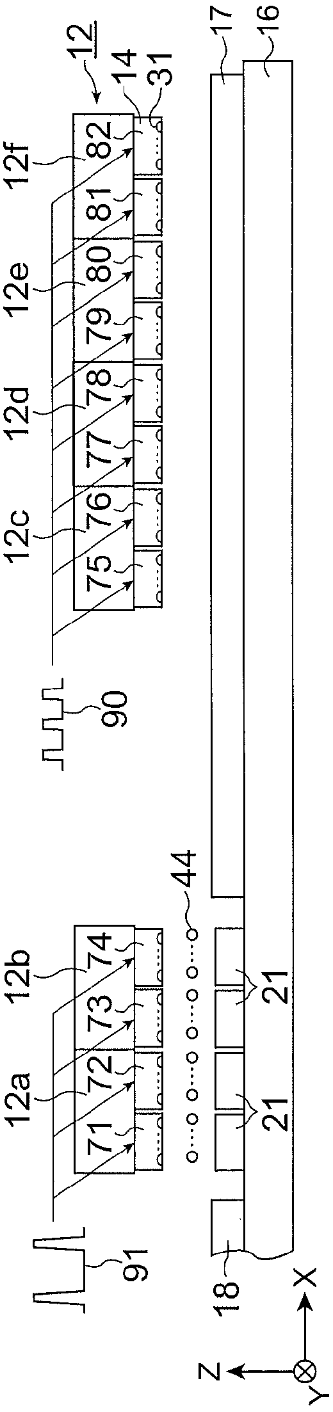

FIGS. 6C, and 7A through 7C are diagrams corresponding to the step S4. As shown in FIG. 6C, by inputting an ejection drive waveform 91 to the droplet ejection heads 14 of the first head column 71 through the fourth head column 74, the droplets 44 is ejected from the nozzles 31 to the weighing device 21.

Figure 7A:
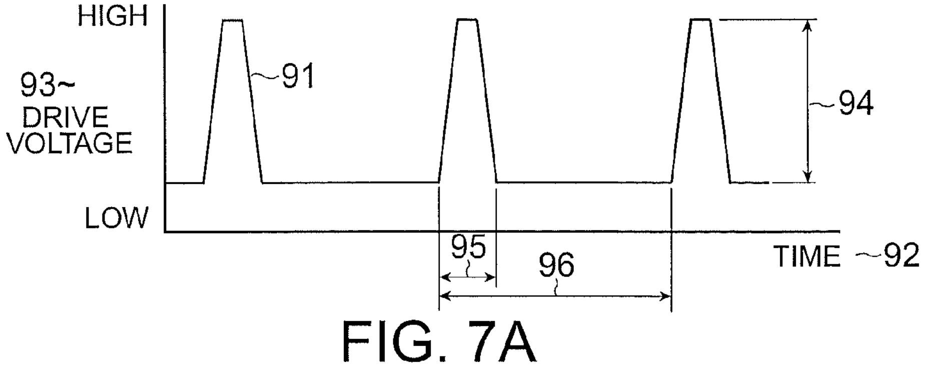
FIGS. 7A and 7B are time charts showing a drive waveform of the droplet ejection head.
Figure 7B:
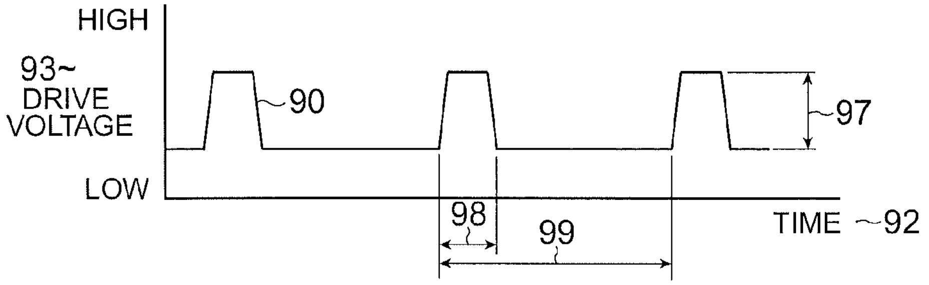

FIGS. 7A through 7B are time charts showing the drive waveform of the droplet ejection head. FIG. 7A is one example of the case in which the droplets 44 are continuously ejected from the droplet ejection head 14, and shows three ejection drive waveforms 91 with which the head drive circuit 36 drives the piezoelectric element 43. The horizontal axis of the drawing represents elapse of time 92 while the vertical axis represents a variation in drive voltage 93. The ejection drive waveform 91 has a roughly trapezoidal shape, and an ejection voltage 94 as a peak value of the drive voltage in an ejection mode and an ejection pulse width 95 are set to be a predetermined voltage and time period. Further, an ejection waveform period 96 as the cycle length of the ejection drive waveform 91 is also formed to be a predetermined time interval. The ejection voltage 94, the ejection pulse width 95, and the ejection waveform period 96 need to be set in accordance with the dynamic characteristics of the piezoelectric element 43 and the diaphragm 42. Therefore, it is desirable to obtain the optimum ejection condition by executing a preliminary experiment of actual ejection.

FIG. 7B shows three non-ejection drive waveforms 90 as one example of the case in which the warm-up driving is performed by driving the droplet ejection head 14 without ejecting the droplet 44. The non-ejection drive waveform 90 has a roughly trapezoidal shape, and it is more preferable that the non-ejection voltage 97 as a peak value of the drive voltage in a non-ejection mode is set so that the piezoelectric element 43 vibrates with an amplitude as large as possible in a range in which the droplet 44 is not ejected. In the present embodiment, a voltage roughly a third as large as the ejection voltage 94, for example, is adopted as the non-ejection voltage 97. As a non-ejection pulse width 98, which is a pulse width in the non-ejection mode, the same value as the ejection pulse width 95 is adopted. Further, a non-ejection waveform period 99 as a waveform cycle time of the non-ejection drive waveform 90 is set to have an interval for the piezoelectric element 43 to vibrate. As the non-ejection waveform period 99, the same time interval as the ejection waveform period 96, for example, is adopted in the present embodiment.

Figure 7C:
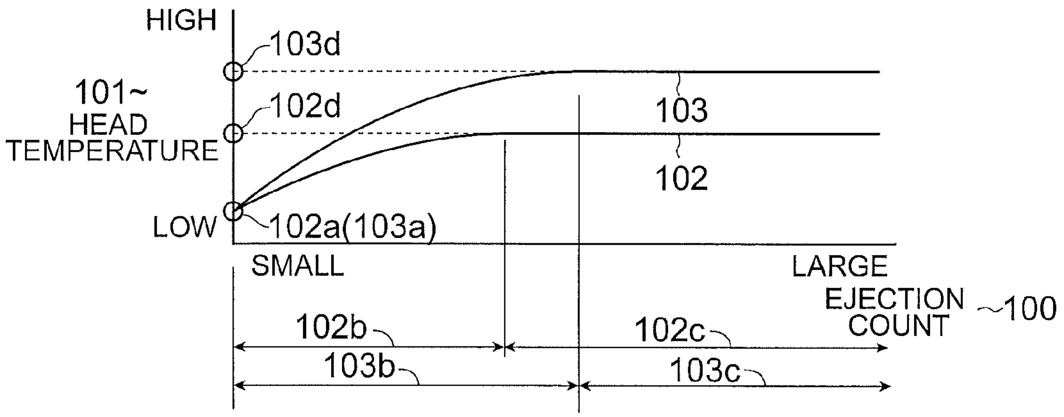
FIG. 7C is a graph showing a relationship between the number of times of drive ejection and nozzle temperature.

FIG. 7C is a graph showing a relationship between the number of times of ejection and the head temperature when the droplet ejection head is driven continuously. In FIG. 7C, the horizontal axis represents a course of an ejection count 100 as the number of times of ejection of the droplet 44 while the vertical axis represents a variation in the head temperature 101. The variation in the head temperature 101 versus the course of the ejection count 100 in the case in which the droplets 44 are ejected while continuously driving the piezo-electric element 43 is illustrated with an outer head temperature curve 102 and an inner head temperature curve 103. The outer head temperature curve 102 shows the temperature of the droplet ejection head 14 in the first head column 71 and the fourth head column 74 shown in FIG. 6C while the inner head temperature curve 103 shows the temperature of the droplet ejection head 14 in the second head column 72 and the third head column 73.

The head temperature 101 in the outer head rises in conjunction with the course of the ejection count 100 from the ejection start point 102*a*, which corresponds to the temperature when the ejection starts, along the outer head temperature curve 102. During a temperature rising area 102*b*, the head temperature 101 rises in conjunction with the course of the ejection count 100.

Then, the transition to a temperature equilibrium area 102*c* where the head temperature 101 does not rise in conjunction with the ejection count 100 is made. In the temperature equilibrium area 102*c*, an equilibrium state in which the thermal energy radiated by the droplet ejection head 14 and the thermal energy generated by the ejection operation are equal to each other is obtained. As the head temperature 101 rises, a temperature difference between the head temperature 101 and the temperature of the gas (herein after referred to as circumferential gas) surrounding the circumference of the droplet ejection head 14 increases. The larger the difference between the head temperature 101 and the temperature of the circumferential gas is, the larger thermal energy the droplet ejection head 14 radiates. Therefore, the head temperature 101 does not rise, but becomes stable at a certain value. The certain value of the head temperature 101 is defined as an equilibrium head temperature 102*d*.

Similarly in the inner head temperature curve 103, during the temperature rising area 103*b* the head temperature 101 rises from the ejection start point 103*a* as the ejection count 100 increases. Then, in the temperature equilibrium area 103*c*, the head temperature 101 becomes stable at an equilibrium head temperature 103*d*.

Since the droplet ejection heads 14 in the second head column 72 and the third head column 73 are located between the first head column 71 and the fourth head column 74, the heat radiation to the circumferential gas is limited. Therefore, the inner head temperature curve 103 keeps higher head temperature 101 than the outer head temperature curve 102. Further, the equilibrium head temperature 103*d* becomes stable at higher temperature than the equilibrium head temperature 102*d*.

In the step S5, the ejection rate is measured in the droplet ejection heads 14 in the first head column 71 through the third head column 73. Since the first head column 71 performs ejection in the step S17 while positioned in the outer line, it performs ejection in step S4 in substantially the same arrangement condition as in the step S17. Similarly, the second head column 72 and the third head column 73 are positioned at the inner line in the step S17, and perform ejection while positioned between the first head column 71 and the fourth head column 74. In other words, the droplet ejection heads 14 in the first head column 71 through the third head column 73 performs ejection in the step S4 insubstantially the same arrangement condition as in the step S17. Since the fourth head column 74 performs ejection in the step S17 while positioned in the inner line, it performs ejection in step S4 in a different arrangement condition as in the step S17. Then, in the steps S4 and S17, the ejection rate is measured in the droplet ejection heads 14 in the first head column 71 through the third head column 73, which perform ejection in substantially the same arrangement condition in both the step S4 and the step S17.

In the measurement of the ejection rate, the ejection rate is obtained by dividing the weight of the droplets 44 ejected in the step S4 by the number of times of ejection. Regarding the number of times of ejection, any number with which the ejection rate can be measured with the variation in the amount of every ejection averaged can be used, and in the present embodiment, 100 times is adopted. Then, the ejection rate is measured for every droplet ejection head 14.

Figure 7D:
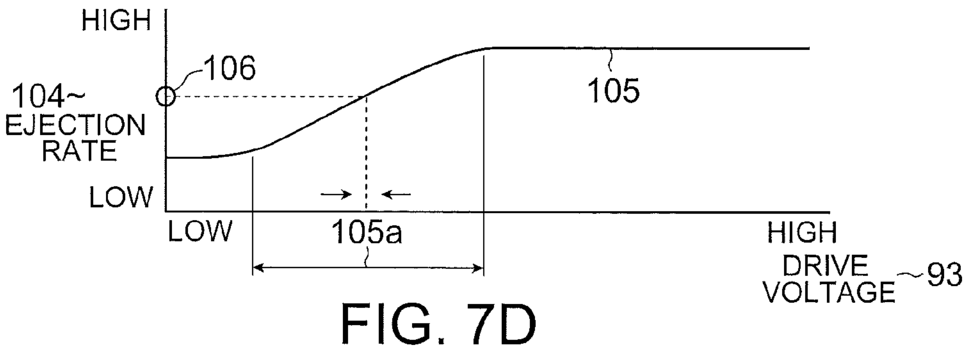
FIG. 7D is a graph showing a relationship between a drive voltage and an ejection rate.

FIG. 7D is a diagram corresponding to the step S7, and is a graph showing a relationship between the drive voltage and the ejection rate when driving the droplet ejection head. In FIG. 7D, the horizontal axis represents the drive voltage 93, wherein the right side shows a higher voltage than the left side. Further, the vertical axis thereof represents the ejection rate 104 of the droplet ejection head, wherein the upper side shows a larger amount than the lower side. Further, a voltage-ejection rate curve 105 shows a relationship between a change in the drive voltage 93 and a variation in the ejection rate 104.

As illustrated with the voltage-ejection rate curve 105, when the drive voltage 93 is raised, the ejection rate 104 increases. Further, the droplet ejection head 14 is designed so that the ejection voltage 94 is included in a drive voltage range 105*a* defined as a voltage range in which the ejection rate 104 varies as the drive voltage 93 is changed. This voltage-ejection rate curve 105 is one example only, and the voltage-ejection rate curve 105 varies if the head temperature 101 varies.

In the step S7, the target ejection rate 106, which is an ejection rate 104 to be targeted, and the ejection rate 104 measured in the step S5 are compared with each other. Then, a difference in the drive voltage 93 corresponding to the difference between the target ejection rate 106 and the ejection rate 104 thus measured is calculated. Then, if the ejection rate 104 thus measured is smaller than the target ejection rate 106, the ejection voltage 94 is raised by the amount corresponding to the difference in the drive voltage 93. On the other hand, if the ejection rate 104 thus measured is larger than the target ejection rate 106, the ejection voltage 94 is lowered by the amount corresponding to the difference in the drive voltage 93.

Then, by repeating the steps S4 through S7, the ejection rate 104 is made closer to the target ejection rate 106. In the step S6, if the difference between the target ejection rate 106 and the ejection rate 104 thus measured becomes smaller than a stipulated value, the adjustment of the ejection rate 104 in the droplet ejection heads 14 in the first head column 71 through the fourth head column 74 is terminated.

Figure 8A:
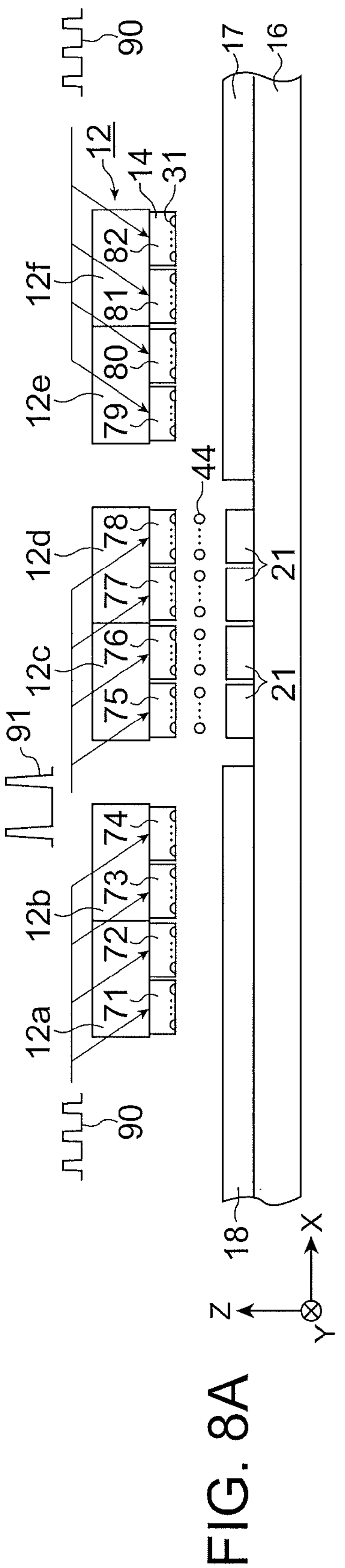
FIGS. 8A through 8C are diagrams for explaining an ejection method using the droplet ejection device.
Figure 8B:
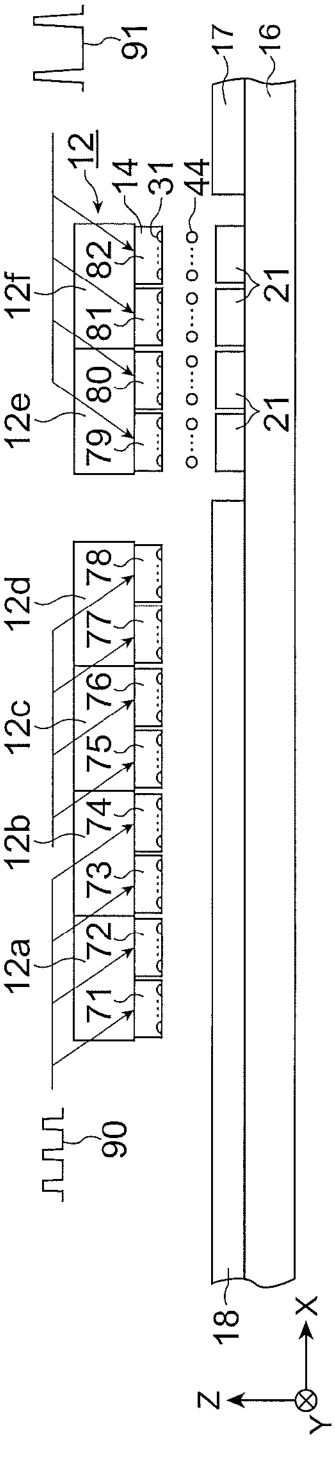

FIGS. 8A and 8B are diagrams corresponding to the step S22. As shown in FIG. 8A, in the step S3, the first carriage 12*a* and the second carriage 12*b* are moved from the position opposed to the weighing device 21 to the position opposed to the second flashing unit 18. Then, the third carriage 12*c* and the fourth carriage 12*d* are moved from the position opposed to the first flashing unit 17 to the position opposed to the weighing device 21. The fifth carriage 12*e* and the sixth carriage 12*f* stand ready at the position opposed to the first flashing unit 17.

In the step S4, the non-ejection drive waveforms 90 are input to the droplet ejection heads 14 in the first head column 71 through the fourth head column 74, and the ninth head column 79 through the twelfth head column 82, thus performing the warm-up driving. Then, the droplets 44 are ejected from the droplet ejection heads 14 of the first head column 71 through the fourth head column 74 to the second flashing unit 18, thus performing the flashing operation. Similarly, the droplets 44 are ejected from the droplet ejection heads 14 of the ninth head column 79 through the twelfth head column 82 to the first flashing unit 17, thus performing the flashing operation.

The ejection drive waveforms 91 are input to the droplet ejection heads 14 in the fifth head column 75 through the eighth head column 78 to eject the droplets 44 to the weighing device 21*a* predetermined number of times. Then, in the step S5, the weight of the droplets 44 thus ejected is measured. On this occasion, the weight of the droplets 44 ejected from the droplet ejection heads 14 in the sixth head column 76 and the seventh head column 77 both sandwiched between the fifth head column 75 and the eighth head column 78 is measured.

Then, the ejection rate is obtained by dividing the weight by the number of times of ejection. Then, the adjustment is performed in the step S7. While repeating the steps S4 through S7, if the difference between the target ejection rate 106 and the ejection rate 104 thus measured becomes smaller than a stipulated value, the adjustment of the ejection rate in the droplet ejection heads 14 in the sixth head column 76 and the seventh head column 77 is terminated.

Then, as shown in FIG. 8B, in the step S3, the third carriage 12*c* and the fourth carriage 12*d* are moved from the position opposed to the weighing device 21 to the position opposed to the second flashing unit 18. Then, the fifth carriage 12*e* and the sixth carriage 12*f* are moved from the position opposed to the first flashing unit 17 to the position opposed to the weighing device 21. The first carriage 12*a* and the second carriage 12*b* stand ready at the position opposed to the second flashing unit 18.

In the step S4, the non-ejection drive waveforms 90 are input to the droplet ejection heads 14 in the first head column 71 through the eighth head column 78 to perform the warm-up driving. Then, the droplets 44 are periodically ejected from the droplet ejection heads 14 of the first head column 71 through the eighth head column 78 to the second flashing unit 18, thus performing the flashing operation.

The ejection drive waveforms 91 are input to the droplet ejection heads 14 in the ninth head column 79 through the twelfth head column 82 to eject the droplets 44 to the weighing device 21*a* predetermined number of times. Then, in the step S5, the weight of the droplets 44 thus ejected is measured. On this occasion, the weight of the droplets 44 ejected from the droplet ejection heads 14 in the tenth head column 80 and the eleventh head column 81 both sandwiched between the ninth head column 79 and the twelfth head column 82 is measured. Further, the weight of the droplets 44 ejected from the droplet ejection heads 14 in the twelfth head column 82, the right most one, is measured.

Then, the ejection rate is obtained by dividing the weight by the number of times of ejection. Then, the adjustment is performed in the step S7. While repeating the steps S4 through S7, if the difference between the target ejection rate 106 and the ejection rate 104 thus measured becomes smaller than the stipulated value, the adjustment of the ejection rate in the droplet ejection heads 14 in the tenth head column 80 through the twelfth head column 82 is terminated.

Figure 8C:
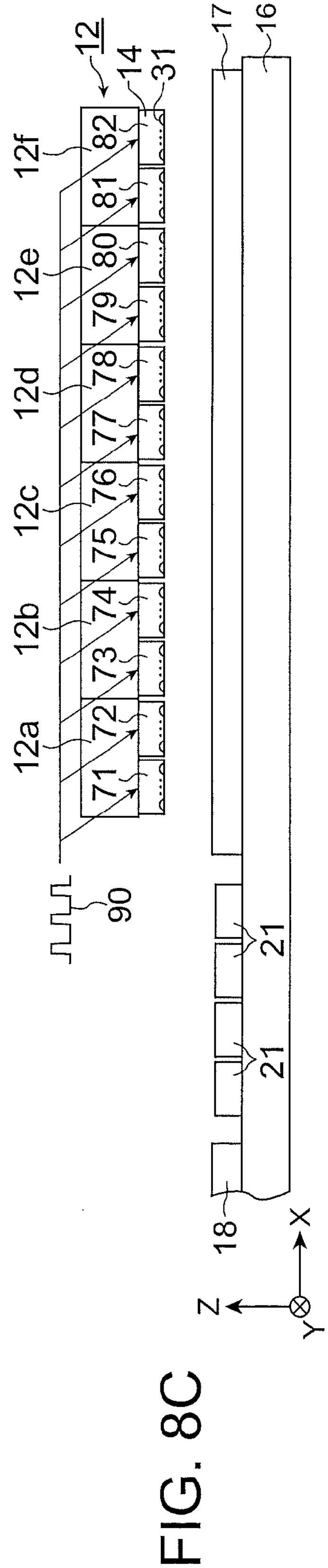

FIG. 8C is a diagram corresponding to the steps S9 and S10. As shown in FIG. 8C, the fifth carriage 12*e* and the sixth carriage 12*f* are moved from the position opposed to the weighing device 21 to the position opposed to the first flashing unit 17. Then, the first carriage 12*a* through the fourth carriage 12*d* are moved from the position opposed to the second flashing unit 18 to the position opposed to the first flashing unit 17.

Subsequently, in the step S10, the non-ejection drive waveforms 90 are input to the droplet ejection heads 14 in the first head column 71 through the twelfth head column 82 to perform the warm-up driving. Then, the droplets 44 are periodically ejected from the droplet ejection heads 14 of the first head column 71 through the twelfth head column 82 to the first flashing unit 17, thus performing the flashing operation.

Figure 9A:
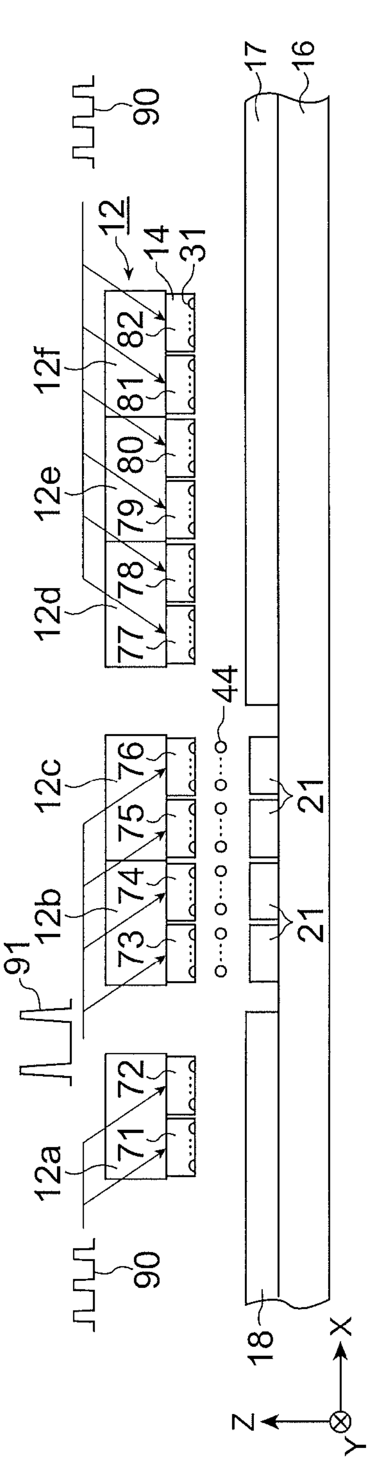
FIGS. 9A through 9C are diagrams for explaining an ejection method using the droplet ejection device.
Figure 9B:
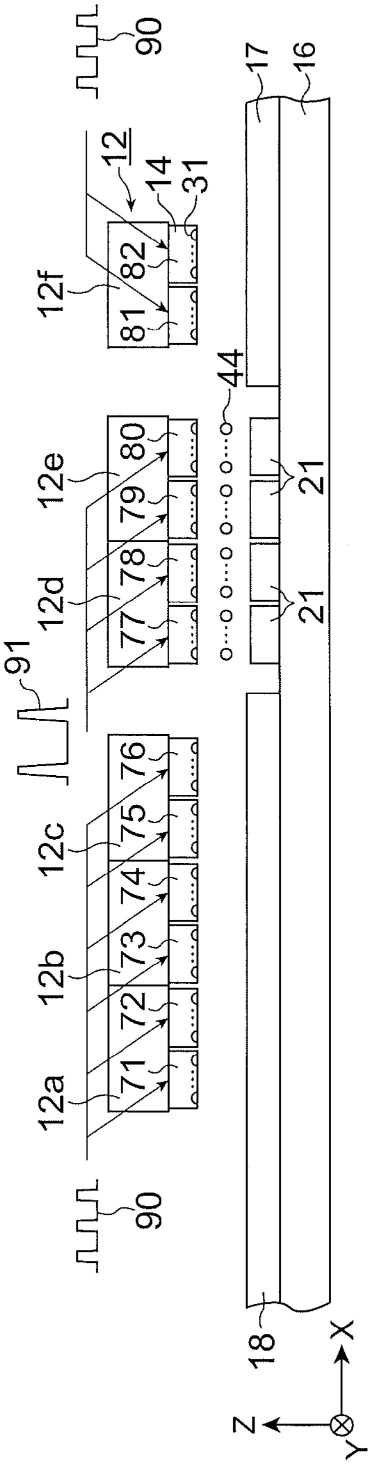

FIGS. 9A and 9B are diagrams corresponding to the step S24. As shown in FIG. 9A, in the step S11, the first carriage 12*a* is moved from the position opposed to the first flashing unit 17 to the position opposed to the second flashing unit 18. Then, the second carriage 12*b* and the third carriage 12*c* are moved from the position opposed to the first flashing unit 17 to the position opposed to the weighing device 21. The fourth carriage 12*d* through the sixth carriage 12*f* stand ready at the position opposed to the first flashing unit 17.

In the step S12, the non-ejection drive waveforms 90 are input to the droplet ejection heads 14 in the first head column 71, the second head column 72, and the seventh head column 77 through the twelfth head column 82, thus performing the warm-up driving. Then, the droplets 44 are periodically ejected from the droplet ejection heads 14 of the first head column 71 and the second head column 72 to the second flashing unit 18, thus performing the flashing operation. Similarly, the droplets 44 are periodically ejected from the droplet ejection heads 14 of the seventh head column 77 through the twelfth head column 82 to the first flashing unit 17, thus performing the flashing operation.

The ejection drive waveforms 91 are input to the droplet ejection heads 14 in the third head column 73 through the sixth head column 76 to eject the droplets 44 to the weighing device 21*a* predetermined number of times. Then, in the step S13, the weight of the droplets 44 thus ejected is measured. On this occasion, the weight of the droplets 44 ejected from the droplet ejection heads 14 in the fourth head column 74 and the fifth head column 75 both sandwiched between the third head column 73 and the sixth head column 76 is measured.

Then, the ejection rate is obtained by dividing the weight by the number of times of ejection. Then, the adjustment is performed in the step S15. While repeating the steps S12 through S15, if the difference between the target ejection rate 106 and the ejection rate 104 thus measured becomes smaller than a stipulated value, the adjustment of the ejection rate in the droplet ejection heads 14 in the fourth head column 74 and the fifth head column 75 is terminated.

Then, as shown in FIG. 9B, in the step S11, the second carriage 12*b* and the third carriage 12*c* are moved from the position opposed to the weighing device 21 to the position opposed to the second flashing unit 18. Then, the fourth carriage 12*d* and the fifth carriage 12*e* are moved from the position opposed to the first flashing unit 17 to the position opposed to the weighing device 21. The first carriage 12*a* stands ready at the position opposed to the second flashing unit 18, and the sixth carriage 12*f* stands ready at the position opposed to the first flashing unit 17.

In the step S12, the non-ejection drive waveforms 90 are input to the droplet ejection heads 14 in the first head column 71 through the sixth head column 76, the eleventh head column 81, and the twelfth head column 82, thus performing the warm-up driving. Then, the droplets 44 are periodically ejected from the droplet ejection heads 14 of the first head column 71 through the sixth head column 76 to the second flashing unit 18, thus performing the flashing operation. Similarly, the droplets 44 are periodically ejected from the droplet ejection heads 14 of the eleventh head column 81 and the twelfth head column 82 to the first flashing unit 17, thus performing the flashing operation.

The ejection drive waveforms 91 are input to the droplet ejection heads 14 in the seventh head column 77 through the tenth head column 80 to eject the droplets 44 to the weighing device 21*a* predetermined number of times. Then, in the step S13, the weight of the droplets 44 thus ejected is measured. On this occasion, the weight of the droplets 44 ejected from the droplet ejection heads 14 in the eighth head column 78 and the ninth head column 79 both sandwiched between the seventh head column 77 and the tenth head column 80 is measured.

Then, the ejection rate is obtained by dividing the weight by the number of times of ejection. Then, the adjustment is performed in the step S15. While repeating the steps S12 through S15, if the difference between the target ejection rate 106 and the ejection rate 104 thus measured becomes smaller than a stipulated value, the adjustment of the ejection rate in the droplet ejection heads 14 in the eighth head column 78 and the ninth head column 79 is terminated.

According to the steps described herein above, the ejection rate of the droplet ejection heads 14 in the second head column 72 through the eleventh head column 81 is measured in the condition in which the droplet ejection heads 14 ejects the droplets 44 while positioned between the adjacent droplet ejection heads 14, and then the adjustment of the ejection rate is performed. This is the same form as the form of the droplet ejection head 14 when performing ejection in the step S17. Then, the ejection rate of the droplet ejection heads 14 in the first head column 71 through the twelfth head column 82 is measured in the condition in which the droplet ejection heads 14 ejects the droplets 44 while not positioned between the droplet ejection heads 14, and then the adjustment of the ejection rate is performed. This is also the same form as the form of the droplet ejection head 14 when performing ejection in the step S17. In other words, the adjustment of the ejection rate is performed in the same form as the form of the droplet ejection head 14 when performing ejection in the step S17.

Figure 9C:
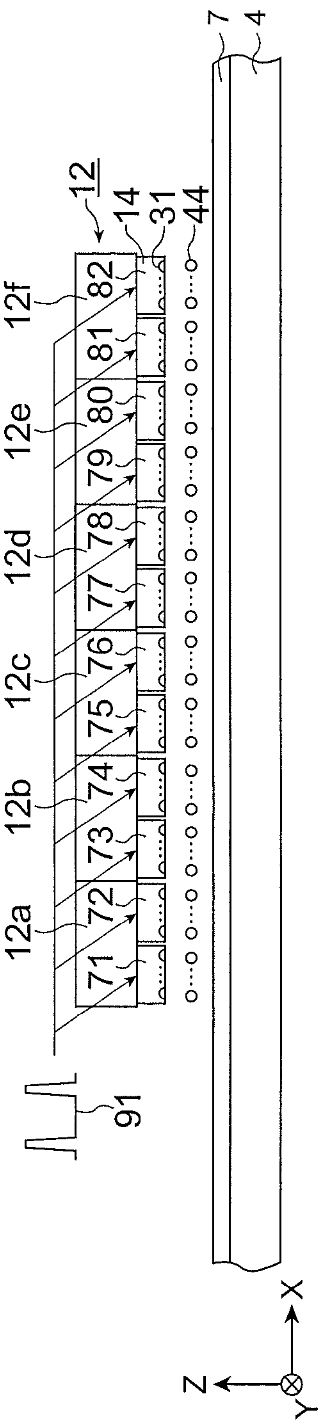

FIG. 9C is a diagram corresponding to the step S17. As shown in FIG. 9C, by moving the carriage 12 and the stage 4, the droplet ejection head 14 and the substrate 7 are moved so that the droplet ejection heads 14 and the substrate 7 are opposed to each other. Subsequently, by ejecting the droplets 44 in accordance with a predetermined drawing pattern, the droplets 44 are applied on the substrate 7. The step S17 is terminated after applying the planned drawing pattern, and then the manufacturing process of ejecting the droplets to the substrate 7 to apply them thereon is terminated.

As described above, according to the present embodiment, there are obtained the following advantages.

According to the present embodiment, the ejection rate is measured separately in the first measurement step in the step S21 and the second measurement step in the step S23. Further, in the step S21, the ejection rate in the case in which the ejection is performed by the droplet ejection head 14 belonging to the droplet ejection head column in the condition of being sandwiched by other droplet ejection head columns is measured. In other words, the ejection rate in the case in which the ejection is performed by the droplet ejection heads 14 belonging to the second head column 72, the third head column 73, the sixth head column 76, the seventh head column 77, the tenth head column 80, and the eleventh head column 81 is measured.

Further, in the step S23, the ejection rate is measured after the liquid is ejected while the droplet ejection head column, which is not sandwiched by other droplet ejection head columns in the step S21, is sandwiched by other droplet ejection head columns. Then, the ejection rate in the case in which the ejection is performed by the droplet ejection heads 14 belonging to the fourth head column 74, the fifth head column 75, the eighth head column 78, and the ninth head column 79 is measured. In other words, in the steps S21 and S23, the ejection rate in the case in which the ejection is performed by the droplet ejection head 14 belonging to the droplet ejection head column in the condition of being sandwiched by other droplet ejection head columns is measured. Therefore, the ejection rate of the droplet ejection heads 14 in the second head column 72 through the eleventh head column 81 can be measured at substantially the same temperature. As a result, the ejection rate can be measured with high accuracy.

According to the present embodiment, in the pre-ejection standby step in the steps S2 and S10, the droplet ejection heads perform the warm-up driving, thus the temperature of the droplet ejection head 14 is raised. Then, the ejection rate in the condition in which the droplet ejection heads are in the high temperature state is measured. When ejecting the droplets 44 to the substrate 7, the temperature of the droplet ejection head 14 has already risen since the droplet ejection head 14 ejects the droplets 44. In other words, by performing the warm-up driving, the ejection rate at substantially the same temperature as in the case in which the droplet ejection head 14 ejects the droplets 44 to the substrate 7 can be measured. Therefore, the ejection rate in the case in which the droplets 44 are ejected to the substrate 7 can be measured with high accuracy.

According to the present embodiment, the warm-up driving is performed to the extent that the droplets 44 are not ejected from the nozzles 31 of the droplet ejection head 14. Therefore, it is eliminated that the droplets 44 are wastefully ejected, thus a resource-saving ejection rate measurement method can be obtained.

According to the present embodiment, the droplet ejection heads 14 measured in the first measurement step of the step S21 are adjusted in the first adjustment step in the step S7, and then, the droplet ejection heads measured in the second measurement step of the step S23 are then adjusted in the second adjustment step in the step S15. Further, based on the measurement result obtained by measuring the ejection rate with good accuracy in the steps S21 and S23, the ejection rate is adjusted in the steps S7 and S15. Therefore, in the steps S7 and S15, the ejection rate can be adjusted with high accuracy.

According to the present embodiment, there are provided the first ejection rate adjustment step in the step S22 and the second ejection rate adjustment step in the step S24. Further, in the step S22, based on the measurement result of the ejection rate measured in the first measurement step in the step S21, the adjustment of the ejection rate is performed in the first measurement step in the step S7. Then, by repeating the step S21 and the step S7, the ejection rate is made closer to the target ejection rate. Therefore, in comparison with a method of performing the step S7 only once, the ejection rate can be adjusted with high accuracy.

Further, since the same process is performed in the step S24, the ejection rate can be adjusted with high accuracy compared to a method of performing the second adjustment step of the step S15 only once. As a result, a method capable of adjusting the ejection rate with high accuracy can be obtained.

Second Embodiment

In the present embodiment, an embodiment of a distinctive adjustment method of adjusting the ejection rate of the droplet ejection device will be explained with reference to FIGS. 4, 5A and 5B.

The present embodiment is different from the first embodiment in that the ejection rate in all of the droplet ejection heads 14 is adjusted in the first ejection rate adjustment step.

In other words, in FIG. 4, all of the steps except the step S7 in the step S22 and the step S15 in the step S24 are the same as in the first embodiment, and therefore, the explanations therefor will be omitted. Further, in the step S7, the ejection rate of the droplet ejection heads 14 belonging to the first head column 71 through the twelfth head column 82 shown in FIGS. 5A and 5B is adjusted.

Therefore, regarding the droplet ejection heads 14 belonging to the fourth head column 74, the fifth head column 75, the eighth head column 78, and the ninth head column 79, the adjustment is performed by performing ejection in the condition in which the droplet ejection head is not sandwiched by other droplet ejection head columns, then using the ejection rate to be measured, and matching the ejection rate with the target ejection rate 106.

In the step S15, substantially the same adjustment operation as in the first embodiment is performed. Therefore, the droplet ejection heads 14 belonging to the fourth head column 74, the fifth head column 75, the eighth head column 78, and the ninth head column 79 are adjusted in the ejection rate in the two steps, namely the steps S7 and S15.

In the step S24, when the ejection and the adjustment are performed repeatedly, since the droplet ejection heads 14 belonging to the fourth head column 74, the fifth head column 75, the eighth head column 78, and the ninth head column 79 have once been adjusted in the step S22, in some cases, the adjustment is completed with a fewer number of times of repetition. Further, after the adjustment is performed, in the step S17, by ejecting the droplets 44 in accordance with a predetermined drawing pattern, the droplets 44 are applied on the substrate 7. The step S17 is terminated after applying the planned drawing pattern, and then the manufacturing process of ejecting the droplets to the substrate 7 to apply them thereon is terminated.

As described above, according to the present embodiment, in addition to the first through fifth advantages in the first embodiment, there is obtained the following advantage.

According to the present embodiment, in the first measurement step of the step S21, regarding the droplet ejection heads 14 belonging to the droplet ejection head column not sandwiched by other droplet ejection head columns in the first measurement step of the step S21, the adjustment of the ejection rate has once been performed in the first ejection rate adjustment step of the step S22. Therefore, since the ejection rate of the droplet ejection heads 14 has already been adjusted to be closer to the target ejection rate, even in the case in which the temperature of the droplet ejection heads 14 becomes higher in the second ejection rate adjustment step of the step S24 than the temperature thereof in the step S22, the adjustment can be completed with a fewer number of times of repetition. As a result, an adjustment method with high productivity can be obtained.

Third Embodiment

Figure 10:
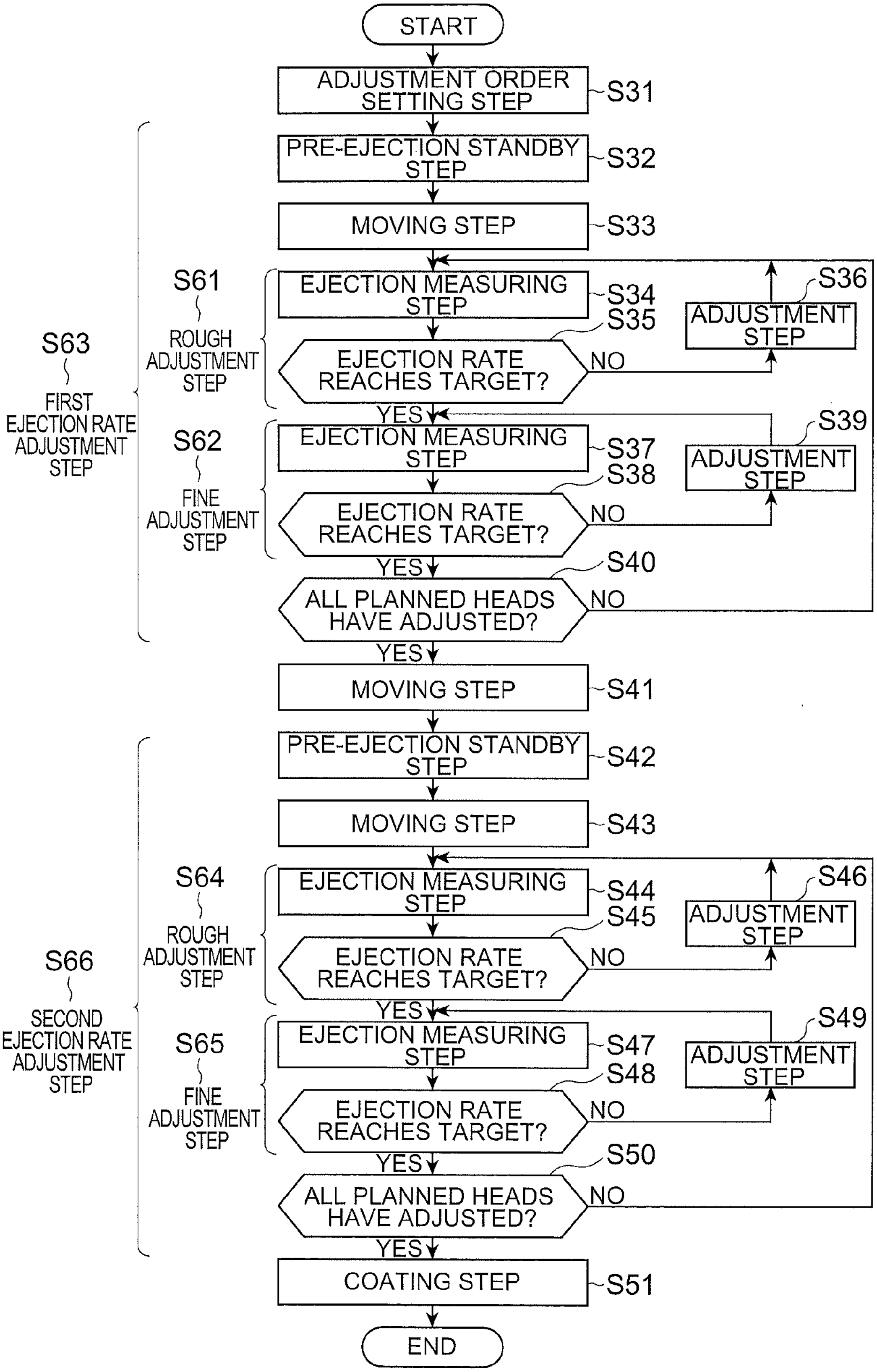
FIG. 10 is a flowchart showing a manufacturing process for coating a substrate by ejecting droplets according to a third embodiment of the invention.

In the present embodiment, an embodiment of a distinctive adjustment method of adjusting the ejection rate of the droplet ejection device will be explained with reference to FIG. 10. FIG. 10 is a flowchart showing a manufacturing process for coating the substrate by ejecting the droplets.

The present embodiment is different from the first embodiment in that the adjustment of the ejection rate performed in the first ejection rate adjustment step and the second ejection rate adjustment step is divided into a rough adjustment and a fine adjustment.

In FIG. 10, steps S31 through S33 are steps corresponding to the steps S1 through S3 shown in FIG. 4, and consequently, the explanations therefor will be omitted. The step S34 corresponds to an ejection measuring step, in which ejection is performed a predetermined number of times from the nozzles to the trays of the weighing device. For example, ejection is performed 100 times. After then, the weight of the trays of the weighing device is measured. Then, the amount of ejection per ejection is calculated in this step. Then, the process proceeds to step S35. Step S35 corresponds to a step of judging whether or not the ejection rate reaches a target ejection rate, in which the ejection rate measured in the step S34 and the target ejection rate as a target of adjustment are compared to each other, and whether or not the difference between the ejection rate and the target ejection rate is smaller than a stipulated value is judged. If the difference between the ejection rate and the target ejection rate is greater than the stipulated value (NO), the process proceeds to step S36. If the difference between the ejection rate and the target ejection rate is smaller than the stipulated value (YES) in the step S35, the process proceeds to step S37. The step S36 corresponds to an adjustment step, which is a step of adjusting the ejection rate of the droplet ejection head. Then, the process proceeds to step S34. The steps S34 through S36 form a rough adjustment step of step S61.

The step S37 corresponds to an ejection measuring step, in which ejection is performed a predetermined number of times from the nozzles to the trays of the weighing device. In this step, a larger number of times of ejection is performed than the number of times of ejection performed in the step S34. For example, ejection is performed 1000 times. Therefore, the amount of ejection in this step is larger than the amount of ejection in the step S34. After then, the weight of the trays of the weighing device is measured. Then, the amount of ejection per ejection is calculated in this step. Then, the process proceeds to step S38. Step S38 corresponds to a step of judging whether or not the ejection rate reaches a target ejection rate, in which the ejection rate measured in the step S37 and the target ejection rate as a target of adjustment are compared to each other, and whether or not the difference between the ejection rate and the target ejection rate is smaller than a stipulated value is judged. The stipulated value is set to have a narrower range than the stipulated value in the step S35. Further, if the difference between the ejection rate and the target ejection rate is greater than the stipulated value (NO), the process proceeds to step S39. If the difference between the ejection rate and the target ejection rate is smaller than the stipulated value (YES) in the step S38, the process proceeds to step S40. The step S39 corresponds to an adjustment step, which is a step of adjusting the ejection rate of the droplet ejection head. The variation of the ejection rate adjusted in this step is set to be a smaller amount than the variation adjusted in the step S36. Then, the process proceeds to step S37. The steps S37 through S39 form a fine adjustment step of step S62.

The step S40 corresponds to a step of judging whether or not all of the heads planned to be adjusted have been adjusted, in which whether or not all of the droplet ejection heads set to be adjusted in the step S31 have been adjusted is judged. If the droplet ejection head not yet adjusted in the ejection rate is included in the droplet ejection heads planned to be adjusted (NO), the process proceeds to the step S34. If all of the droplet ejection heads planned to be adjusted have been adjusted in the ejection rate (YES) in the step S40, the process proceeds to step S41. The steps S32 through S40 form a first ejection rate adjustment step of step S63.

The step S41 corresponds to a movement step, which is a step of moving the droplet ejection head from the position opposed to the second flashing unit and the weighing device to the position opposed to the first flashing unit. Then, the process proceeds to step S42. The step S42 corresponds to a pre-ejection standby step, which is a step of executing warm-up driving on the droplet ejection head. Then, the process proceeds to step S43. The step S43 corresponds to a moving step, which is a step of moving the droplet ejection head to the position opposed to the weighing device. Then, the process proceeds to step S44. The step S44 corresponds to an ejection measuring step, in which ejection is performed a predetermined number of times from the nozzles to the trays of the weighing device. For example, ejection is performed 100 times. After then, the weight of the trays of the weighing device is measured. Then, the amount of ejection per ejection is calculated in this step. Then, the process proceeds to step S45. Step S45 corresponds to a step of judging whether or not the ejection rate reaches a target ejection rate, in which the ejection rate measured in the step S44 and the target ejection rate as a target of adjustment are compared to each other, and whether or not the difference between the ejection rate and the target ejection rate is smaller than a stipulated value is judged. If the difference between the ejection rate and the target ejection rate is greater than the stipulated value (NO), the process proceeds to step S46. If the difference between the ejection rate and the target ejection rate is smaller than the stipulated value (YES) in the step S45, the process proceeds to step S47. The step S46 corresponds to an adjustment step, which is a step of adjusting the ejection rate of the droplet ejection head. Then, the process proceeds to step S44. The steps S44 through S46 form a rough adjustment step of step S64.

The step S47 corresponds to an ejection measuring step, in which ejection is performed a predetermined number of times from the nozzles to the trays of the weighing device. For example, ejection is performed 1000 times. The number of times of ejection in this step is larger than the number of times of ejection in the step S44. Therefore, the amount of ejection in this step is larger than the amount of ejection in the step S44. After then, the weight of the trays of the weighing device is measured. Then, the amount of ejection per ejection is calculated in this step. Then, the process proceeds to step S48. Step S48 corresponds to a step of judging whether or not the ejection rate reaches a target ejection rate, in which the ejection rate measured in the step S47 and the target ejection rate as a target of adjustment are compared to each other, and whether or not the difference between the ejection rate and the target ejection rate is smaller than a stipulated value is judged. The stipulated value is set to have a narrower range than the stipulated value in the step S45. Further, if the difference between the ejection rate and the target ejection rate is greater than the stipulated value (NO), the process proceeds to step S49. If the difference between the ejection rate and the target ejection rate is smaller than the stipulated value (YES) in the step S48, the process proceeds to step S50. The step S49 corresponds to an adjustment step, which is a step of adjusting the ejection rate of the droplet ejection head. The variation of the ejection rate adjusted in this step is set to be a smaller amount than the variation adjusted in the step S46. Then, the process proceeds to step S47. The steps S47 through S49 form a fine adjustment step of step S65.

The step S50 corresponds to a step of judging whether or not all of the heads planned to be adjusted have been adjusted, in which whether or not all of the droplet ejection heads set to be adjusted in the step S31 have been adjusted is judged. If the droplet ejection head not yet adjusted in the ejection rate is included in the droplet ejection heads planned to be adjusted (NO), the process proceeds to the step S44. If all of the droplet ejection heads planned to be adjusted have been adjusted in the ejection rate (YES) in the step S50, the process proceeds to step S51. The steps S42 through S50 form a second ejection rate adjustment step of step S66.

The step S51 corresponds to a coating step, which is a step of coating the substrate by ejecting the droplet. As described herein above, the manufacturing process for coating the substrate by ejecting the functional liquid is terminated.

As described above, according to the present embodiment, in addition to the first through fifth advantages in the first embodiment, there is obtained the following advantages.

According to the present embodiment, the rough adjustment steps in the steps S61 and S64, and the fine adjustment steps in the steps S62 and S65 are performed. On this occasion, in most cases, the ejection rate can be adjusted to the target ejection rate with a fewer times of adjustment operation by performing the adjustment with the rough adjustment step of making a large change in the ejection rate in combination with the fine adjustment step of adjusting the ejection rate by a small amount, compared to the case in which the adjustment is performed with repetition of the fine adjustment step. Therefore, the adjustment can be performed with high productivity.

According to the present embodiment, in the rough adjustment steps in the steps S61 and S64, the ejection rate is measured with a smaller amount of ejection in comparison with the fine adjustment steps in the steps S62 and S65. Therefore, the consumption of the liquid by ejection can be reduced. As a result, a resource-saving adjustment method can be obtained.

Fourth Embodiment

In the present embodiment, an embodiment of a distinctive adjustment method of adjusting the ejection rate of the droplet ejection device will be explained with reference to FIG. 10. The present embodiment is different from the third embodiment in that the number of times of ejection performed in a unit time is set differently in the rough adjustment step and the fine adjustment step.

In other words, in FIG. 10, the same number of times of ejection, 1000 times for example, is performed in each of the ejection measuring steps of steps S34, S37, S44, and S47. Further, in the case in which the functional liquid 41 is applied by performing ejection five times per second, for example, in the step S51, ejection is performed five times per second in the steps S37 and S47 belonging to the fine adjustment steps. Then, in the steps S34 and S44 belonging to the rough adjustment steps, ejection is performed ten times per second for the measurement. In other words, ejection is performed in a short period of time in the rough adjustment steps by using a larger number of times of ejection per unit time compared to the fine adjustment steps.

As described above, according to the present embodiment, in addition to the first through fifth advantages in the first embodiment and the first advantage in the third embodiment, there is obtained the following advantage.

According to the present embodiment, in the steps S34 and S44 belonging to the rough adjustment steps, a larger number of times of ejection per unit time is performed compared to the fine adjustment steps. In the case in which the same number of times of ejection is performed for measurement of the ejection rate in both the rough adjustment steps and the fine adjustment steps, ejection can be performed in a shorter period of time in the rough adjustment steps. Therefore, the adjustment can be performed with high productivity.

Fifth Embodiment

In the present embodiment, an embodiment of a distinctive adjustment method of adjusting the ejection rate of the droplet ejection device will be explained with reference to FIGS. 4, 5A and 5B. The present embodiment is different from the second embodiment in that in the first ejection rate adjustment step, the ejection rate is adjusted so that the ejection rate of the head column not sandwiched becomes lower than the ejection rate of the sandwiched head column.

Specifically, in the step S6 shown in FIG. 4, the ejection rate and the target ejection rate are compared with each other. On this occasion, in the first group 83 shown in FIG. 5A, the target ejection rate of the first head column 71, the second head column 72, and the third head column 73 is set to the target ejection rate used in the ejection in the step S17. Further, the target ejection rate of the fourth head column 74 is set to be lower than the target ejection rate used in the ejection in the step S17. Further, then, in the step S7, the ejection rates are adjusted to the respective target ejection rates.

Similarly, in the second group 84, the target ejection rate of the sixth head column 76 and the seventh head column 77 is set to the target ejection rate used in the ejection in the step S17. Further, the target ejection rate of the fifth head column 75 and the eighth head column 78 is set to be lower than the target ejection rate used in the ejection in the step S17. In the third group 85, the target ejection rate of the tenth head column 80, the eleventh head column 81, and the twelfth head column 82 is set to the target ejection rate used in the ejection in the step S17. Further, the target ejection rate of the ninth head column 79 is set to be lower than the target ejection rate used in the ejection in the step S17.

Subsequently, in the step S14, the ejection rate and the target ejection rate are compared with each other. On this occasion, since in the fourth group 86 shown in FIG. 5B, the fourth head column 74 and the fifth head column 75 are sandwiched by the third head column 73 and the sixth head column 76, the temperature of the droplet ejection heads 14 has risen, thus the ejection rate becomes higher than the ejection rate in the step S4. However, since the target ejection rate is set in the step S6 to be lower than the target ejection rate used in the ejection in the step S17, the ejection rate close to the target ejection rate used in the ejection in the step S17 is obtained in the step S14 in most cases. Similarly, also in the fifth group 87, the ejection rate of the eighth head column 78 and the ninth head column 79 becomes close to the target ejection rate used in the ejection in the step S17 in most cases. Therefore, the number of times of repetition of the steps S12 through S15 can be reduced.

As described above, according to the present embodiment, in addition to the first through fifth advantages in the first embodiment, there is obtained the following advantage.

According to the present embodiment, the ejection rate of the liquid ejected from the droplet ejection head not sandwiched by the droplet ejection head columns is adjusted in the step S7 to be lower than the target ejection rate used in the ejection in the step S17. Therefore, when measuring the ejection rate while sandwiched by other droplet ejection heads, the adjustment of the ejection rate can be started form an ejection rate close to the target of the ejection rate used in the ejection in the step S17. As a result, since the adjustment can be competed with a fewer number of times of adjusting operation, the adjustment can be performed with high productivity.

Sixth Embodiment

In the present embodiment, an embodiment of a distinctive adjustment method of adjusting the ejection rate of the droplet ejection device will be explained with reference to FIGS. 4, 5A and 5B. The present embodiment is different from the second embodiment in that the step of setting the ejection rate of the head column not sandwiched in the first ejection rate adjustment step to be lower than the ejection rate of the sandwiched head column is performed in the measuring ejection step of the second ejection rate adjustment step.

Specifically, the steps S1 through S11 shown in FIG. 4 is performed in the same manner as in the second embodiment. Then, in the step S12, the ejection rate adjusted in the step S7 is modified. In detail, the ejection rate of the fourth head column 74 and the fifth head column 75 of the fourth group 86 shown in FIGS. 5A and 5B is modified so that the ejection is performed at a lower ejection rate than the ejection rate set in the step S22, and then the ejection is performed.

Since the fourth head column 74 and the fifth head column 75 are sandwiched by the third head column 73 and the sixth head column 76, the temperature of the droplet ejection heads 14 has risen, thus the ejection rate becomes higher than the ejection rate in the step S22. However, since the ejection rate is set in the step S12 to be lower than the target ejection rate used in the ejection in the step S22, the ejection rate close to the target ejection rate used in the ejection in the step S17 is obtained in the step S14 in most cases. Therefore, the number of times of repetition of the steps S12 through S15 can be reduced.

Similarly, also in the fifth group 87, the ejection rate of the eighth head column 78 and the ninth head column 79 is modified in the step S12 so that the ejection is performed at a lower ejection rate than the ejection rate set in the step S22, and then the ejection is performed. As a result, the number of times of repetition of the steps S12 through S15 can be reduced.

As described above, according to the present embodiment, in addition to the first through fifth advantages in the first embodiment, there is obtained the following advantage.

According to the present embodiment, the droplet ejection heads 14 not sandwiched by the droplet ejection head columns in the step S22 is adjusted in the step S12 so as to have a lower ejection rate. Therefore, when measuring the ejection rate while sandwiched by other droplet ejection heads in the step S12, the adjustment of the ejection rate can be started form an ejection rate close to the target of the ejection rate used in the ejection in the step S17. As a result, since the adjustment can be competed with a fewer number of times of adjusting operation, the adjustment can be performed with high productivity.

Seventh Embodiment

Figure 11:
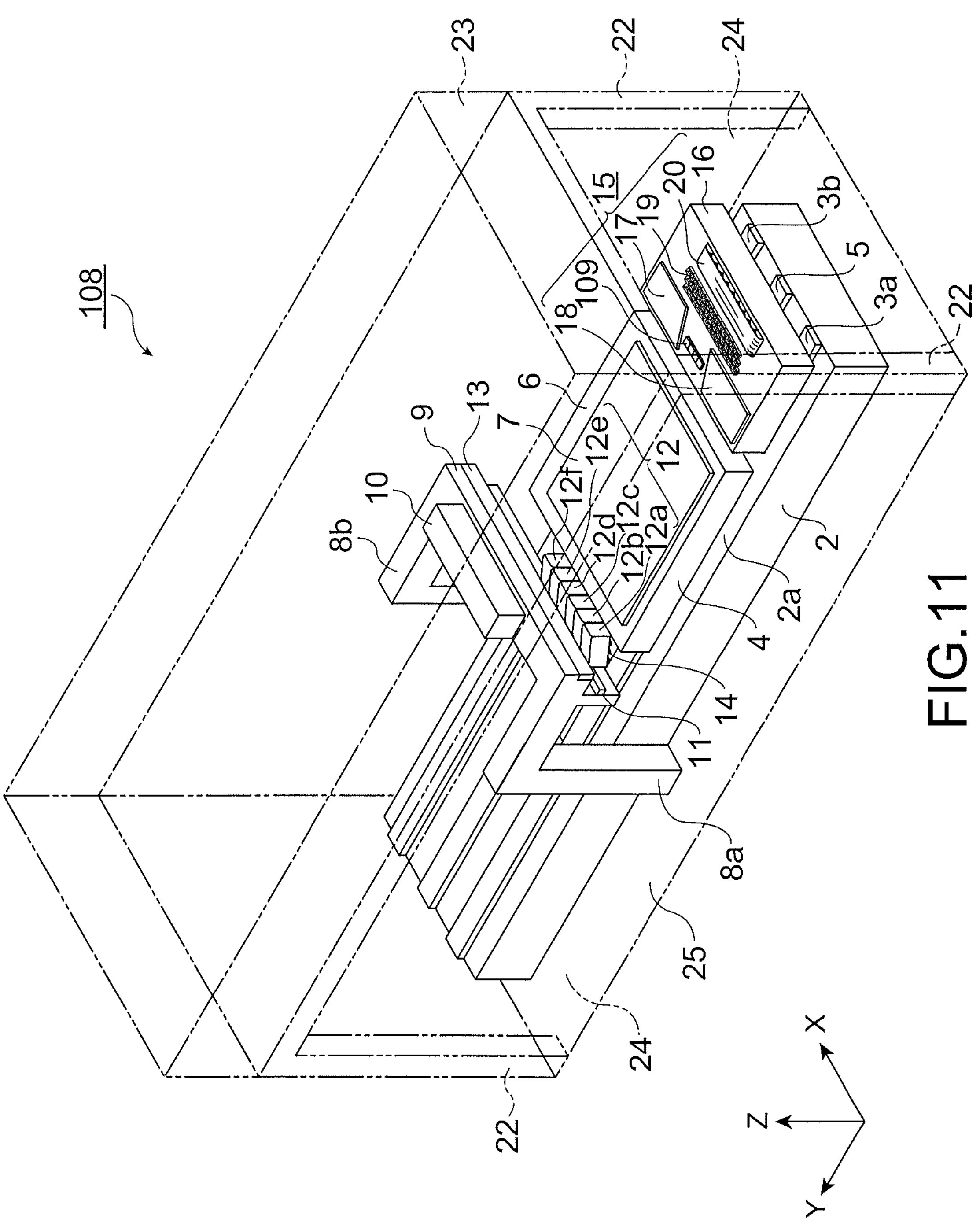
FIG. 11 is a schematic perspective view showing a configuration of a droplet ejection device according to a seventh embodiment of the invention.
Figure 12:
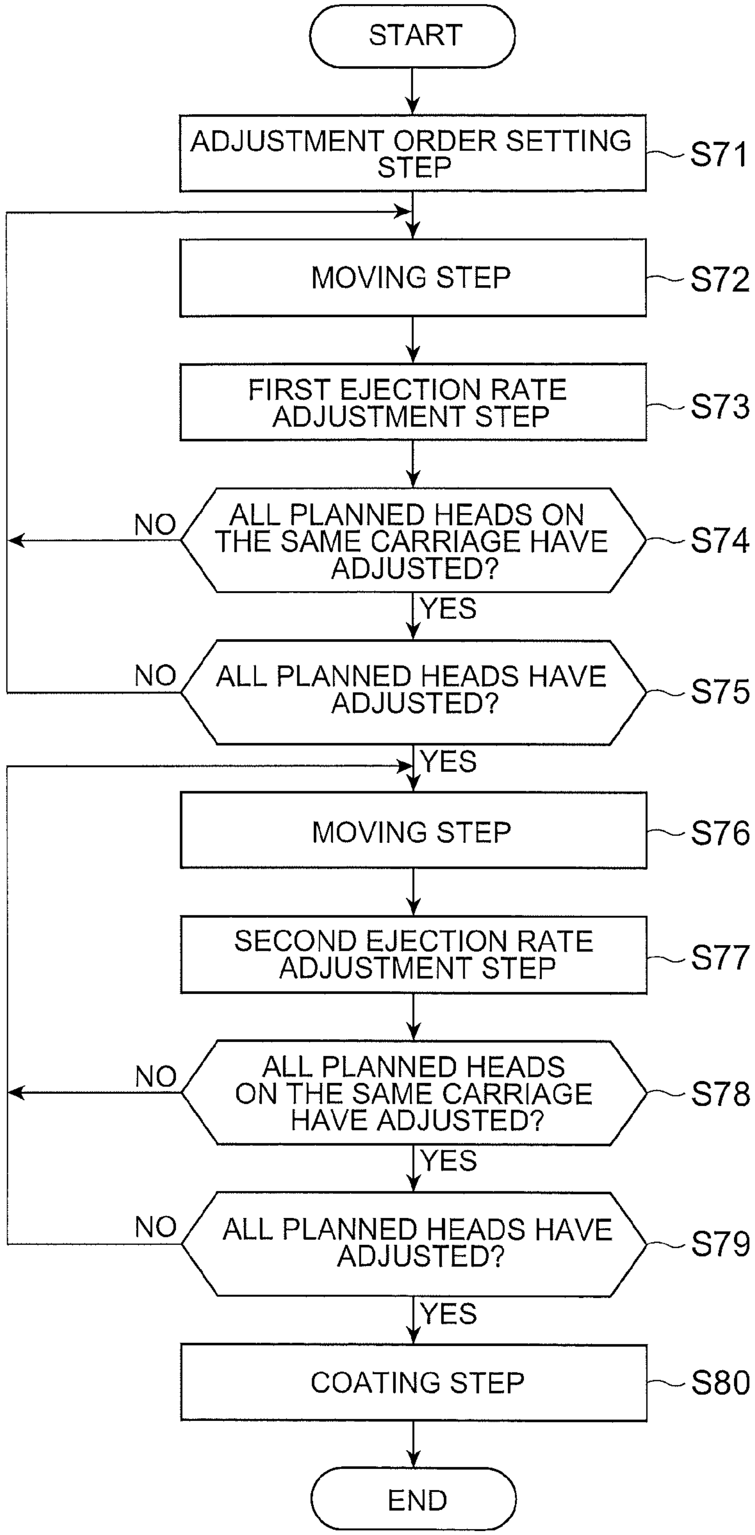
FIG. 12 is a flowchart showing a manufacturing process for coating a substrate by ejecting droplets.

In the present embodiment, an embodiment of a distinctive adjustment method of adjusting the ejection rate of the droplet ejection device will be explained with reference to FIGS. 5A, 5B, 11, and 12. FIG. 11 is a schematic perspective view showing a configuration of the droplet ejection device, and FIG. 12 is a flowchart showing a manufacturing process of coating the substrate by ejecting droplets. The present embodiment is different from the second embodiment in that in the case in which the number of rows in the arrangement of the droplet ejection heads is larger than that of the weighing device, the ejection rate of the droplet ejection heads in the same carriage is measured, and then the ejection rate of the droplet ejection heads in another carriage is measured.

Specifically, as shown in FIG. 11, the droplet ejection device 108 has four weighing devices 109 arranged in a row in the X direction. Further, as shown in FIGS. 5A and 5B, in the first carriage 12*a* through the sixth carriage 12*f*, the droplet ejection heads 14 are arranged in three rows of a first head row 110, a second row 111, and the third head row 112. In other words, in the case in which the number of rows of the droplet ejection heads 14 mounted on the carriage 12 is larger than the number of rows of the droplet ejection heads 14 the weighing devices 109 can measure at the same time, the adjustment procedure will be explained.

In the flowchart shown in FIG. 12, step S71 corresponds to an adjustment order setting step, which is the step of setting the order of the droplet ejection head for adjusting the ejection rate. Then, the process proceeds to step S72. The step S72 corresponds to a moving step, which is a step of moving the carriage to move the droplet ejection head to be measured to the position opposed to the weighing devices. Then, the process proceeds to step S73. The step S73 corresponds to the first ejection rate adjustment step, which is a step of ejecting the functional liquid from the droplet ejection heads in one row to measure the ejection rate, and adjusting the ejection rate. Then, the process proceeds to step S74.

The step S74 corresponds to a step of judging whether or not all of the heads planned to be adjusted in the same carriage has already been adjusted, in which whether or not the ejection rate in the droplet ejection heads in all of the three rows has been adjusted is judged. If there is a row not yet adjusted (NO), the process proceeds to step S72. If the ejection rate in the droplet ejection heads in all of the three rows has been adjusted (YES) in the step S74, the process proceeds to step S75. The step S75 corresponds to a step of judging whether or not all of the heads planned to be adjusted have been adjusted, in which whether or not all of the droplet ejection heads set to be adjusted in the step S71 have been adjusted is judged. If the droplet ejection head not yet adjusted in the ejection rate is included in the droplet ejection heads planned to be adjusted (NO), the process proceeds to the step S72. If all of the droplet ejection heads planned to be adjusted have been adjusted in the ejection rate (YES) in the step S75, the process proceeds to step S76.

The step S76 corresponds to a moving step, which is a step of moving the carriage to move the droplet ejection head to be measured to the position opposed to the weighing devices. Then, the process proceeds to step S77. The step S77 corresponds to the second ejection rate adjustment step, which is a step of ejecting the functional liquid from the droplet ejection heads in one row to measure the ejection rate after setting a different head row from one in the step S73, and adjusting the ejection rate. Then, the process proceeds to step S78. The step S78 corresponds to a step of judging whether or not all of the heads planned to be adjusted in the same carriage has already been adjusted, in which whether or not the ejection rate in the droplet ejection heads in all of the three rows has been adjusted is judged. If there is a row not yet adjusted (NO), the process proceeds to the step S76. If the ejection rate in the droplet ejection heads in all of the three rows has been adjusted (YES) in the step S78, the process proceeds to step S79. The step S79 corresponds to a step of judging whether or not all of the heads planned to be adjusted have been adjusted, in which whether or not all of the droplet ejection heads set to be adjusted in the step S71 have been adjusted is judged. If the droplet ejection head not yet adjusted in the ejection rate is included in the droplet ejection heads planned to be adjusted (NO), the process proceeds to the step S76. If all of the droplet ejection heads planned to be adjusted have been adjusted in the ejection rate (YES) in the step S79, the process proceeds to step S80. The step S80 corresponds to a coating step, which is a step of coating the substrate by ejecting the droplet. As described herein above, the manufacturing process for coating the substrate by ejecting the functional liquid is terminated.

Hereinafter, a manufacturing method of coating a work with a droplet ejected by the droplet ejection head adjusted in the ejection rate with high accuracy will be explained in detail with reference to FIGS. 5A and 5B in conjunction with the steps shown in FIG. 12. The step S71 is the same as the step S1 shown in FIG. 4, and therefore the explanations therefor will be omitted. In the step S72, the droplet ejection heads 14 in the first head row 110 of the first group 83 is moved to the position opposed to the weighing devices 109. After then, in the step S73, the ejection rate of the functional liquid 41 ejected from the droplet ejection heads 14 in the first head row 110 of the first group 83 is adjusted. Further, in the steps S74 and S72, the second head row 111 of the first group 83 is moved to the position opposed to the weighing devices 109. After then, in the step S73, the ejection rate of the functional liquid 41 ejected from the droplet ejection heads 14 in the second head row 111 of the first group 83 is adjusted. Passing through the same steps, the ejection rate of the functional liquid 41 ejected from the droplet ejection heads 14 in the third head row 112 of the first group 83 is adjusted.

Then, in the steps S75 and S72, the first head row 110 of the second group 84 is moved to the position opposed to the weighing devices 109. After then, in the step S73, the ejection rate of the functional liquid 41 ejected from the droplet ejection heads 14 in the first head row 110 of the second group 84 is adjusted. Then, by repeating the steps S72 through S74, the ejection rate of the functional liquid 41 ejected from the droplet ejection heads 14 in the second head row 111 and the third head row 112 of the second group 84 is adjusted. Subsequently, passing through the same steps, the ejection rate of the functional liquid 41 ejected from the droplet ejection heads 14 in the first head row 110 through the third head row 112 of the third group 85 is adjusted.

Then, in the step S76, the first head row 110 of the fourth group 86 is moved to the position opposed to the weighing devices 109. After then, in the step S77, the ejection rate of the functional liquid 41 ejected from the droplet ejection heads 14 in the first head row 110 of the fourth group 86 is adjusted. On this occasion, the ejection rate in the droplet ejection heads 14 in the fourth head column 74 and the fifth head column 75 is adjusted. Then, by repeating the steps S76 through S78, the ejection rate of the functional liquid 41 ejected from the droplet ejection heads 14 in the second head row 111 and the third head row 112 of the fourth group 86 is adjusted. Subsequently, passing through the same steps, the ejection rate of the functional liquid 41 ejected from the droplet ejection heads 14 in the first head row 110 through the third head row 112 of the fifth group 87 is adjusted.

Further, after the adjustment is performed, in the step S80, by ejecting the droplets 44 in accordance with a predetermined drawing pattern, the droplets 44 are applied on the substrate 7. The step S80 is terminated after applying the planned drawing pattern, and then the manufacturing process of ejecting the droplets to the substrate 7 to apply them thereon is terminated.

As described above, according to the present embodiment, in addition to the first through fifth advantages in the first embodiment, there is obtained the following advantage.

According to the present embodiment, the ejection rate in all of the droplet ejection heads 14 mounted on one of the carriages 12 is measured, then the carriages 12 are switched sequentially to measure and adjust the ejection rate in the droplet ejection heads 14 mounted on each of the carriages 12. Therefore, the measurement and the adjustment can be performed with reduced amount of movement of carriages 12. As a result, resource-saving adjustment method and adjustment method can be obtained.

Eighth Embodiment

Figure 13:
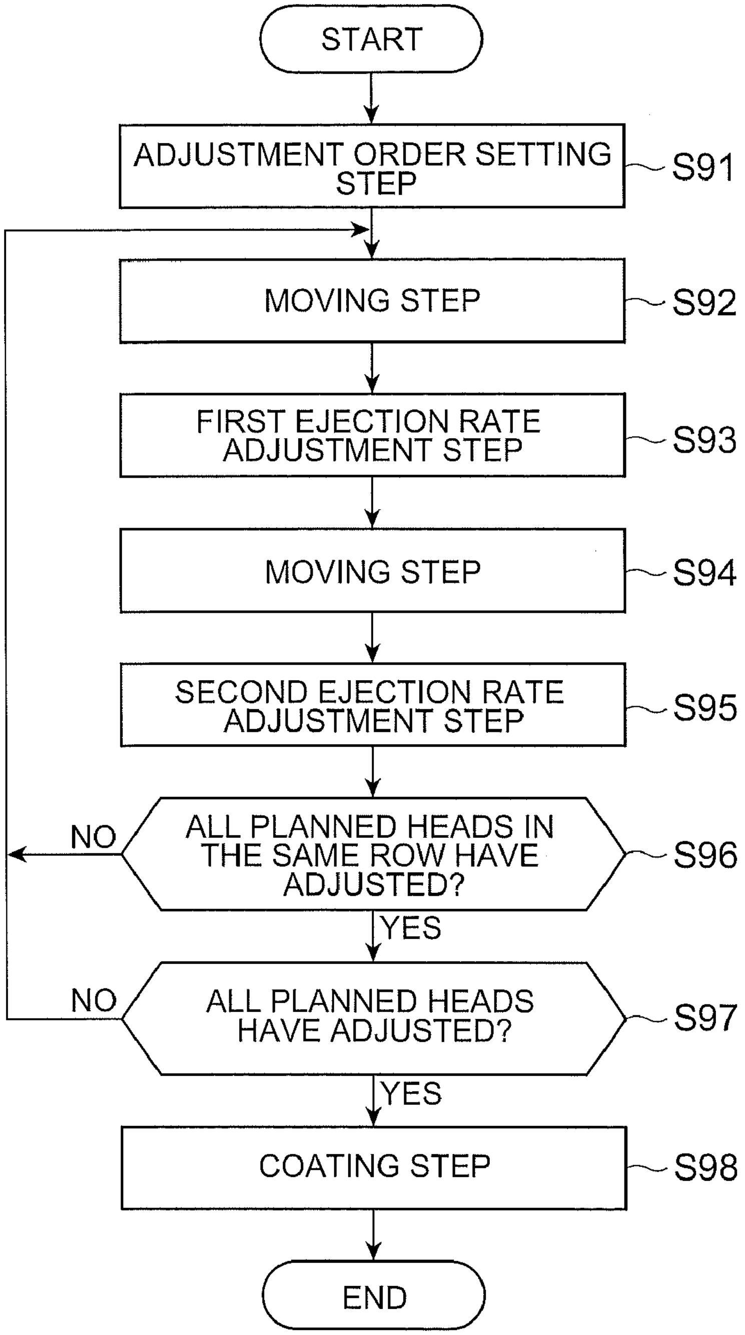
FIG. 13 is a flowchart showing a manufacturing process for coating a substrate by ejecting droplets according to an eighth embodiment of the invention.

In the present embodiment, an embodiment of a distinctive adjustment method of adjusting the ejection rate of the droplet ejection device will be explained with reference to FIGS. 5A, 5B, and 13. FIG. 13 is a flowchart showing a manufacturing process for coating the substrate by ejecting the droplets. The present embodiment is different from the seventh in that the adjustment is performed every row of the droplet ejection head groups.

In the flowchart shown in FIG. 13, step S91 corresponds to an adjustment order setting step, which is the step of setting the order of the droplet ejection head for adjusting the ejection rate. Then, the process proceeds to step S92. The step S92 corresponds to a moving step, which is a step of moving the carriage to move the droplet ejection head to be measured to the position opposed to the weighing devices. Then, the process proceeds to step S93. The step S93 corresponds to the first ejection rate adjustment step, which is a step of ejecting the functional liquid from the droplet ejection heads in one row to measure the ejection rate, and adjusting the ejection rate. Then, the process proceeds to step S94. The step S94 corresponds to a moving step, which is a step of moving the carriage to move the droplet ejection head to be measured to the position opposed to the weighing devices. Then, the process proceeds to step S95. The step S95 corresponds to the second ejection rate adjustment step, which is a step of ejecting the functional liquid from the droplet ejection heads in one row to measure the ejection rate after setting a different head row from one in the step S93, and adjusting the ejection rate. Then, the process proceeds to step S96.

The step S96 corresponds to a step of judging whether or not all of the heads planned to be adjusted in the same row has already been adjusted, in which whether or not the ejection rate in the droplet ejection heads in all of the twelve columns has been adjusted is judged. If there is a column not yet adjusted (NO), the process proceeds to the step S92. If the ejection rate in the droplet ejection heads in all of the twelve columns has been adjusted (YES) in the step S96, the process proceeds to step S97. The step S97 corresponds to a step of judging whether or not all of the heads planned to be adjusted have been adjusted, in which whether or not the droplet ejection heads of all of the columns set to be adjusted in the step S91 have been adjusted is judged. If the droplet ejection head not yet adjusted in the ejection rate is included in the droplet ejection heads planned to be adjusted (NO), the process proceeds to the step S92. If all of the droplet ejection heads planned to be adjusted have been adjusted in the ejection rate (YES) in the step S97, the process proceeds to step S98. The step S98 corresponds to a coating step, which is a step of coating the substrate by ejecting the droplet. As described herein above, the manufacturing process for coating the substrate by ejecting the functional liquid is terminated.

Hereinafter, a manufacturing method of coating a work with a droplet ejected by the droplet ejection head adjusted in the ejection rate with high accuracy will be explained in detail with reference to FIGS. 5A and 5B in conjunction with the steps shown in FIG. 13. The step S91 is the same as the step S1 shown in FIG. 4, and therefore the explanations therefor will be omitted. In the step S92, the first head row 110 of the first group 83 is moved to the position opposed to the weighing devices 109. Then, in the step S93, the ejection rate of the functional liquid 41 ejected from the droplet ejection heads 14 in the first head row 110 of the first group 83 is adjusted. Then, in the step S94, the first head row 110 of the fourth group 86 is moved to the position opposed to the weighing devices 109. After then, in the step S95, the ejection rate of the functional liquid 41 ejected from the droplet ejection heads 14 in the first head row 110 of the fourth group 86 is adjusted. On this occasion, the ejection rate in the droplet ejection heads 14 in the fourth head column 74 and the fifth head column 75 is adjusted.

Then, in the steps S96 and S92, the first head row 110 of the second group 84 is moved to the position opposed to the weighing devices 109. After then, in the steps S93 through S95, the ejection rate of the functional liquid 41 ejected from the droplet ejection heads 14 in the first head row 110 of the second group 84 and the fifth group 87 is adjusted.

Then, in the steps S96 and S92, the first head row 110 of the third group 85 is moved to the position opposed to the weighing devices 109. Then, in the step S93, the ejection rate of the functional liquid 41 ejected from the droplet ejection heads 14 in the first head row 110 of the third group 85 is adjusted. After then, in the steps S94 and S95, since there is no droplet ejection head 14 to be adjusted, these steps are skipped, and the process proceeds to the step S97. By executing the steps described herein above, the ejection rate of the functional liquid 41 ejected from the droplet ejection heads 14 in the first head row 110 in the first head column 71 through the twelfth head column 82 can be adjusted.

Subsequently, in the step S97, it is confirmed that the adjustment of all the droplet ejection heads 14 in the first head row 110 has been performed, and then transition to the adjustment of the droplet ejection head 14 in the second head row 111 is judged. Then, in the step S92, the droplet ejection heads 14 in the second head row 111 of the first group 83 is moved to the position opposed to the weighing devices 109. After then, by repeating the steps S92 through S97, the adjustment of the droplet ejection heads 14 in the second head row 111 is performed. On this occasion, the adjustment of the droplet ejection heads 14 is performed in the following order: the first group 83, the fourth group 86, the second group 84, the fifth group 87, and the third group 85. Subsequently, transition to the third head row 112 is made, and the adjustment of the ejection rate of the functional liquid 41 ejected from the droplet ejection heads 14 is performed in the same order.

Further, after the adjustment is performed, in the step S98, by ejecting the droplets 44 in accordance with a predetermined drawing pattern, the droplets 44 are applied on the substrate 7. The step S98 is terminated after applying the planned drawing pattern, and then the manufacturing process of ejecting the droplets to the substrate 7 to apply them thereon is terminated.

As described above, according to the present embodiment, in addition to the first through fifth advantages in the first embodiment, there is obtained the following advantages.

According to the present embodiment, the ejection rate of one of the droplet ejection heads 14 is adjusted, after then the ejection rate of the droplet ejection head adjacent to the adjusted droplet ejection head 14 is adjusted. Therefore, even in the case in which there is a variation in the ambient temperature, the droplet ejection heads 14 in the same row and close to each other can be adjusted in the ejection rate with errors caused by the influence of substantially the same temperature.

According to the present embodiment, since the droplet ejection heads 14 in the same row and adjacent to each other can be adjusted in the ejection rate with errors caused by the influence of substantially the same temperature, these droplet ejection heads can be adjusted to have substantially the same ejection rate. As a result, coating can be performed without forming a vertical line in the scan direction (the Y direction in FIG. 5) of the droplet ejection head 14.

Ninth Embodiment

Figure 14:
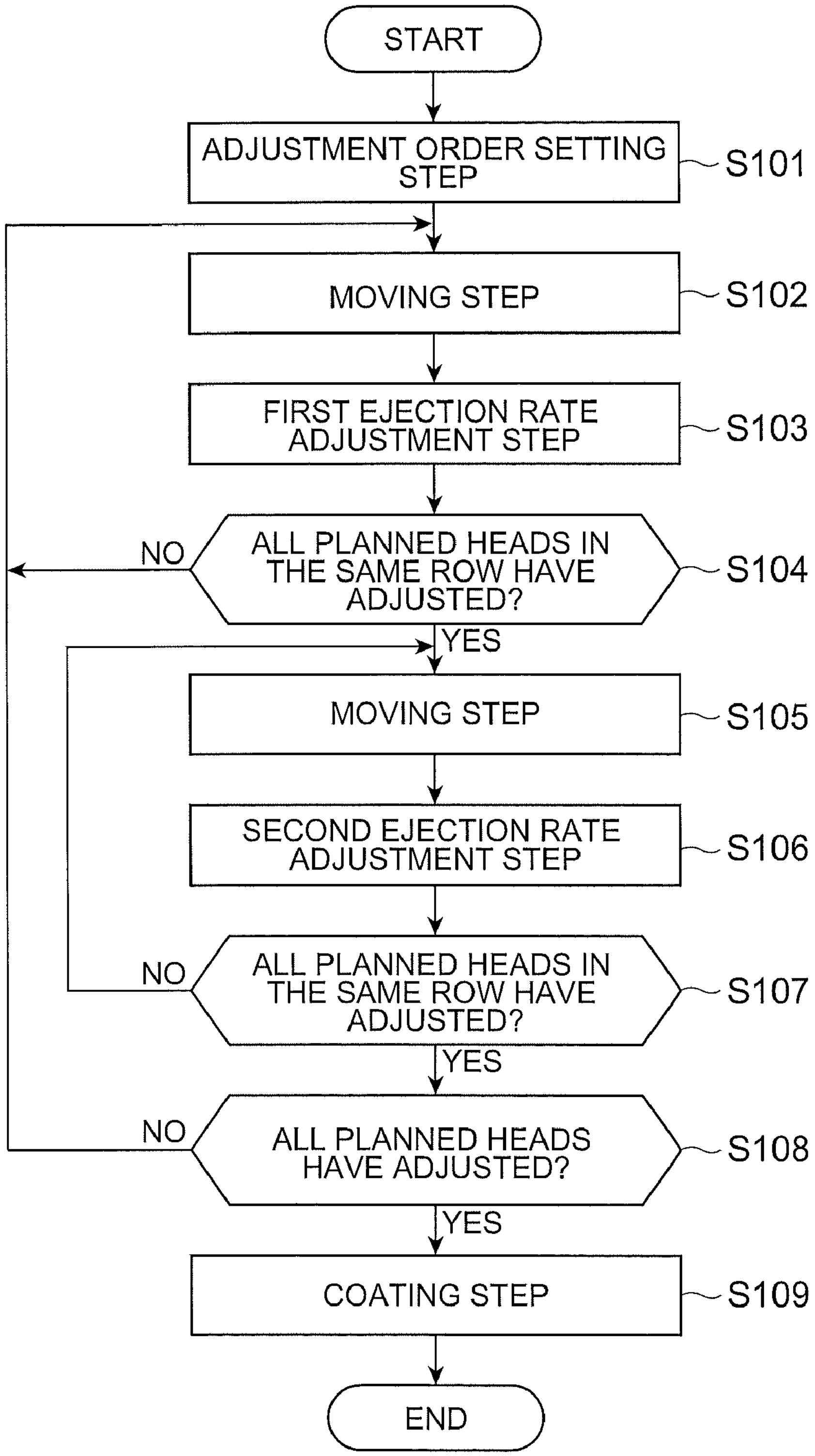
FIG. 14 is a flowchart showing a manufacturing process for coating a substrate by ejecting droplets according to a ninth embodiment of the invention.

In the present embodiment, an embodiment of a distinctive adjustment method of adjusting the ejection rate of the droplet ejection device will be explained with reference to FIGS. 5A, 5B, and 14. FIG. 14 is a flowchart showing a manufacturing process for coating the substrate by ejecting the droplets. The present embodiment is different from the eighth embodiment in that the first ejection rate adjustment step is executed on all of the droplet ejection heads in the same row, and then the second ejection rate adjustment step is executed thereon, thus the adjustment is performed every row of the droplet ejection head group.

In the flowchart shown in FIG. 14, step S101 corresponds to an adjustment order setting step, which is the step of setting the order of the droplet ejection head for adjusting the ejection rate. Then, the process proceeds to step S102. The step S102 corresponds to a moving step, which is a step of moving the carriage to move the droplet ejection head to be measured to the position opposed to the weighing devices. Then, the process proceeds to step S103. The step S103 corresponds to the first ejection rate adjustment step, which is a step of ejecting the functional liquid from the droplet ejection heads in one row to measure the ejection rate, and adjusting the ejection rate. Then, the process proceeds to step S104. The step S104 corresponds to a step of judging whether or not all of the heads planned to be adjusted in the same row has already been adjusted, in which whether or not the ejection rate in all of the droplet ejection heads in the first, second, and third groups has been adjusted is judged. If there are any of the droplet ejection head groups not yet adjusted (NO), the process proceeds to the step S102. If the ejection rate in all of the droplet ejection heads in the first, second, and third groups has been adjusted (YES) in the step S104, the process proceeds to step S105. The step S105 corresponds to a moving step, which is a step of moving the carriage to move the droplet ejection head to be measured to the position opposed to the weighing devices. Then, the process proceeds to step S106. The step S106 corresponds to the second ejection rate adjustment step, in which the ejection rate in all of the droplet ejection heads of the fourth and fifth groups is adjusted. Then, the process proceeds to step S107.

The step S107 corresponds to a step of judging whether or not all of the heads planned to be adjusted in the same row has already been adjusted, in which whether or not the ejection rate in all of the droplet ejection heads in the fourth and fifth groups, and in the same row, has been adjusted is judged. If there are any of the droplet ejection head groups not yet adjusted (NO), the process proceeds to the step S105. If the ejection rate in all of the droplet ejection heads in the fourth and fifth groups has been adjusted (YES) in the step S107, the process proceeds to step S108. The step S108 corresponds to a step of judging whether or not all of the heads planned to be adjusted have been adjusted, in which whether or not the droplet ejection heads of all of the columns set to be adjusted in the step S101 have been adjusted is judged. If the droplet ejection head not yet adjusted in the amount of ejection is included in the droplet ejection heads planned to be adjusted (NO), the process proceeds to the step S102. If all of the droplet ejection heads planned to be adjusted have been adjusted in the ejection rate (YES) in the step S108, the process proceeds to step S109. The step S109 corresponds to a coating step, which is a step of coating the substrate by ejecting the droplet. As described herein above, the manufacturing process for coating the substrate by ejecting the functional liquid is terminated.

Hereinafter, a manufacturing method of coating a work with a droplet ejected by the droplet ejection head adjusted in the ejection rate with high accuracy will be explained in detail with reference to FIGS. 5A and 5B in conjunction with the steps shown in FIG. 14. The step S101 is the same as the step S1 shown in FIG. 4, and therefore the explanations therefor will be omitted. In the step S102, the first head row 110 of the first group 83 is moved to the position opposed to the weighing devices 109. Then, in the step S103, the ejection rate of the functional liquid 41 ejected from the droplet ejection heads 14 in the first head row 110 of the first group 83 is adjusted.

Then, in the step S104, the second group 84 is set as the droplet ejection head group to be subsequently adjusted. Then, in the step S102, the first head row 110 of the second group 84 is moved to the position opposed to the weighing devices 109. After then, in the step S103, the ejection rate of the functional liquid 41 ejected from the droplet ejection heads 14 in the first head row 110 of the second group 84 is adjusted. Then, in the step S104, the third group 85 is set as the droplet ejection head group to be subsequently adjusted. After then, in the steps S102 and S103, the ejection rate of the functional liquid 41 ejected from the droplet ejection heads 14 in the first head row 110 of the third group 85 is adjusted. In the subsequent step, the step S104, it is confirmed that the adjustment of the first head row 110 of the first, second, and third groups 83, 84, and 85 has been completed.

Then, in the step S105, the first head row 110 of the fourth group 86 is moved to the position opposed to the weighing devices 109. After then, in the step S106, the ejection rate of the functional liquid 41 ejected from the droplet ejection heads 14 in the first head row 110 of the fourth group 86 is adjusted. Then, in the step S107, the fifth group 87 is set as the droplet ejection head group to be subsequently adjusted. In the step S105, the first head row 110 of the fifth group 87 is moved to the position opposed to the weighing devices 109. After then, in the step S106, the ejection rate of the functional liquid 41 ejected from the droplet ejection heads 14 in the first head row 110 of the fifth group 87 is adjusted. Then, in the step S107, it is confirmed that the adjustment of the fourth and fifth groups 86, 87 has been completed.

Subsequently, in the step S108, it is confirmed that the adjustment of all the droplet ejection heads 14 in the first head row 110 has been performed, and then transition to the adjustment of the droplet ejection head 14 in the second head row 111 is judged. Then, by repeating the steps S102 through S108, the adjustment of the droplet ejection heads 14 in the second head row 111 is performed. On this occasion, the adjustment of the droplet ejection heads 14 is performed in the following order: the first group 83, the second group 84, the third group 85, the fourth group 86, and the fifth group 87. Subsequently, transition to the third head row 112 is made, and the adjustment of the ejection rate of the functional liquid 41 ejected from the droplet ejection heads 14 is performed in the same order.

Further, after the adjustment is performed, in the step S109, by ejecting the droplets 44 in accordance with a predetermined drawing pattern, the droplets 44 are applied on the substrate 7. The step S109 is terminated after applying the planned drawing pattern, and then the manufacturing process of ejecting the droplets to the substrate 7 to apply them thereon is terminated.

As described above, according to the present embodiment, in addition to the first through fifth advantages in the first embodiment, there is obtained the following advantages.

According to the present embodiment, in the droplet ejection heads 14 belonging to the same row, the ejection rate in the droplet ejection head 14 positioned close to each other is measured, and then the measurement is performed while sequentially changing the row. When measuring the ejection rate of the droplet ejection head 14, the droplet ejection head 14 is measured in the environment with controlled temperature. On this occasion, in most cases, the temperature varies with a long period. In this case, the adjustment of the ejection rate of the droplet ejection head located in the same row as a certain droplet ejection head and close to the certain droplet ejection head is subsequently performed. Therefore, the droplet ejection heads 14 in the same row and close to each other can be adjusted in the ejection rate with errors caused by the influence of substantially the same temperature.

According to the present embodiment, since the droplet ejection heads 14 in the same row and close to each other can be adjusted in the ejection rate with errors caused by the influence of substantially the same temperature, these droplet ejection heads can be adjusted to have substantially the same ejection rate. As a result, coating can be performed without forming a vertical line in the scan direction of the droplet ejection head 14.

According to the present embodiment, when the ejection rate in the droplet ejection head 14 of the first group 83 is adjusted in the step S103, the carriage 12 to be subsequently adjusted is disposed along with the droplet ejection head 14 of the second group 84. Further, the fifth head column 75 through the eighth head column 78 to be subsequently measured stand ready along with each other in the same order as the order of measurement. On this occasion, the sixth head column 76 and the seventh head column 77 are kept sandwiched between the fifth head column 75 and the eighth head column 78 even in the standby state. Therefore, the sixth head column 76 and the seventh head column 77 can make the transition from the standby state to the adjustment step with a little temperature variation. As a result, the droplet ejection heads 14 can be adjusted in a condition with a little temperature variation, thus the adjustment with high accuracy can be performed.

Tenth Embodiment

Hereinafter, an embodiment of the case of manufacturing a liquid crystal display device using the ejection method described above will be explained with reference to FIG. 15.

Figure 15:
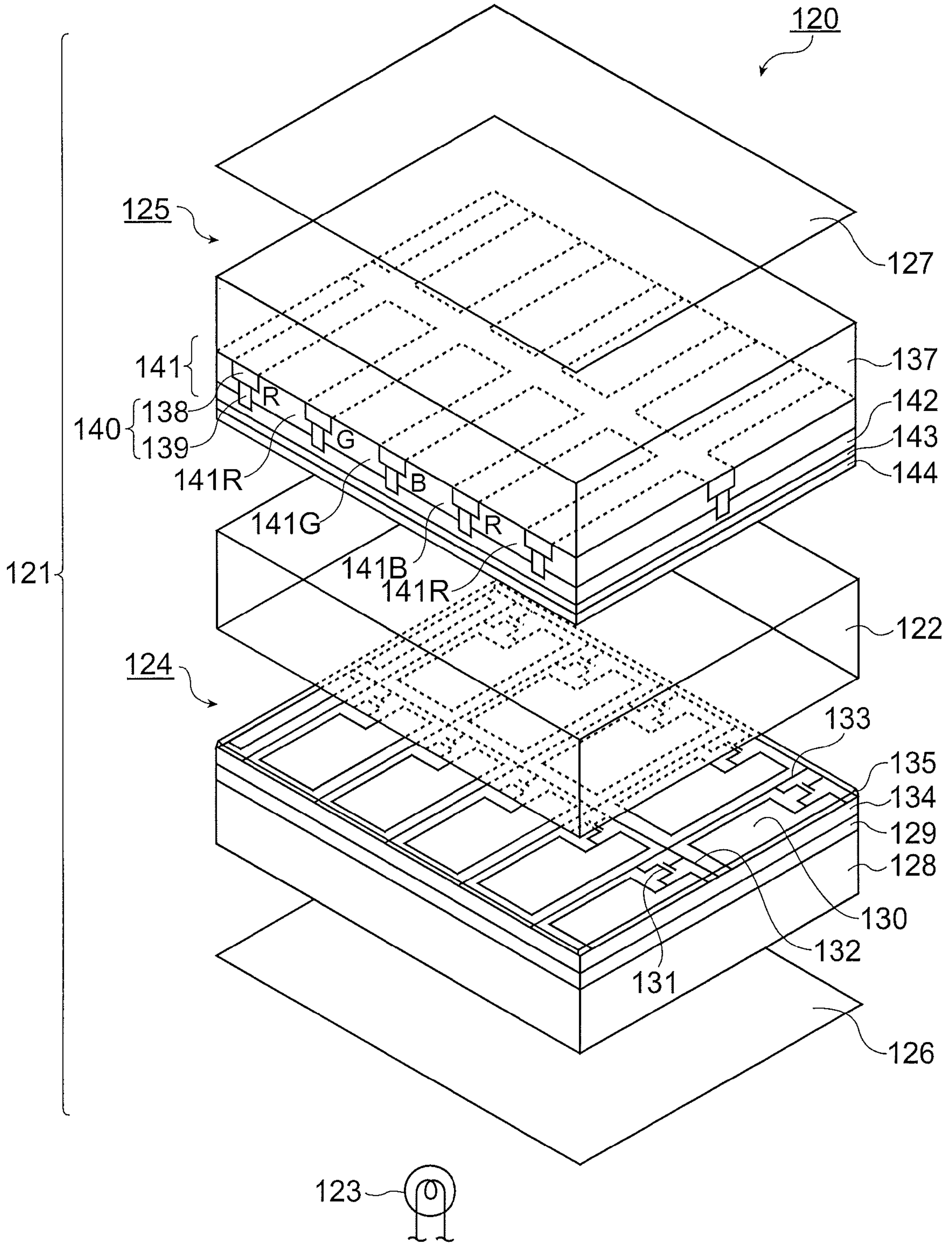
FIG. 15 is a schematic exploded perspective view showing a structure of a liquid crystal display device according to a tenth embodiment of the invention.

Firstly, a liquid crystal display device as one of the electro-optic devices equipped with a color filter will be explained. FIG. 15 is a schematic exploded perspective view showing a structure of a liquid crystal display device.

As shown in FIG. 15, the liquid crystal display device 120 is provided with a transmissive liquid crystal panel 121 and a lighting device 123 for lighting the liquid crystal display panel 121. The liquid crystal display panel 121 is disposed with liquid crystal 122 held between an element substrate 124 as a first substrate and an opposed substrate 125 as a second substrate. Further, a lower polarization plate 126 is disposed on the lower surface of the element substrate 124, and an upper polarization plate 127 is disposed on the upper surface of the opposed substrate 125.

The element substrate 124 is provided with a substrate 128 made of a material with optical transparency, and an insulating film 129 is formed on the upper side of the substrate 128. On the insulating film 129, there are formed pixel electrodes 130 as electrodes in a matrix, and each of the pixel electrodes 130 is provided with a thin film transistor (TFT) element 131 as a semiconductor device having a switching function. Further, the pixel electrode 130 is connected to the drain terminal of the TFT element 131.

There are formed scan lines 132 as wiring and data lines 133 as wiring to form a lattice surrounding each of the pixel electrodes 130 and the respective TFT elements 131. Further, the scan line 132 is connected to the gate terminal of the TFT element 131, and the data line 133 is connected to the source terminal of the TFT element 131.

Further, on the liquid crystal 122 side of the element layer 134 composed mainly of the pixel electrodes 130, the TFT elements 131, the scan lines 132, and the data lines 133, there is formed an oriented film 135.

The opposed substrate 125 is provided with a substrate 137 made of a material with optical transparency. On the lower side of the substrate 137, there is formed a lower layer bank 138 made of a material with a light blocking property to have a lattice shape, and on the lower side of the lower layer bank 138, there is formed an upper bank 139 made of an organic compound or the like. Further, a partition section 140 is composed of the lower bank 138 and the upper bank 139.

In the recess sections partitioned in a matrix by the partition section 140, there are formed red color filters 141R, green color filters 141G, and blue color filters 141B as colored layers 141, respectively. Further, an overcoat layer 142 as a planarization layer covering the partition section 140 and the color filters 141R, 141G, 141B is formed. An opposed electrode 143 as an electrode made of a transparent conductive film such as indium tin oxide (ITO) is formed so as to cover the overcoat layer 142. Further, on the liquid crystal 122 side of the opposed electrode 143, there is formed an oriented film 144. The oriented films 144, 135 are provided with groove shaped patterns formed to be aligned with each other, and the liquid crystal 122 is formed thereon so as to be aligned along the patterns.

The liquid crystal 122 has a property of changing the tilt angle thereof in response to the voltage applied between the pixel electrode 130 and the opposed electrode 143 sandwiching the liquid crystal 122. The voltage applied to the liquid crystal 122 is controlled by the switching operation of the TFT element 131, thus the tilt angle of the liquid crystal 122 is controlled, thereby performing the operation of transmitting and blocking the light. It should be noted that since no light is obviously input to the pixel the light to which is blocked by the liquid crystal 122, it appears black. As described above, a picture can be displayed by putting on and off the pixels by controlling the transmission of the light by pixel by making the liquid crystal 122 as a shutter by the switching operation of the TFT.

The pixel electrode 130 is electrically connected to the drain terminal of the TFT element 131, and by setting the TFT to be an on-state for a predetermined period of time, an image signal supplied from the data line 133 is supplied to each of the pixel electrodes 130 with a predetermined timing. The voltage level of the pixel signal with a predetermined level thus supplied to the pixel electrode 130 is held between the opposed electrode 143 of the opposed substrate 125 and the pixel electrode 130, and the amount of transmission of light of the liquid crystal 122 varies in accordance with the voltage level of the pixel signal.

The lighting device 123 is provided with a light source, and is provided with a light guide plate capable of emitting the light from the light source towards the liquid crystal display panel 121, a diffusing plate, a reflecting plate, and so on. As the light source, a white LED, EL, cold-cathode tube, and so on can be used, and in the present embodiment, the cold-cathode tube is adopted.

It should be noted that the lower and upper polarization plates 126, 127 can be what is combined with an optical functional film such as a retardation film used for the purpose of improving the view angle dependency. The liquid crystal panel 121 can be what has a thin film diode (TFD) element as an active element instead of the TFT element, or can be a passive liquid crystal display device in which the electrodes for forming the pixels intersect with each other.

In the step of forming the color filters 141R, 141G, 141B of the opposed substrate 125, the ejection method in the first through ninth embodiments is used. Specifically, the lower layer bank 138 and the upper layer bank 139 are formed on the substrate 137 to form the partition section 140. A method of forming the partition 140 is known to the public, and consequently, the explanations therefor will be omitted. Further, by dissolving or dispersing the materials of the color filters 141R, 141G, 141B in a solvent or dispersion medium, the color ink of each color is manufactured. Then, using the droplet ejection device 1 or the droplet ejection device 108, the color ink is ejected to the recess section surrounded by the partition section 140 to apply the color ink.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the color ink. After then, by heating to dry, and thus solidifying the color ink, the color filters 141R, 141G, 141B are formed.

Further, in the step of forming the opposed electrode 143 on the lower side of the overcoat layer 142 in the opposed substrate 125, the ejection method in the first through ninth embodiments is used. Specifically, by dissolving or dispersing the material of the opposed electrode 143 in the solvent or dispersion medium, the material liquid of the electrode film is manufactured. Then, using the droplet ejection device 1 or the droplet ejection device 108, the material liquid of the electrode film is ejected to the surface of the overcoat layer 142 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film thus applied, the opposed electrode 143 is formed.

Further, in the step of forming the oriented film 144 on the lower side of the opposed electrode 143 in the opposed substrate 125, the ejection method in the first through ninth embodiments is used. Specifically, by dissolving or dispersing the material of the oriented film 144 in the solvent or dispersion medium, the material liquid of the oriented film is manufactured. Then, using the droplet ejection device 1 or the droplet ejection device 108, the material liquid of the oriented film is ejected to the lower side of the opposed electrode 143 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the oriented film. After then, by heating to dry, and thus solidifying the material liquid of the oriented film, the oriented film 144 is formed.

Further, in the step of forming the wiring of the scan lines 132 and the data lines 133 on the element layer 134 of the element substrate 124, the ejection method in the first through ninth embodiments is used. Specifically, the bank is formed with an insulating film so as to form recess sections in the areas where the wiring is to be formed. Then, by dissolving or dispersing the material of the wiring in the solvent or dispersion medium, the material liquid of the wiring is manufactured. Then, using the droplet ejection device 1 or the droplet ejection device 108, the material liquid of the wiring is ejected to the recess sections formed in the bank to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the wiring. After then, by heating to dry, and thus solidifying the material liquid of the wiring, the scan lines 132 and the data lines 133 are formed.

Further, in the step of forming the TFT elements 131 in the element layer 134 in the element substrate 124, the ejection method in the first through ninth embodiments is used. Specifically, the bank is formed with an insulating film so as to form recess sections in the areas where the TFT elements 131 are to be formed. Then, by dissolving or dispersing the material of the TFT element such as silicon in the solvent or dispersion medium, the material liquid of the TFT element is manufactured. Then, using the droplet ejection device 1 or the droplet ejection device 108, the material liquid of the TFT element is ejected to the recess sections formed in the bank to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the TFT element. After then, the material liquid of the TFT element is heated to be dried, and then crystallized. After then, ion doping is executed thereon, and then an insulating film and terminals are formed, thus the TFT element 131 is formed.

Further, in the step of forming the pixel electrodes 130 on the surface of the element layer 134 in the element substrate 124, the ejection method in the first through ninth embodiments is used. Specifically, by dissolving or dispersing the material of the pixel electrode 130 in the solvent or dispersion medium, the material liquid of the electrode film is manufactured. Then, using the droplet ejection device 1 or the droplet ejection device 108, the material liquid of the electrode film is ejected to the surface of the element layer 134 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the pixel electrodes 130 are formed.

Further, in the step of forming the oriented film 135 on the surface of the element layer 134 in the element substrate 124, the ejection method in the first through ninth embodiments is used. Specifically, by dissolving or dispersing the material of the oriented film 135 in the solvent or dispersion medium, the material liquid of the oriented film is manufactured. Then, using the droplet ejection device 1 or the droplet ejection device 108, the material liquid of the oriented film is ejected to the upper side of the element layer 134 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the oriented film. After then, by heating to dry, and thus solidifying the material liquid of the oriented film, the oriented film 135 is formed.

Further, in the step of applying the liquid crystal 122 to the element substrate 124 for holding the liquid crystal 122 between the element substrate 124 and the opposed substrate 125, the ejection method in the first through ninth embodiments is used. Specifically, using the droplet ejection device 1 or the droplet ejection device 108, the material liquid of the liquid crystal is ejected to the upper side of the oriented film 135 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the liquid crystal.

As described above, according to the present embodiment, there are obtained the following advantages.

According to the present embodiment, by using the ejection method in the first through ninth embodiments in the step of manufacturing the color filters 141R, 141G, 141B, the coating is performed by ejecting the color ink with the accurate ejection rate. Therefore, the color filters 141R, 141G, 141B applied with the accurate amount of the color ink can be manufactured.

According to the present embodiment, by using the ejection method in the first through ninth embodiments in the step of manufacturing the oriented films 135, 144, the coating is performed by ejecting the material of the oriented film with the accurate ejection rate. Therefore, the oriented films 135, 144 applied with the accurate amount of the material of the oriented film can be manufactured.

According to the present embodiment, by using the ejection method in the first through ninth embodiments in the step of applying the liquid crystal, the coating is performed by ejecting the liquid crystal with the accurate ejection rate. Therefore, the liquid crystal display device 120 with the liquid crystal applied with an accurate amount of application can be manufactured.

According to the present embodiment, by using the ejection method in the first through ninth embodiments in the step of manufacturing the pixel electrodes 130 and the opposed electrode 143, the coating is performed by ejecting the electrode material with the accurate ejection rate. Therefore, the pixel electrodes 130 and the opposed electrode 143 with the electrode material applied with an accurate amount of application can be manufactured.

According to the present embodiment, by using the ejection method in the first through ninth embodiments in the step of manufacturing the scan lines 132 and the data lines 133, the coating is performed by ejecting the wiring material with the accurate ejection rate. Therefore, the scan lines 132 and the data lines 133 with the wiring material applied with an accurate amount of application can be manufactured.

According to the present embodiment, by using the ejection method in the first through ninth embodiments in the step of manufacturing the TFT elements 131, the coating is performed by ejecting the semiconductor material with the accurate ejection rate. Therefore, the TFT elements 131 with the semiconductor material applied with an accurate amount of application can be manufactured.

Eleventh Embodiment

Hereinafter, an embodiment of the case of manufacturing an organic LE device using the ejection method described above will be explained with reference to FIG. 16.

Figure 16:
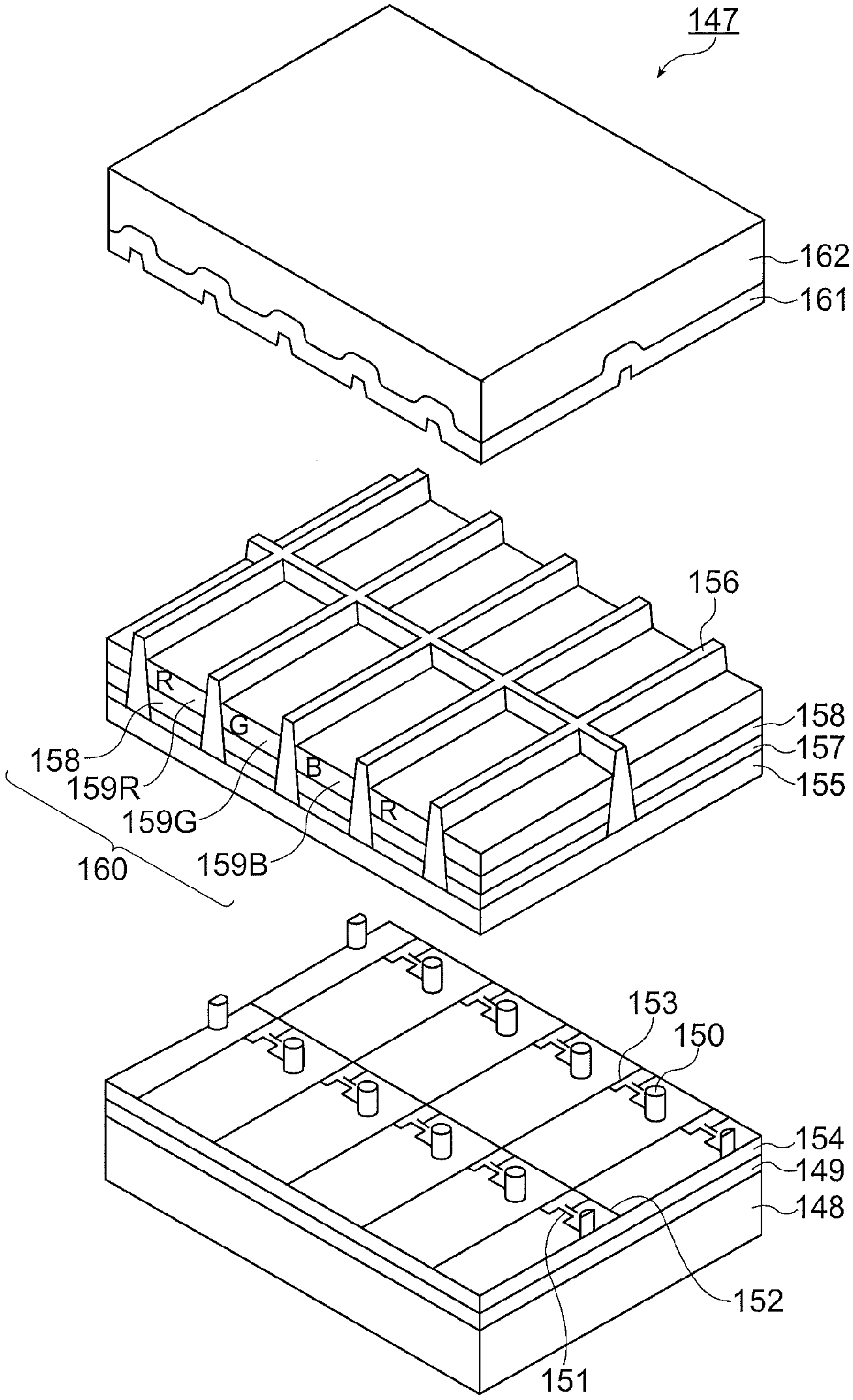
FIG. 16 is a schematic exploded perspective view showing a structure of an organic EL device according to an eleventh embodiment of the invention.

Firstly, the organic LE device as one of the electro-optic device will be explained. FIG. 16 is a schematic exploded perspective view showing a structure of an organic EL device.

As shown in FIG. 16, the organic EL device 147 as the electro-optic device is provided with a substrate 148. On the upper side of the substrate 148, there is formed an insulating film 149. On the insulating film 149, there are formed contact electrodes 150 in a matrix, and in an area adjacent to each of the contact electrodes 150, there is formed a TFT element 151 as a semiconductor device having a switching function. Further, the contact electrode 150 is connected to the drain terminal of the TFT element 151.

There are formed scan lines 152 as wiring and data lines 153 as wiring to form a lattice surrounding each of the contact electrodes 150 and the respective TFT elements 151. Further, the scan line 152 is connected to the gate terminal of the TFT element 151, and the data line 153 is connected to the source terminal of the TFT element 151.

Further, an element layer 154 mainly composed of the contact electrodes 150, the TFT elements 151, the scan lines 152, and the data lines 153 is formed. On the upper side of the element layer 154, there is formed an insulating film 155, and on the upper side of the insulating film 155, there is formed a bank 156 to have a lattice shape.

On the bottom of each of recess areas formed by the bank 156, there is formed a pixel electrode 157 as an electrode, and the pixel electrode 157 is electrically connected to the contact electrode 150. On the upper surface of the pixel electrode 157, there is formed a hole transport layer 158 as a light emitting element, and the upper surface of the hole transport layer 158, there are formed light emitting layers 159R, 159G, 159B, respectively, as the light emitting element. Further, a functional layer 160 is formed of the hole transport layer 158 and the light emitting layers 159R, 159G, 159B.

The light emitting layer 159R is a light emitting layer composed mainly of an organic light emitting material for emitting red light, and the light emitting layer 159G is a light emitting layer composed mainly of an organic light emitting material for emitting green light. Similarly, the light emitting layer 159B is a light emitting layer composed mainly of an organic light emitting material for emitting blue light.

Throughout the entire upper surfaces of the functional layer 160 and the bank 156, there is formed a cathode 161 as an electrode made of a conductive material having optical transparency. In the present embodiment, ITO, for example, is adopted as the cathode 161.

On the upper surface of the cathode 161, there is formed a sealing film 162, for preventing the cathode 161 and the functional layer 160 from being oxidized by oxygen.

When a voltage is applied between the pixel electrode 157 and the cathode 161, the hole transport layer 158 transports only electron holes. Further, the light emitting layers 159R, 159G, 159B have a property of emitting light by the energy generated by combining the electron hole supplied from the hole transport layer 158 and the electron supplied from the cathode 161 with each other. The TFT element 151 performs a switching operation to control the voltage applied to the functional layer 160, thereby controlling the intensity of the light emitted from the light emitting layers 159R, 159G, 159B. By thus controlling the intensity of the light emitted by the light emitting layers 159R, 159G, 159B, the light intensity is controlled for every pixel to put on and off the pixel, thereby making it possible to display a picture.

The pixel electrode 157 is electrically connected to the drain terminal of the TFT element 151, and by setting the TFT to be an on-state for a predetermined period of time, an image signal supplied from the data line 153 is supplied to each of the pixel electrodes 157 with a predetermined timing. The voltage level of the pixel signal having a predetermined level thus supplied to the pixel electrode 157 is held between the cathode 161 and the pixel electrode 157, and in accordance with the voltage level of the pixel signal, the intensity of the light emitted by the light emitting layers 159R, 159G, 159B is varied.

In the step of forming the wiring of the scan lines 152 and the data lines 153 on the element layer 154, the ejection method in the first through ninth embodiments is used. Specifically, the bank is formed with an insulating film so as to form recess sections in the areas where the wiring is to be formed. Then, by dissolving or dispersing the material of the wiring in the solvent or dispersion medium, the material liquid of the wiring is manufactured. Then, using the droplet ejection device 1 or the droplet ejection device 108, the material liquid of the wiring is ejected to the recess sections formed in the bank to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the wiring. After then, by heating to dry, and thus solidifying the material liquid of the wiring, the scan lines 152 and the data lines 153 are formed.

Further, in the step of forming the TFT elements 151 in the element layer 154, the ejection method in the first through ninth embodiments is used. Specifically, the bank is formed with an insulating film so as to form recess sections in the areas where the TFT elements 151 are to be formed. Then, by dissolving or dispersing the material of the TFT element such as silicon in the solvent or dispersion medium, the material liquid of the TFT element is manufactured. Then, using the droplet ejection device 1 or the droplet ejection device 108, the material liquid of the TFT element is ejected to the recess sections formed in the bank to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the TFT element. After then, the material liquid of the TFT element is heated to be dried, and then crystallized. After then, ion doping is executed thereon, and then an insulating film and terminals are formed, thus the TFT element 151 is formed.

Further, in the step of forming the pixel electrode 157 on the surface of the insulating film 155, the ejection method in the first through ninth embodiments is used. Specifically, by dissolving or dispersing the material of the pixel electrode 157 in the solvent or dispersion medium, the material liquid of the electrode film is manufactured. Then, using the droplet ejection device 1 or the droplet ejection device 108, the material liquid of the electrode film is ejected to the surface of the insulating film 155 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the pixel electrodes 157 are formed.

Further, in the step of forming the hole transport layer 158 on the surface of the pixel electrode 157, the ejection method in the first through ninth embodiments is used. Specifically, by dissolving or dispersing the material of the hole transport layer 158 as a light emitting element forming material in the solvent or dispersion medium, the material liquid of the hole transport layer is manufactured. Then, using the droplet ejection device 1 or the droplet ejection device 108, the material liquid of the hole transport layer is ejected to the surface of the pixel electrode 157 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the hole transport layer. After then, by heating to dry, and thus solidifying the material liquid of the hole transport layer, the hole transport layer 158 is formed.

Further, in the step of forming the light emitting layers 159R, 159G, 159B on the surface of the hole transport layer 158, the ejection method in the first through ninth embodiments is used. Specifically, by respectively dissolving or dispersing the materials of the light emitting layers 159R, 159G, 159B as light emitting element forming materials in the solvent or dispersion medium, the material liquids of the light emitting layers are manufactured. Then, using the droplet ejection device 1 or the droplet ejection device 108, the material liquids of the respective light emitting layers are ejected to the surface of the hole transport layer 158 to apply them thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquids of the respective light emitting layers. After then, by heating to dry, and thus solidifying the material liquids of the respective light emitting layers, the light emitting layers 159R, 159G, 159B are formed.

Further, in the step of forming the cathode 161 on the upper surfaces of the functional layer 160 and the bank 156, the ejection method in the first through ninth embodiments is used. Specifically, by dissolving or dispersing the material of the cathode 161 in the solvent or dispersion medium, the material liquid of the cathode is manufactured. Then, using the droplet ejection device 1 or the droplet ejection device 108, the material liquid of the cathode is ejected to the surfaces of the functional layer 160 and the bank 156 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the cathode. After then, by heating to dry, and thus solidifying the material liquid of the cathode, the cathode 161 is formed.

As described above, according to the present embodiment, there are obtained the following advantages.

According to the present embodiment, by using the ejection method in the first through ninth embodiments in the step of manufacturing the scan lines 152 and the data lines 153, the coating is performed by ejecting the wiring material with the accurate ejection rate. Therefore, the scan lines 152 and the data lines 153 with the wiring material applied with an accurate amount of application can be manufactured.

According to the present embodiment, by using the ejection method in the first through ninth embodiments in the step of manufacturing the TFT elements 151, the coating is performed by ejecting the semiconductor material with the accurate ejection rate. Therefore, the TFT elements 151 with the semiconductor material applied with an accurate amount of application can be manufactured.

According to the present embodiment, by using the ejection method in the first through ninth embodiments in the step of manufacturing the pixel electrodes 157 and the cathode 161, the coating is performed by ejecting the electrode material with the accurate ejection rate. Therefore, the pixel electrodes 157 and the cathode 161 with the electrode material applied with an accurate amount of application can be manufactured.

According to the present embodiment, by using the ejection method in the first through ninth embodiments in the step of manufacturing the functional layer 160, the coating is performed by ejecting the light emitting element forming material with the accurate ejection rate. Therefore, the functional layer 160 with the light emitting element forming material applied with an accurate amount of application can be manufactured.

Twelfth Embodiment

Hereinafter, an embodiment of the case of manufacturing a surface-conduction electron-emitter display device using the ejection method described above will be explained with reference to FIG. 17.

Figure 17:
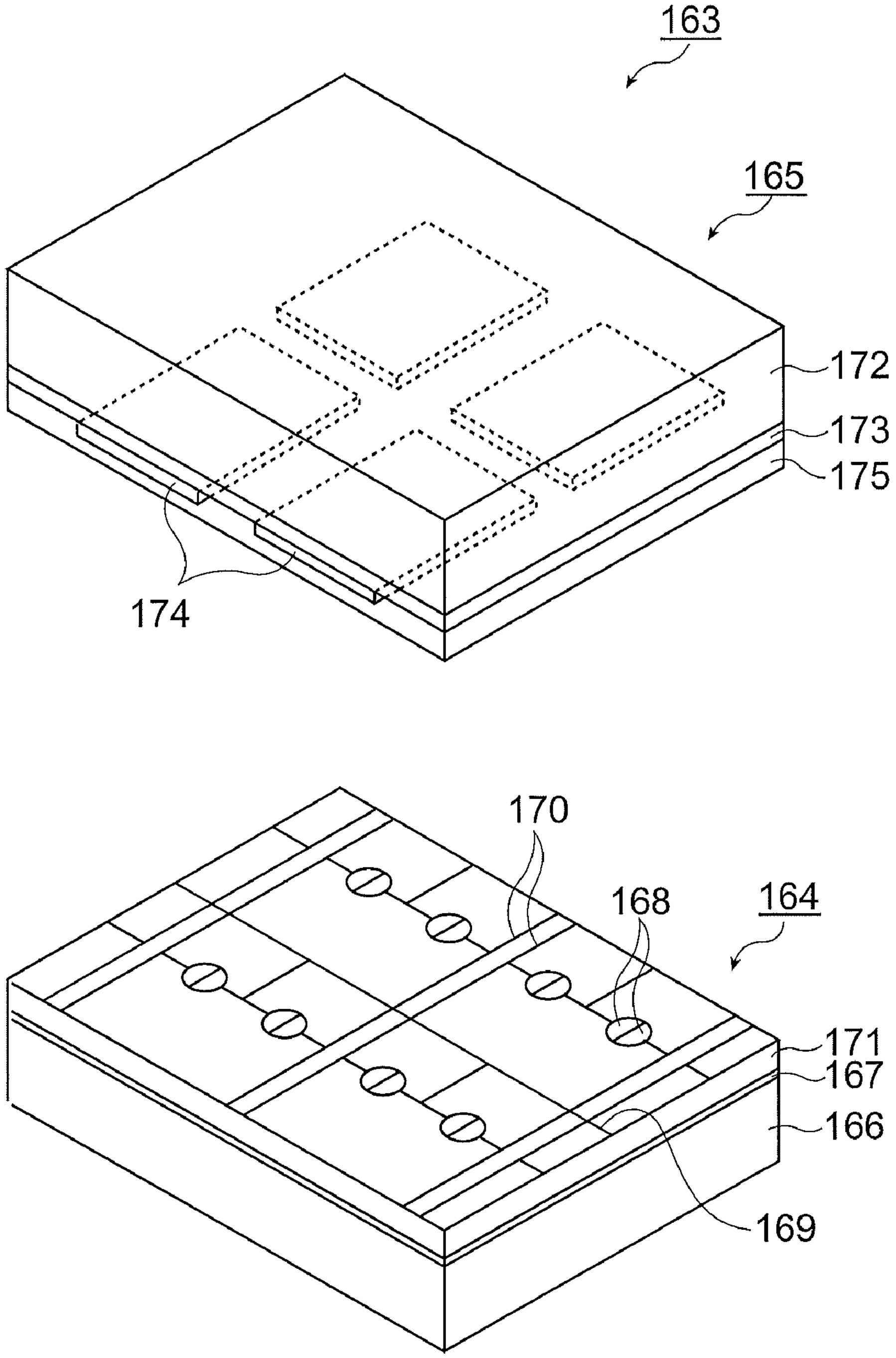
FIG. 17 is a schematic exploded perspective view showing a structure of a surface-conduction electron-emitter display device according to a twelfth embodiment of the invention.

Firstly, the surface-conduction electron-emitter display device as one of the electro-optic device will be explained. FIG. 17 is a schematic exploded perspective view showing a structure of the surface-conduction electron-emitter display device.

As shown in FIG. 17, the surface-conduction electron-emitter display device 163 as the electro-optic device is mainly composed of an element substrate 164 and an opposed substrate 165. Further, the element substrate 164 is provided with a substrate 166. On the upper side of the substrate 166, there is formed an insulating film 167. On the insulating film 167, there are formed electron-emitter elements 168 as electrodes forming pairs, each having a substantially circular shape, and arranged in a matrix, and further arranged so that either one of the pair operates when the other of the pair does not function. There are formed scan lines 169 as wiring and data lines 170 as wiring so as to form a lattice shape and surround each pair of the electron-emitter elements 168. The data lines 170 forms pairs thereof, and each pair thereof is disposed between the pairs of the electron-emitter elements 168.

The electron-emitter element 168 is divided into two parts by a line passing through the center thereof, and one of the parts of the electron-emitter element 168 is connected to the scan line 169. Further, the other parts of the electron-emitter element 168 is connected to the data line 170. An element layer 171 is mainly composed of the electron-emitter elements 168, the scan lines 169, and the data lines 170.

The opposed substrate 165 is provided with a substrate 172 made of a material with optical transparency. Further, on the lower side of the substrate 172, there is formed an anode 173 as an electrode made of a material with optical transparency. On the lower side of the anode 173, there are formed color fluorescent films 174 as light emitting elements, and a protective film 175 is formed so as to cover the color fluorescent films 174 and the anode 173.

The element substrate 164 and the opposed substrate 165 are bonded to each other via a spacer, not shown, and the space between the element substrate 164 and the opposed substrate 165 is evacuated to be in a substantially vacuum condition.

In the electron-emitter element 168 having the electrode divided into two parts, when applying a voltage between the two parts of the electrode, a very small amount of electron passes between the two parts of the electrode because the gap between the parts of the electrode is formed to be narrow. Then, when an electric field is formed by applying a voltage between the electron-emitter element 168 and the anode 173, electromagnetic force acts on the electron passing between the two parts of the electrode, and the electron moves to the anode 173.

A part of the electron moving towards the anode 173 collides against the color fluorescent film 174. Since the color fluorescent film 174 converts the energy caused by the collision of the electron into light, thus the light emission occurs. The surface-conduction electron-emitter display device 163 is provided with a data voltage drive circuit, not shown, and a scan voltage drive circuit, and the data voltage drive circuit and the scan voltage drive circuit control the voltage applied to the electron-emitter element 168. Since the voltage applied to the electron-emitter element 168 and the intensity of the light emitted by the color fluorescent film 174 are positively correlated, the data voltage drive circuit and the scan voltage drive circuit can control the intensity of the light emitted by the color fluorescent film 174.

Further, the data voltage drive circuit and the scan voltage drive circuit can display a picture by controlling the light intensity for every pixel to putting on and off the pixels. The color fluorescent film 174 has fluorescent films each emitting one of red, blue, and green light beams arranged thereon, and the data voltage drive circuit and the scan voltage drive circuit can display a color image by performing control while selecting the color to be emitted.

In the step of forming the wiring of the scan lines 169 and the data lines 171 on the element layer 170, the ejection method in the first through ninth embodiments is used. Specifically, the bank is formed with an insulating film so as to form recess sections in the areas where the wiring is to be formed. Then, by dissolving or dispersing the material of the wiring in the solvent or dispersion medium, the material liquid of the wiring is manufactured. Then, using the droplet ejection device 1 or the droplet ejection device 108, the material liquid of the wiring is ejected to the recess sections formed in the bank to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the wiring. After then, by heating to dry, and thus solidifying the material liquid of the wiring, the scan lines 169 and the data lines 170 are formed.

Further, in the step of forming the electron-emitter element 168 in the element layer 171, the ejection method in the first through ninth embodiments is used. Specifically, by dissolving or dispersing the material of the electrode in the electron-emitter element 168 in the solvent or dispersion medium, the material liquid of the electrode film is manufactured. Then, using the droplet ejection device 1 or the droplet ejection device 108, the material liquid of the electrode film is ejected to the surface of the insulating film 167 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the electrodes in the electron-emitter elements 168 are formed.

Further, in the step of forming the anode 173 on the surface of the substrate 172, the ejection method in the first through ninth embodiments is used. Specifically, by dissolving or dispersing the material of the electrode in the anode 173 in the solvent or dispersion medium, the material liquid of the electrode film is manufactured. Then, using the droplet ejection device 1 or the droplet ejection device 108, the material liquid of the electrode film is ejected to the surface of the substrate 172 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the anode 173 is formed.

Further, in the step of forming the color fluorescent film 174 on the surface of the anode 173, the ejection method in the first through ninth embodiments is used. Specifically, by dissolving or dispersing the materials of the color fluorescent film as a light emitting element forming material in the solvent or dispersion medium, the material liquids of the color fluorescent film are manufactured. Then, using the droplet ejection device 1 or the droplet ejection device 108, the material liquids of the color fluorescent film are ejected to the surface of the anode 173 to apply them thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquids of the color fluorescent film. After then, by heating to dry, and thus solidifying the material liquids of the color fluorescent film, the color fluorescent film 174 is formed.

As described above, according to the present embodiment, there are obtained the following advantages.

According to the present embodiment, by using the ejection method in the first through ninth embodiments in the step of manufacturing the scan lines 169 and the data lines 170, the coating is performed by ejecting the wiring material with the accurate ejection rate. Therefore, the scan lines 169 and the data lines 170 with the wiring material applied with an accurate amount of application can be manufactured.

According to the present embodiment, by using the ejection method in the first through ninth embodiments in the step of manufacturing the electron-emitter elements 168 and the anode 173, the coating is performed by ejecting the electrode material with the accurate ejection rate. Therefore, the electron-emitter elements 168 and the anode 173 with the electrode material applied with an accurate amount of application can be manufactured.

According to the present embodiment, by using the ejection method in the first through ninth embodiments in the step of manufacturing the color fluorescent film 174, the coating is performed by ejecting the color fluorescent film forming materials with the accurate ejection rate. Therefore, the color fluorescent film 174 with the color fluorescent film forming materials applied with an accurate amount of application can be manufactured.

Thirteenth Embodiment

Hereinafter, an embodiment of the case of manufacturing a plasma display device using the ejection method described above will be explained with reference to FIG. 18.

Figure 18:
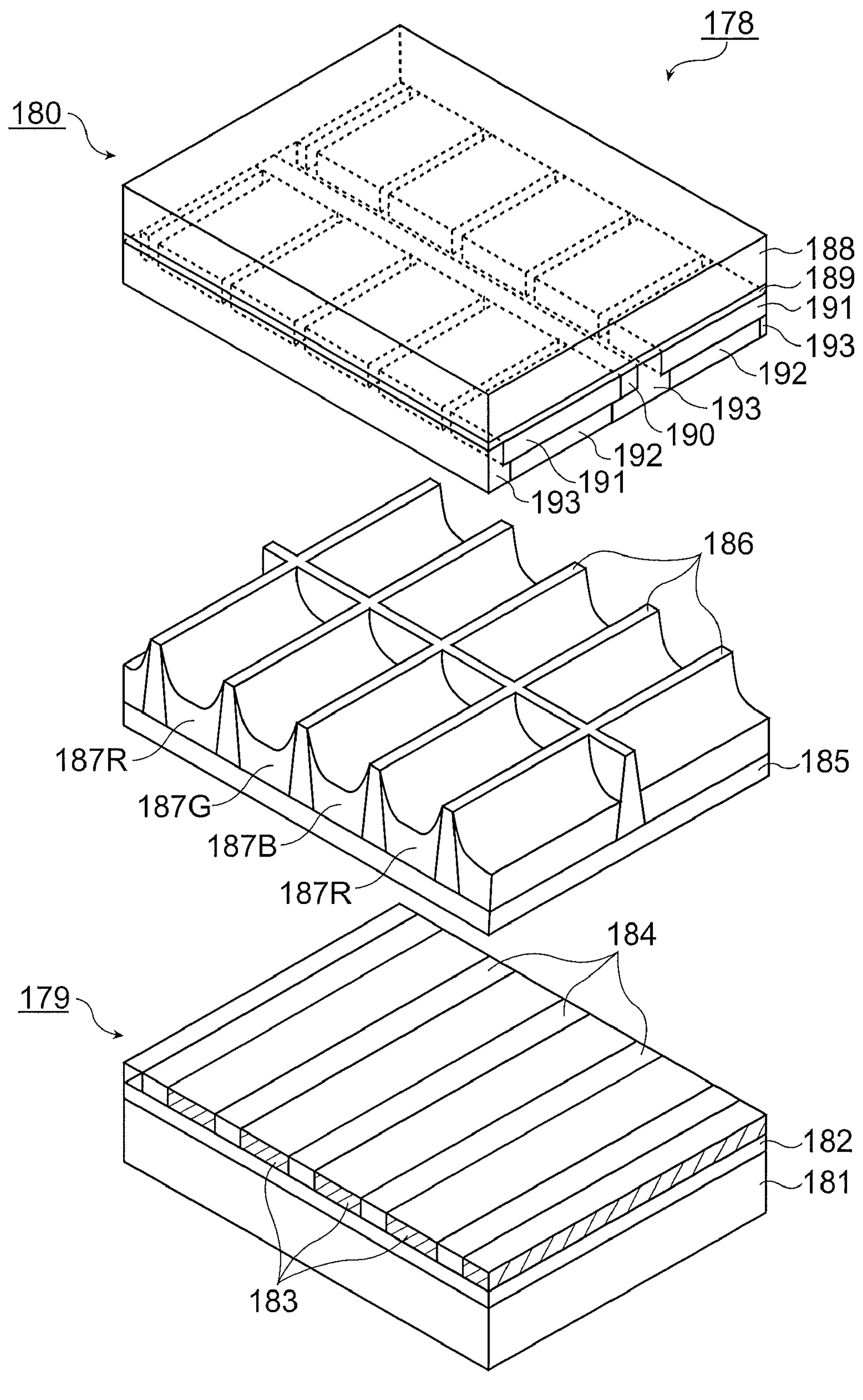
FIG. 18 is a schematic exploded perspective view showing a structure of a plasma display device according to a thirteenth embodiment of the invention.

Firstly, the plasma display device as one of the electro-optic device will be explained. FIG. 18 is a schematic exploded perspective view showing a structure of the plasma display device.

As shown in FIG. 18, the plasma display device 178 as the electro-optic device is mainly composed of a back plate 179 and a front plate 180. The back plate 179 is provided with a substrate 181. On the upper surface of the substrate 181, there is formed an insulating film 182, and on the upper surface of the insulating film 182, there are formed address electrodes 183 as electrodes and insulating films 184 forming a striped pattern.

Further, on the upper surfaces of the address electrodes 183 and the insulating films 184, there is formed a dielectric layer 185. On the upper surface of the dielectric layer 185, there are formed ribs 186 in a lattice manner, and on the bottoms of recess areas surrounded by the ribs 186, there are formed light emitting layers 187R, 187G, 187B as red (R), green (G), and blue (B) light emitting elements, respectively, made, for example, of a fluorescent material. Further, the light emitting layers 187R, 187G, 187B are provided to positions respectively opposed to the address electrodes 183.

The front plate 180 is provided with a substrate 188 made of a material with optical transparency, and an insulating film 189 is formed on the lower side of the substrate 188. Further, on the lower surface of the insulating film 189, there is formed a bus electrode 190 as an electrode in a direction perpendicular to the direction along which the address electrodes 183 extend. At positions adjacent to the bus electrode 190 and opposed to the light emitting layers 187R, 187G, 187B, there are formed retaining electrodes 191, which are rectangular electrodes made of a material with optical transparency, and the bus electrode 190 and the retaining electrodes 191 are electrically connected to each other.

On the lower surfaces of the retaining electrodes 191, there are formed dielectric layers 192, and on the lower surface of the bus electrode 190, there is formed an insulating film 193 made of an insulating material with a light blocking property. Further, the back plate 179 and the front plate 180 are bonded to each other, and a space between the back plate 179 and the front plate 180 is evacuated to be in a substantially vacuum condition, and then filled with a gas such as xenon gas.

When a pulse voltage is applied between the address electrode 183 and the retaining electrode 191, plasma is generated between the dielectric layer 185 and the dielectric layer 192. The plasma emits an ultra violet beam, and the ultra violet beam excites the fluorescent material included in the light emitting layers 187R, 187G, 187B, thus emitting red, green, blue light beams as visible light beams.

The plasma display device 178 is provided with a drive circuit for controlling the pulse voltage applied between the address electrodes 183 and the retaining electrodes 191. The drive circuit is arranged to control the intensity of the emitted light for every pixel by controlling the voltage value and the timing of the pulse voltage, and is capable of displaying a picture by putting on and off the pixels.

In the step of forming the address electrodes 183 on the surface of the insulating film 182 of the back plate 179, the ejection method in the first through ninth embodiments is used. Specifically, the insulating film 184 having a bank shape is formed on the insulating film 182. Then, by dissolving or dispersing the material of the address electrode 183 in the solvent or dispersion medium, the material liquid of the electrode film is manufactured. Then, using the droplet ejection device 1 or the droplet ejection device 108, the material liquid of the electrode film is ejected to the recess section formed of the insulating film 184 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the address electrodes 183 are formed.

In the step of forming the bus electrode 190 and the retaining electrodes 191 on the surface of the insulating film 189 of the front plate 180, the ejection method in the first through ninth embodiments is used. Specifically, the insulating film 193 having a bank shape is formed on the insulating film 189. Then, by dissolving or dispersing the material of the bus electrode 190 and the retaining electrode 191 in the solvent or dispersion medium, the material liquid of the electrode film is manufactured. Then, using the droplet ejection device 1 or the droplet ejection device 108, the material liquid of the electrode film is ejected to the recess section formed of the insulating film 193 to apply it thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquid of the electrode film. After then, by heating to dry, and thus solidifying the material liquid of the electrode film, the bus electrode 190 and retaining electrodes 191 are formed.

Further, in the step of forming the light emitting layers 187R, 187G, 187B on the surface of the dielectric layer 185, the ejection method in the first through ninth embodiments is used. Specifically, by respectively dissolving or dispersing the materials of the light emitting layers 187R, 187G, 187B as light emitting element forming materials in the solvent or dispersion medium, the material liquids of the light emitting layers are manufactured. Then, using the droplet ejection device 1 or the droplet ejection device 108, the material liquids of the respective light emitting layers are ejected to the surface of the dielectric layer 185 to apply them thereon.

On this occasion, the ejection rate of the droplet ejection head 14 is adjusted by the same steps as the first ejection rate adjustment step and the second ejection rate adjustment step in the first through ninth embodiments, and then the coating is performed by performing ejection of the material liquids of the respective light emitting layers. After then, by heating to dry, and thus solidifying the material liquids of the respective light emitting layers, the light emitting layers 187R, 187G, 187B are formed.

As described above, according to the present embodiment, there are obtained the following advantages.

According to the present embodiment, by using the ejection method in the first through ninth embodiments in the step of manufacturing the address electrodes 183, the bus electrode 190, and the retaining electrodes 191, the coating is performed by ejecting the electrode material with the accurate ejection rate. Therefore, the address electrodes 183, the bus electrode 190, and the retaining electrodes 191 with the electrode material applied with an accurate amount of application can be manufactured.

According to the present embodiment, by using the ejection method in the first through ninth embodiments in the step of manufacturing the light emitting layers 187R, 187G, 187B, the coating is performed by ejecting the light emitting element forming material with the accurate ejection rate. Therefore, the light emitting layers 187R, 187G, 187B applied with the accurate amount of the material of the light emitting layer can be manufactured.

It should be noted that the embodiment is not limited to the embodiments described herein above, but various modifications or improvements can be added thereon. Some modified examples will be described below.

First Modified Example

In the first embodiment described above, the droplet ejection device 1 and the droplet ejection device 108 are each provided with six carriages 12, and each of the carriages 12 is provided with six droplet ejection heads 14 arranged in two columns. The number of the carriage 12, and the number of the droplet ejection heads 14 mounted on each of the carriages 12 can be set in accordance with the configuration of the device.

Second Modified Example

Although in the first embodiment, piezoelectric element 43 is used as the pressurization section for pressurizing the cavity 40, other measures can be adopted. For example, the pressurization can be performed by deforming the diaphragm 42 with a coil and a magnet. Besides the above methods, the pressurization can be performed by making the gas contained in the functional liquid 41 be expanded by a heater wiring disposed inside the cavity 40. Besides the above methods, the pressurization can be performed by deforming the diaphragm 42 using electrostatic attractive force and electrostatic repulsive force. In either case, by measuring the droplets 44 ejected by the droplet ejection head 14 belonging to the droplet ejection head column sandwiched by other droplet ejection head columns and performing adjustment, substantially the same advantages as those in the first embodiment can be obtained.

Third Modified Example

Although in the first embodiment, the ejection rate is calculated measuring the weight of the droplets 44 ejected from the nozzles 31, the ejection rate can be measured by measuring the volume of ejection. For example, it is possible that the ejected droplets 44 are accumulated in a tube with a constant cross-sectional area, and the length of the liquid inside the tube is measured to calculate the volume, thereby estimating the ejection rate. In the case in which a highly-volatile liquid is used, the calculation can be performed while suppressing the volatilization.

Fourth Modified Example

In the first embodiment, the droplet ejection device 1 is provided with the weighing device 21 having twelve electronic balances to measure the ejection rate of the droplet 44 ejected from the droplet ejection head 14. The number of electronic balances the weighing device 21 has is not limited to twelve, but can be less than twelve or more than twelve. The larger the number of electronic balances the weighing device 21 has is, the larger the number of the droplet ejection heads 14 which can be measured simultaneously becomes, and therefore the higher productivity the ejection rate can be measured with.

Fifth Modified Example

Although in the first embodiment, the warm-up driving is performed in the pre-ejection standby steps of the steps S2 and S10 by driving the piezoelectric elements 43 to the extent that the droplet 44 is not ejected, the droplet 44 can be ejected during the warm-up driving. Since the larger energy can be applied to the piezoelectric elements 43 when ejecting the droplet 44 compared to the case in which the droplet 44 is not ejected, the warm-up driving can be performed in a shorter period of time.

Sixth Modified Example

Although in the first embodiment, the ejection rate is adjusted in the two adjustment steps, namely the first ejection rate adjustment step of the step S22 and the second ejection rate adjustment step of the step S24, it is also possible to perform adjustment dividing the head groups so that the adjustment is performed in three or more adjustment steps. The process can be designed in accordance with the number of electronic balances included in the weighing device 21 provided to the droplet ejection device 1.

Seventh Modified Example

In the first embodiment, six droplet ejection heads 14 are provided to each of the carriages 12. This is not a limitation, but each of the carriages 12 can be provided with less than six or more than six droplet ejection heads 14 mounted thereon. The larger the number of droplet ejection heads 14 mounted thereon is, the larger the amount of the functional liquid 41 which can be ejected simultaneously becomes, and therefore the higher productivity the coating can be performed with. Further, the number of droplet ejection heads can be set in accordance with the form of the production.

Eighth Modified Example

In the third embodiment, in the steps S34 and S44, the number of times of ejection is set to 100 times, while the number of times of ejection is set to 1000 times in the steps S37 and S47. The number of times of ejection is not limited to such values, but can be set to values with which the measurement can be performed with good accuracy. Further, since the fine adjustment is performed in the steps S37 and S47, a larger number of times of ejection, with which the measurement can be performed with better accuracy, than the number of times of ejection in the steps S34 and S44 is preferable.

Ninth Modified Example

In the tenth embodiment described above, the liquid crystal display panel 121 is provided with the color filters 141R, 141G, and 141B inside thereof. The color filters 144R, 141G, and 141B can be provided as a separate part from the liquid crystal display panel 121 but not provided inside the liquid crystal display panel 121. By combining the conforming liquid crystal display panel 121 selected in the inspection process and the conforming part including the color filters similarly selected in the inspection process with each other, the yield of the liquid crystal display device 120 can be improved.

What is claimed is:

1. An ejection rate measurement method for a device having first, second, third, fourth, fifth, and sixth droplet ejection head columns, and two of the first through sixth droplet ejection head columns are mounted in pairs on first, second, and third carriages, respectively and in this order, comprising:

(a) measuring an ejection rate of liquid ejected from droplet ejection heads included in the second and third droplet ejection head columns sandwiched between the first and fourth droplet ejection head columns;

(b) sandwiching, after the step (a), the fourth and fifth droplet ejection head columns, which have not been sandwiched in the step (a), between the third and sixth droplet ejection head columns; and (c) measuring an ejection rate of liquid ejected from droplet ejection heads included in the fourth and fifth droplet ejection head columns sandwiched in the step (b).

2. The ejection rate measurement method according to claim 1, wherein the step (a) and the step (c) include (d) making the droplet ejection heads, the ejection rate of which is to be measured, stand ready for measurement, (e) ejecting the liquid for measurement, and (f) measuring the ejection rate of the liquid ejected in the step (e), and in the step (d), the droplet ejection heads perform warm-up driving.

3. The ejection rate measurement method according to claim 2, wherein in the warm-up driving, the droplet ejection heads are driven to the extent that the liquid is not ejected from the droplet ejection heads.

4. The ejection rate measurement method according to claim 2, wherein the warm-up driving is performed at substantially the same position as a position where the step (e) is executed.

5. The ejection rate measurement method according to claim 1, wherein the step (a) includes (a1) measuring the ejection rate in all of the droplet ejection heads planned to be measured and mounted on the same carriage, and (a2) measuring, after the step (a1), the ejection rate in the droplet ejection heads planned to be measured and mounted on a different carriage from the carriage in the step (a1), the steps (a1) and (a2) are repeated until measurement is finished in all of the droplet ejection heads planned to be measured, and the step (c) includes (c1) measuring the ejection rate in all of the droplet ejection heads planned to be measured and mounted on the same carriage, and (c2) measuring, after the step (c1), the ejection rate in the droplet ejection heads planned to be measured and mounted on a different carriage from the carriage in the step (c1), the steps (c1) and (c2) are repeated until measurement is finished in all of the droplet ejection heads planned to be measured.

6. The ejection rate measurement method according to claim 1, wherein the step (a) includes (a3) measuring the ejection rate in all of the droplet ejection heads planned to be measured, mounted on the same carriage, and included in the same droplet ejection head row, which is one of a plurality of droplet ejection head row defined by the first through sixth droplet ejection head columns mounted on the first through third carriages, and (a4) measuring, after the step (a3), the ejection rate in the droplet ejection heads planned to be measured, included in the same droplet ejection head row, mounted on a different carriage from the carriage in the step (a3), and close to the droplet ejection heads measured last in the step (a3), the steps (a3) and (a4) are repeated until measurement is finished in all of the droplet ejection heads planned to be measured and included in the same droplet ejection head row, the step (c) includes (c3) measuring the ejection rate in all of the droplet ejection heads planned to be measured, mounted on the same carriage, and included in the same droplet ejection head row, and (c4) measuring, after the step (c3), the ejection rate in the droplet ejection heads planned to be measured, included in the same droplet ejection head row, mounted on a different carriage from the carriage in the step (c3), and close to the droplet ejection heads measured last in the step (c3), the steps (c3) and (c4) are repeated until measurement is finished in all of the droplet ejection heads planned to be measured and included in the same droplet ejection head row, and the steps (a), (b), and (c) are repeated until measurement is finished in all of the droplet ejection heads planned to be measured while changing droplet ejection head row.

7. The ejection rate measurement method according to claim 1, wherein the step (a) includes (a5) measuring the ejection rate in at least a part of the droplet ejection heads planned to be measured, mounted on the same carriage, and included in the same droplet ejection head row, which is one of a plurality of droplet ejection head row defined by the first through sixth droplet ejection head columns mounted on the first through third carriages, and the step (c) includes (c5) measuring the ejection rate in the droplet ejection heads planned to be measured, included in the same droplet ejection head row, and positioned adjacently to the droplet ejection heads measured last in the step (a), the steps (a), (b), and (c) are repeated until measurement is finished in all of the droplet ejection heads planned to be measured, and included in the same droplet ejection head row, and the steps (a), (b), and (c) are repeated until measurement is finished in all of the droplet ejection heads planned to be measured, while changing the droplet ejection head row.

8. An ejection rate adjustment method for a device having first, second, third, fourth, fifth, and sixth droplet ejection head columns, and two of the first through sixth droplet ejection head columns are mounted in pairs on first, second, and third carriages, respectively and in this order, comprising:

(p) measuring an ejection rate of liquid ejected from droplet ejection heads included in the second and third droplet ejection head columns sandwiched between the first and fourth droplet ejection head columns;

(q) adjusting the ejection rate of the droplet ejection heads measured in the step (p);

(r) sandwiching, after the step (q), the fourth and fifth droplet ejection head columns, which have not been sandwiched in the step (p), between the third and sixth droplet ejection head columns;

(s) measuring an ejection rate of liquid ejected from droplet ejection heads included in the fourth and fifth droplet ejection head columns sandwiched in the step (r); and (t) adjusting the ejection rate of the droplet ejection heads measured in the step (s).

9. The ejection rate adjustment method according to claim 8, wherein (u) performing repetition of the steps (p) and (q) so as to approximate the ejection rate to a target ejection rate, and (v) performing repetition of the steps (s) and (t) so as to approximate the ejection rate to a target ejection rate.

10. The ejection rate adjustment method according to claim 9, wherein in the step (u), the ejection rate of the liquid ejected from the droplet ejection heads included in the fourth and fifth droplet ejection head columns not sandwiched in the step (p) is sandwiched also measured.

11. The ejection rate adjustment method according to claim 8, wherein the steps (p) and (s) include (w) making the droplet ejection heads, the ejection rate of which is to be measured, stand ready for measurement, (x) ejecting the liquid for measurement, and (y) measuring the ejection rate of the liquid ejected in the step (x), and in the step (w), the droplet ejection heads perform warm-up driving.

12. The ejection rate adjustment method according to claim 11, wherein in the warm-up driving, the droplet ejection heads are driven to the extent that the liquid is not ejected from the droplet ejection heads.

13. The ejection rate adjustment method according to claim 11, wherein the warm-up driving is performed at substantially the same position as a position where the step (x) is executed.

14. The ejection rate adjustment method according to claim 8, wherein a measuring step (p0) is executed at least two times and is performed in one of the step (p) and the step (s), and an adjusting step (q0) is executed at least two times and is performed in one of the step (q) and the step (t), and the step (q0) includes (qr) roughly adjusting the ejection rate of the droplet ejection heads, and (qf) finely adjusting the ejection rate of the droplet ejection heads.

15. The ejection rate adjustment method according to claim 14, wherein an amount of the liquid ejected in the step (p0) executed prior to the step (qr) is smaller than an amount of the liquid ejected in the step (p0) executed prior to the step (qf).

16. The ejection rate adjustment method according to claim 14, wherein the number of times of ejection of the liquid from the droplet ejection heads per unit time in the step (p0) executed prior to the step (qr) is larger than the number of times of ejection of the liquid from the droplet ejection heads per unit time in the step (p0) executed prior to the step (qf).

17. The ejection rate adjustment method according to claim 8, wherein the step (q) includes (q1) adjusting the ejection rate in all of the droplet ejection heads planned to be adjusted and mounted on the same carriage, and (q2) adjusting, after the step (q1), the ejection rate in the droplet ejection heads planned to be adjusted and mounted on a different carriage from the carriage in the step (q1), the steps (q1) and (q2) are repeated until adjustment is finished in all of the droplet ejection heads planned to be adjusted, and the step (t) includes (t1) adjusting the ejection rate in all of the droplet ejection heads planned to be adjusted and mounted on the same carriage, and (t2) adjusting, after the step (t1), the ejection rate in the droplet ejection heads planned to be adjusted and mounted on a different carriage from the carriage in the step (t1), wherein the steps (t1) and (t2) are repeated until adjustment is finished in all of the droplet ejection heads planned to be adjusted.

18. The ejection rate adjustment method according to claim 8, wherein step (q) includes (q3) adjusting the ejection rate in all of the droplet ejection heads planned to be adjusted, mounted on the same carriage, and included in the same droplet ejection head row, which is one of a plurality of droplet ejection head row defined by the first through sixth droplet ejection head columns mounted on the first through third carriages, and (q4) adjusting, after the step (q3), the ejection rate in the droplet ejection heads planned to be adjusted, included in the same droplet ejection head row, and mounted on a different carriage from the carriage in the step (q3), and the steps (q3) and (q4) are repeated until adjustment is finished in all of the droplet ejection heads planned to be adjusted and included in the same droplet ejection head row, and the step (t) includes (t3) adjusting the ejection rate in all of the droplet ejection heads planned to be adjusted, mounted on the same carriage, and included in the same droplet ejection head row, and (t4) adjusting, after the step (t3), the ejection rate in the droplet ejection heads planned to be adjusted, included in the same droplet ejection head row, and mounted on a different carriage from the carriage in the step (t3), the steps (t3) and (t4) are repeated until adjustment is finished in all of the droplet ejection heads planned to be adjusted and included in the same droplet ejection head row, and the steps (p), (q), (r), (s) and (t) are repeated until adjustment is finished in all of the droplet ejection heads planned to be adjusted while changing droplet ejection head row.

19. The ejection rate adjustment method according to claim 8, wherein the step (p) includes (p5) adjusting the ejection rate in at least a part of the droplet ejection heads planned to be adjusted, mounted on the same carriage, and included in the same droplet ejection head row, which is one of a plurality of droplet ejection head row defined by the first through sixth droplet ejection head columns mounted on the first through third carriages, and the step (t) includes (t5) adjusting the ejection rate in the droplet ejection heads planned to be adjusted, included in the same droplet ejection head row, and positioned adjacently to the droplet ejection heads adjusted last in the step (q), the steps (p), (q), (r), (s) and (t) are repeated until adjustment is finished in all of the droplet ejection heads planned to be adjusted, and included in the same droplet ejection head row, and the steps (p), (q), (r), (s) and (t) are repeated until adjustment is finished in all of the droplet ejection heads planned to be adjusted, while changing the droplet ejection head row.

20. A liquid ejection method comprising:

adjusting an ejection rate; and coating a work by ejecting a droplet, wherein in the adjusting step, the ejection rate is adjusted using the ejection rate adjustment method according to claim 8.

21. A method of manufacturing a color filter comprising, applying a color ink to a substrate by ejecting the color ink on the substrate using the liquid ejection method according to claim 20.

22. A method of manufacturing a liquid crystal display device comprising:

forming oriented films on first and second substrates; and putting a liquid crystal between the first and second substrates, wherein the forming step includes, coating at least one of the first and second substrates with a material of the oriented films by ejecting the material of the oriented films on the at least one of the first and second substrates using the liquid ejection method according to claim 20, and solidifying the material of the oriented films ejected on the at least one of the first and second substrates.

23. A method of manufacturing a liquid crystal display device comprising:

applying a liquid crystal on a first substrate; and putting the liquid crystal between the first and second substrates, wherein in the applying step, the liquid crystal is ejected on the first substrate using the liquid ejection method according to claim 20.

24. A method of manufacturing an electro-optic device comprising, forming a light emitting element including applying a light emitting element forming material on a substrate, and solidifying the light emitting element forming material applied on the substrate, wherein in the applying step, the light emitting element forming material is ejected on the substrate using the liquid ejection method according to claim 20.

25. A method of manufacturing an electro-optic device comprising, forming an electrode including applying an electrode material on a substrate, and solidifying the electrode material applied on the substrate, wherein in the applying step, the electrode material is ejected on the substrate using the liquid ejection method according to claim 20.

26. A method of manufacturing an electro-optic device comprising, forming a wiring including applying a wiring material on a substrate, and solidifying the wiring material applied on the substrate, wherein in the applying step, the wiring material is ejected on the substrate using the liquid ejection method according to claim 20.

27. A method of manufacturing an electro-optic device comprising, forming a semiconductor element including applying a semiconductor material on a substrate, solidifying the semiconductor material applied on a substrate, and heating the semiconductor material applied and then solidified on a substrate, wherein in the applying step, the semiconductor material is ejected on the substrate using the liquid ejection method according to claim 20.

28. An ejection rate adjustment method for a device having first, second, third, fourth, fifth, and sixth droplet ejection head columns mounted in pairs on first, second, and third carriages, respectively and in this order, comprising:

(p) measuring an ejection rate of liquid ejected from droplet ejection heads included in the second and third droplet ejection head columns sandwiched between the first and fourth droplet ejection head columns;

(q) adjusting the ejection rate of the droplet ejection heads measured in the step (p);

(r) sandwiching, after the step (q), the fourth and fifth droplet ejection head columns, which have not been sandwiched in the step (p), between the third and sixth droplet ejection head columns;

(s) measuring an ejection rate of liquid ejected from droplet ejection heads included in the fourth and fifth droplet ejection head columns sandwiched in the step (r); and (t) adjusting the ejection rate of the droplet ejection heads measured in the step (s), wherein (u) performing repetition of the steps (p) and (q) so as to approximate the ejection rate to a target ejection rate, (v) performing repetition of the steps (s) and (t) so as to approximate the ejection rate to a target ejection rate, and in the step (u), the ejection rate of the liquid ejected from the droplet ejection heads included in the fourth and fifth droplet ejection head columns not sandwiched in the step (p) is also measured and roughly adjusted.

29. The ejection rate adjustment method according to claim 28, wherein in the step (u), the ejection rate of the liquid ejected from the droplet ejection heads included in the fourth and fifth droplet ejection head columns not sandwiched in the step (p) is adjusted to be lower than the ejection rate of the liquid ejected from the droplet ejection heads included in the second and third droplet ejection head columns sandwiched between the first and fourth droplet ejection head columns.

30. The ejection rate adjustment method according to claim 28, wherein in the step (s), the ejection rate of the liquid ejected from the droplet ejection heads included in the fourth and fifth droplet ejection head columns sandwiched between the third and sixth droplet ejection head columns is modified so that the ejection is performed at a lower ejection rate than the ejection rate set in the step (u), and then the liquid is ejected; and in the step (t), the ejection rate is adjusted.

* * * * *